(12) United States Patent
Sawada et al.

(10) Patent No.: US 7,239,673 B2
(45) Date of Patent: Jul. 3, 2007

(54) OPTICAL RECEPTION APPARATUS

(75) Inventors: Kazushige Sawada, Tokyo (JP); Kazuo Kubo, Tokyo (JP); Takashi Mizuochi, Tokyo (JP); Hideo Yoshida, Tokyo (JP); Hachiro Fujita, Tokyo (JP); Katsuhiro Shimizu, Tokyo (JP); Junichi Abe, Tokyo (JP)

(73) Assignee: Mitsubishi Denki Kabashiki Kaisha, Tokyo (JP)

( * ) Notice: Subject to any disclaimer, the term of this patent is extended or adjusted under 35 U.S.C. 154(b) by 828 days.

(21) Appl. No.: 10/416,550

(22) PCT Filed: Sep. 12, 2002

(86) PCT No.: PCT/JP02/09357

§ 371 (c)(1),
(2), (4) Date: Jun. 9, 2003

(87) PCT Pub. No.: WO03/026239

PCT Pub. Date: Mar. 27, 2003

(65) Prior Publication Data

US 2004/0131368 A1     Jul. 8, 2004

(30) Foreign Application Priority Data

Sep. 13, 2001  (JP)  ............................ 2001-278422
Apr. 30, 2002  (JP)  ............................ 2002-129116

(51) Int. Cl.
  *H03K 9/00*  (2006.01)
  *H04L 27/00*  (2006.01)
(52) U.S. Cl. ...................... 375/316; 375/340; 714/746; 714/780

(58) Field of Classification Search ................ 375/259, 375/285, 316, 340, 346; 714/746, 752, 774, 714/786
See application file for complete search history.

(56) References Cited

U.S. PATENT DOCUMENTS 6,185,022 B1 * 2/2001 Harasawa ...................... 398/9
(Continued)

FOREIGN PATENT DOCUMENTS

JP          60-249447 A      12/1985
(Continued)

OTHER PUBLICATIONS

"FEC Techniques in submarine transmission systems", Omar AIT SAB, OFC2001, TuF1~TuF1-3, (2001).
(Continued)

*Primary Examiner*—Jean B. Corrielus
(74) *Attorney, Agent, or Firm*—Birch, Stewart, Kolasch & Birch, LLP

(57) ABSTRACT

An optical receiver includes a soft-decision deciding unit (7) for deciding an electric received signal according to a plurality of decision levels to output a multivalued decision signal, a demultiplexing unit (5) for serial-to-parallel converting the multivalued decision signal to output a multivalued parallel signal, a soft-decision error correction decoding unit (8) for correcting the multivalued parallel signal based on reliability information to output an error-corrected parallel received signal and decision results indicating the decision of the electric received signal according to the plurality of decision levels, a probability density distribution estimation unit (9) for estimating probability density distributions based on distributions of the decision results, and a decision level control unit (10) for controlling the plurality of decision levels based on the probability density distributions, thereby improving the transmission quality.

20 Claims, 47 Drawing Sheets

U.S. PATENT DOCUMENTS

| | | | |
|---|---|---|---|
| 6,445,471 B1 * | 9/2002 | Shimokawa et al. | 398/79 |
| 6,466,886 B1 * | 10/2002 | Marmur | 702/126 |
| 6,657,967 B1 * | 12/2003 | Fujisawa et al. | 370/242 |

FOREIGN PATENT DOCUMENTS

| | | |
|---|---|---|
| JP | 61-135234 A | 6/1986 |
| JP | 4-145724 A | 5/1992 |
| JP | 5-244017 A | 9/1993 |
| JP | 8-317006 A | 11/1996 |
| WO | WO 01/22598 A1 | 3/2001 |
| WO | WO 02/089365 A1 | 11/2002 |

OTHER PUBLICATIONS

Puc, Andrej et al., "Concatenated FEC Experiment over 5000 KM Long straight line WDM test bed", OFC1999, ThQ6-1~ThQ6-4, (1999).

Akita, Masashi et al., "Third generation FEC employing turbo product code for long-haul DWDM Transmission systems", OFC2002, WP2, pp. 289-290, (2002).

"Forward error correction for submarine systems", ITU-T G.975, pp. 1-11, (1996).

* cited by examiner

RECEIVED 1-BIT WAVEFORM

| DECISION RESULT OF EACH DECIDER | $D_{+3}$ | 1 | 0 | 0 | 0 | 0 | 0 | 0 | 0 |
| --- | --- | --- | --- | --- | --- | --- | --- | --- | --- |
| | $D_{+2}$ | 1 | 1 | 0 | 0 | 0 | 0 | 0 | 0 |
| | $D_{+1}$ | 1 | 1 | 1 | 0 | 0 | 0 | 0 | 0 |
| | $D_c$ | 1 | 1 | 1 | 1 | 0 | 0 | 0 | 0 |
| | $D_{-1}$ | 1 | 1 | 1 | 1 | 1 | 0 | 0 | 0 |
| | $D_{-2}$ | 1 | 1 | 1 | 1 | 1 | 1 | 0 | 0 |
| | $D_{-3}$ | 1 | 1 | 1 | 1 | 1 | 1 | 1 | 0 |
| STATE | | (8) | (7) | (6) | (5) | (4) | (3) | (2) | (1) |

| STATE | 3-BIT ENCODING | | |
|---|---|---|---|
| (1) | 0 | 0 | 0 |
| (2) | 0 | 0 | 1 |
| (3) | 0 | 1 | 0 |
| (4) | 0 | 1 | 1 |
| (5) | 1 | 0 | 0 |
| (6) | 1 | 0 | 1 |
| (7) | 1 | 1 | 0 |
| (8) | 1 | 1 | 1 |

FIG.10
(a) INITIAL THRESHOLD
FREQUENCIES WITH WHICH INFORMATION DATA 1 AND 0 ARE DECIDED AS 1 AND 0, RESPECTIVELY, BY EACH DECIDER (WITH EACH DECISION LEVEL)
—— CURRENT STATE
---- OPTIMUM
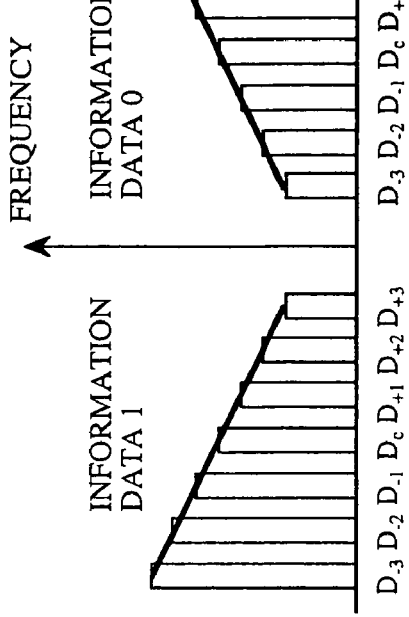
(b) FEEDBACK-CONTROLLED THRESHOLD
FREQUENCIES WITH WHICH INFORMATION DATA 1 AND 0 ARE DECIDED AS 1 AND 0, RESPECTIVELY, BY EACH DECIDER (WITH EACH DECISION LEVEL)
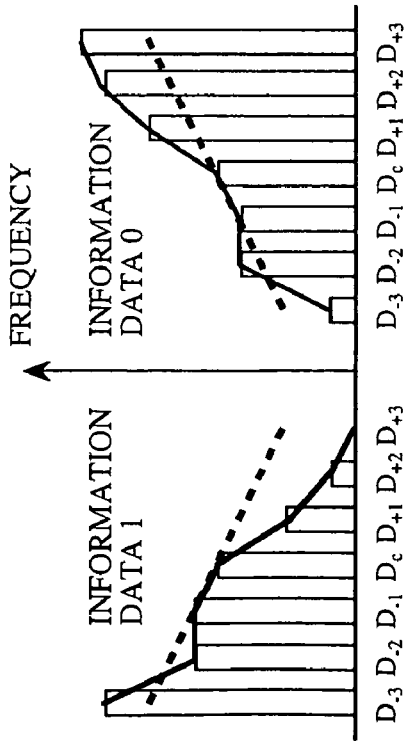

SWEEPING OF PHASE OF SWEEPING DECIDER

ELECTRIC RECEIVED WAVEFORM

SWEEPING OF DECISION LEVEL OF SWEEPING DECIDER

DECISION LEVEL

DECISION PHASE $\phi_{-2t}$ $\phi_{-t}$ $\phi_c$ $\phi_t$ $\phi_{2t}$

FREQUENCIES WITH WHICH INFORMATION DATA 1 AND 0 ARE DECIDED AS 1 AND 0, RESPECTIVELY, AT EACH DECISION PHASE (WITH DECISION LEVEL $D_{+1}$)

FREQUENCIES WITH WHICH INFORMATION DATA 1 AND 0 ARE DECIDED AS 1 AND 0, RESPECTIVELY, AT EACH DECISION PHASE (WITH DECISION LEVEL $D_{-1}$)

FREQUENCIES WITH WHICH INFORMATION
DATA 1 AND 0 ARE DECIDED AS 1 AND 0,
RESPECTIVELY, AT EACH DECISION PHASE
(WITH DECISION LEVEL $D_{+1}$)

FREQUENCIES WITH WHICH INFORMATION DATA 1 AND 0 ARE DECIDED AS 1 AND 0, RESPECTIVELY, AT EACH DECISION PHASE (WITH DECISION LEVEL $D_{+1}$)

ELECTRIC RECEIVED WAVEFORM

DECISION LEVEL

- ← $D_{+3}$
- ← $D_{+2}$
- ← $D_{+1}$
- ← $D_c$
- ← $D_{-1}$
- ← $D_{-2}$
- ← $D_{-3}$

ELECTRIC RECEIVED WAVEFORM

DECISION PHASE  $\phi_{-t}$  $\phi_c$  $\phi_t$

FIG.29
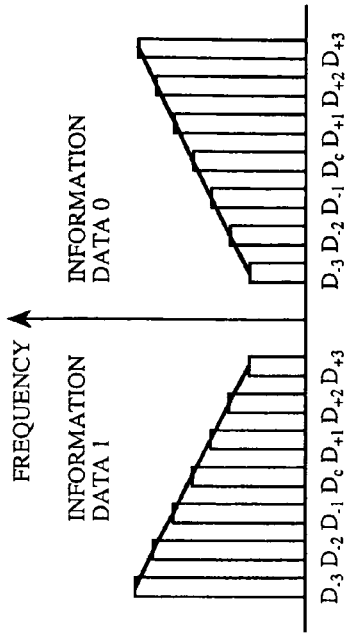
(a) DECISION PHASE $\phi_{-1}$
FREQUENCIES WITH WHICH INFORMATION DATA 1 AND 0 ARE DECIDED AS 1 AND 0, RESPECTIVELY
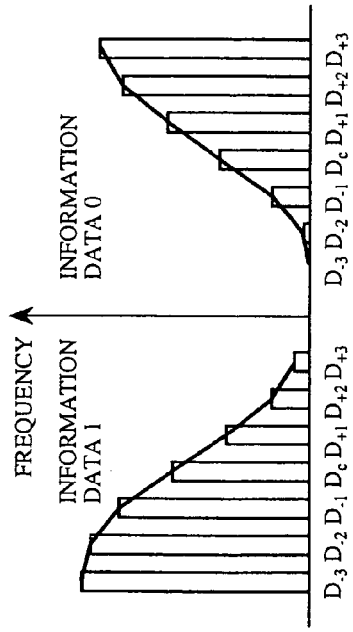
(b) DECISION PHASE $\phi_c$
FREQUENCIES WITH WHICH INFORMATION DATA 1 AND 0 ARE DECIDED AS 1 AND 0, RESPECTIVELY
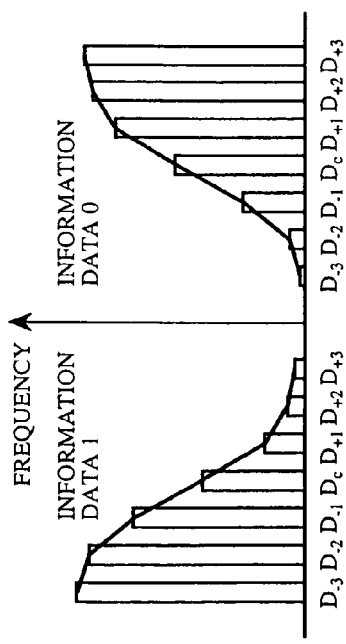
(c) DECISION PHASE $\phi_1$
FREQUENCIES WITH WHICH INFORMATION DATA 1 AND 0 ARE DECIDED AS 1 AND 0, RESPECTIVELY

FIG.31
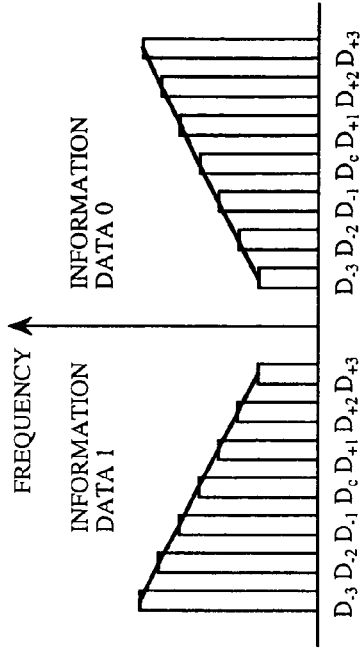
(a) DECISION PHASE $\phi_{-1}$
FREQUENCIES WITH WHICH INFORMATION DATA 1 AND 0 ARE DECIDED AS 1 AND 0, RESPECTIVELY
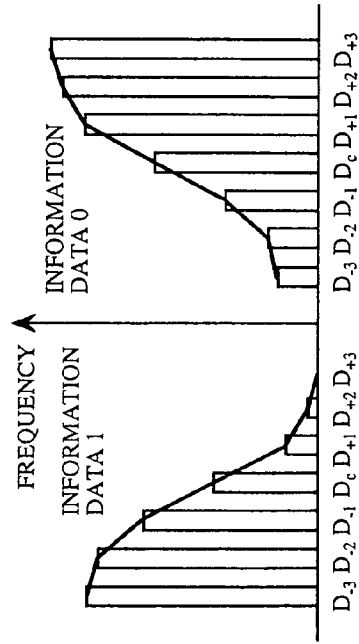
(b) DECISION PHASE $\phi_c$
FREQUENCIES WITH WHICH INFORMATION DATA 1 AND 0 ARE DECIDED AS 1 AND 0, RESPECTIVELY
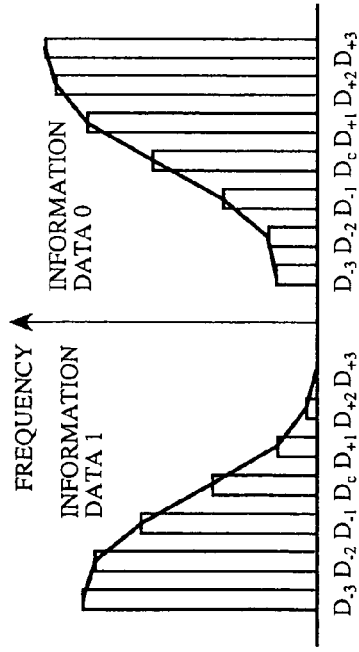
(c) DECISION PHASE $\phi_1$
FREQUENCIES WITH WHICH INFORMATION DATA 1 AND 0 ARE DECIDED AS 1 AND 0, RESPECTIVELY

FIG.33

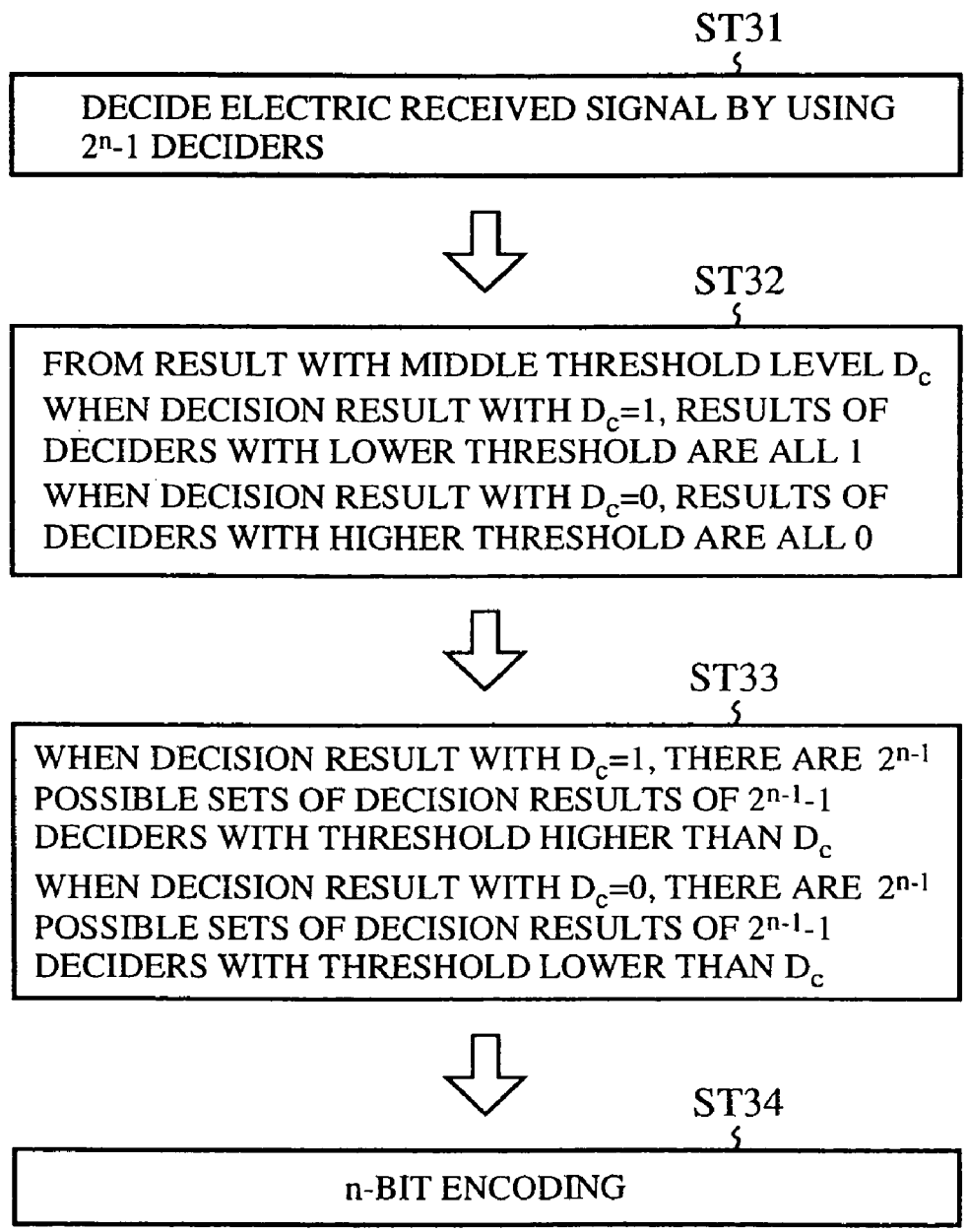

ST31: DECIDE ELECTRIC RECEIVED SIGNAL BY USING $2^n-1$ DECIDERS

ST32: FROM RESULT WITH MIDDLE THRESHOLD LEVEL $D_c$
WHEN DECISION RESULT WITH $D_c=1$, RESULTS OF DECIDERS WITH LOWER THRESHOLD ARE ALL 1
WHEN DECISION RESULT WITH $D_c=0$, RESULTS OF DECIDERS WITH HIGHER THRESHOLD ARE ALL 0

ST33: WHEN DECISION RESULT WITH $D_c=1$, THERE ARE $2^{n-1}$ POSSIBLE SETS OF DECISION RESULTS OF $2^{n-1}-1$ DECIDERS WITH THRESHOLD HIGHER THAN $D_c$
WHEN DECISION RESULT WITH $D_c=0$, THERE ARE $2^{n-1}$ POSSIBLE SETS OF DECISION RESULTS OF $2^{n-1}-1$ DECIDERS WITH THRESHOLD LOWER THAN $D_c$

ST34: n-BIT ENCODING

FIG.34

| DECISION RESULT OF EACH DECIDER | | | | | | | | |
|---|---|---|---|---|---|---|---|---|
| $D_{+3}$ | 1 | 0 | 0 | 0 | 0 | 0 | 0 | 0 |
| $D_{+2}$ | 1 | 1 | 0 | 0 | 0 | 0 | 0 | 0 |
| $D_{+1}$ | 1 | 1 | 1 | 0 | 0 | 0 | 0 | 0 |
| $D_c$ | 1 | 1 | 1 | 1 | 0 | 0 | 0 | 0 |
| $D_{-1}$ | 1 | 1 | 1 | 1 | 1 | 0 | 0 | 0 |
| $D_{-2}$ | 1 | 1 | 1 | 1 | 1 | 1 | 0 | 0 |
| $D_{-3}$ | 1 | 1 | 1 | 1 | 1 | 1 | 1 | 0 |
| STATE | (8) | (7) | (6) | (5) | (4) | (3) | (2) | (1) |

FIG.35

| STATE | 3-BIT ENCODING | |
|---|---|---|
| | DECISION RESULT WITH $D_c$ | RELIABILITY OF $D_c$ FROM RESULTS WITH $D_{-1}, D_{-2}, D_{-3}$ |
| (1) | 0 | 1  1 |
| (2) | 0 | 1  0 |
| (3) | 0 | 0  1 |
| (4) | 0 | 0  0 |
| | | RELIABILITY OF $D_c$ FROM RESULTS WITH $D_{+1}, D_{+2}, D_{+3}$ |
| (5) | 1 | 0  0 |
| (6) | 1 | 0  1 |
| (7) | 1 | 1  0 |
| (8) | 1 | 1  1 |

| DECISION RESULT | | | | | | | | |
|---|---|---|---|---|---|---|---|---|
| $D_{+3}$ | 1 | 0 | 0 | 0 | 0 | 0 | 0 | 0 |
| $D_{+2}$ | 1 | 1 | 0 | 0 | 0 | 0 | 0 | 0 |
| $D_{+1}$ | 1 | 1 | 1 | 0 | 0 | 0 | 0 | 0 |
| $D_c$ | 1 | 1 | 1 | 1 | 0 | 0 | 0 | 0 |
| $D_{-1}$ | 1 | 1 | 1 | 1 | 1 | 0 | 0 | 0 |
| $D_{-2}$ | 1 | 1 | 1 | 1 | 1 | 1 | 0 | 0 |
| $D_{-3}$ | 1 | 1 | 1 | 1 | 1 | 1 | 1 | 0 |
| 3-BIT ENCODING | | | | | | | | |
| HARD-DECISION | 1 | 1 | 1 | 1 | 0 | 0 | 0 | 0 |
| RELIABILITY | 1 | 1 | 0 | 0 | 0 | 0 | 1 | 1 |
| | 1 | 0 | 1 | 0 | 0 | 1 | 0 | 1 |

FIG.39

(a) WHEN DECISION RESULT WITH $D_c=1$
ENCODING OF DECISION RESULTS OF DECIDERS
WITH THRESHOLD HIGHER THAN $D_c$

| DECISION RESULT (BEFORE CORRECTED) | | | | | | | | |
|---|---|---|---|---|---|---|---|---|
| $D_{+3}$ | 1 | 0 | 0 | 0 | 1 | 1 | 1 | 0 |
| $D_{+2}$ | 1 | 1 | 0 | 0 | 0 | 1 | 0 | 1 |
| $D_{+1}$ | 1 | 1 | 1 | 0 | 0 | 0 | 1 | 0 |
| DECISION RESULT (AFTER CORRECTED) | | | | | | | | |
| $D_{+1}$ | NO CORRECTION | | | | 0 | 1 | 0 | 0 |
| $D_{+2}$ | | | | | 0 | 1 | 0 | 0 |
| $D_{+3}$ | | | | | 0 | 1 | 1 | 0 |
| 3-BIT ENCODING | | | | | | | | |
| HARD-DECISION | 1 | 1 | 1 | 1 | 1 | 1 | 1 | 1 |
| RELIABILITY | 1 | 1 | 0 | 0 | 0 | 1 | 0 | 0 |
| | 1 | 0 | 1 | 0 | 0 | 1 | 1 | 0 |

(b) WHEN DECISION RESULT WITH $D_c=0$
ENCODING OF DECISION RESULTS OF DECIDERS
WITH THRESHOLD LOWER THAN $D_c$

| DECISION RESULT (BEFORE CORRECTED) | | | | | | | | |
|---|---|---|---|---|---|---|---|---|
| $D_{-3}$ | 0 | 0 | 0 | 1 | 1 | 1 | 1 | 0 |
| $D_{-2}$ | 0 | 0 | 1 | 1 | 0 | 1 | 0 | 1 |
| $D_{-1}$ | 0 | 1 | 1 | 1 | 0 | 0 | 1 | 0 |
| DECISION RESULT (AFTER CORRECTED) | | | | | | | | |
| $D_{-1}$ | NO CORRECTION | | | | 0 | 1 | 1 | 0 |
| $D_{-2}$ | | | | | 0 | 1 | 1 | 1 |
| $D_{-3}$ | | | | | 0 | 1 | 1 | 1 |
| 3-BIT ENCODING | | | | | | | | |
| HARD-DECISION | 0 | 0 | 0 | 0 | 0 | 0 | 0 | 0 |
| RELIABILITY | 1 | 1 | 0 | 0 | 1 | 0 | 0 | 0 |
| | 1 | 0 | 1 | 0 | 1 | 0 | 0 | 1 |

FIG.40

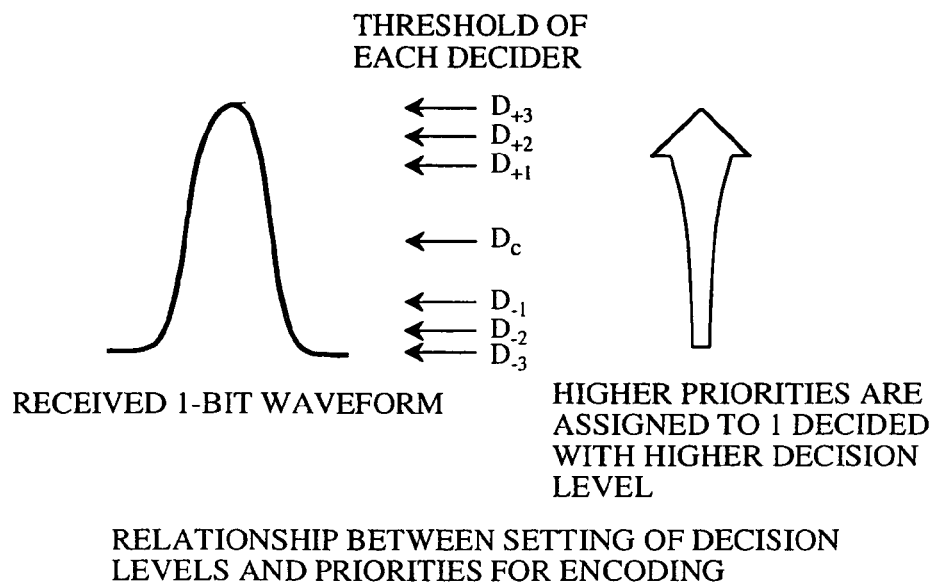

THRESHOLD OF EACH DECIDER

RECEIVED 1-BIT WAVEFORM

HIGHER PRIORITIES ARE ASSIGNED TO 1 DECIDED WITH HIGHER DECISION LEVEL

RELATIONSHIP BETWEEN SETTING OF DECISION LEVELS AND PRIORITIES FOR ENCODING

FIG.41

PRIORITY ENCODER (HIGHER PRIORITIES ARE ASSIGNED TO DECISION RESULTS 1)

| DECISION RESULT | | | | | | | | |
|---|---|---|---|---|---|---|---|---|
| $D_{+3}$ | 1 | 0 | 0 | 0 | 0 | 0 | 0 | 0 |
| $D_{+2}$ | X | 1 | 0 | 0 | 0 | 0 | 0 | 0 |
| $D_{+1}$ | X | X | 1 | 0 | 0 | 0 | 0 | 0 |
| $D_c$ | X | X | X | 1 | 0 | 0 | 0 | 0 |
| $D_{-1}$ | X | X | X | X | 1 | 0 | 0 | 0 |
| $D_{-2}$ | X | X | X | X | X | 1 | 0 | 0 |
| $D_{-3}$ | X | X | X | X | X | X | 1 | 0 |
| 3-BIT ENCODING | | | | | | | | |
| HARD-DECISION | 1 | 1 | 1 | 1 | 0 | 0 | 0 | 0 |
| RELIABILITY | 1 | 1 | 0 | 0 | 0 | 0 | 1 | 1 |
| | 1 | 0 | 1 | 0 | 0 | 1 | 0 | 1 |

X: EITHER 0 OR 1

FIG.42

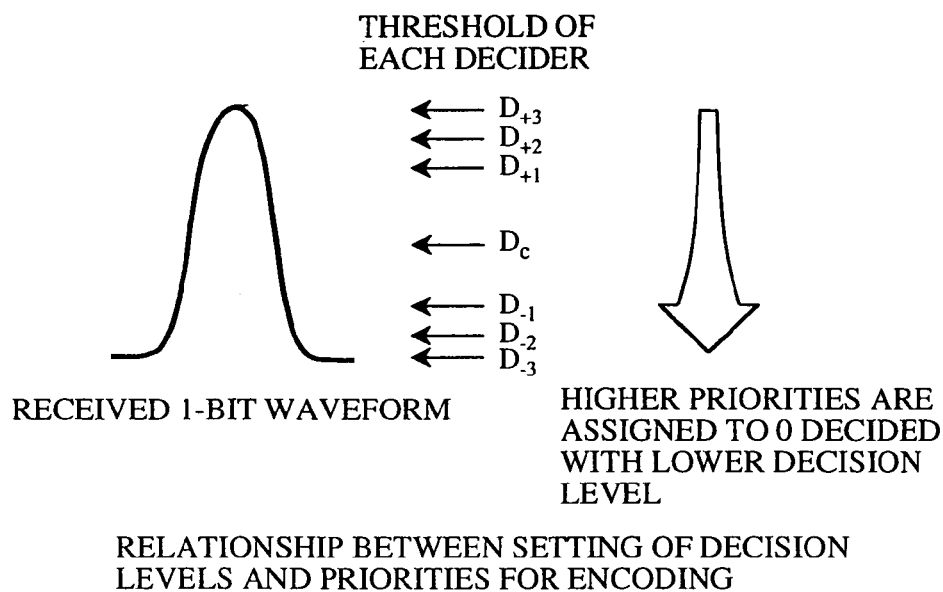

RECEIVED 1-BIT WAVEFORM

HIGHER PRIORITIES ARE ASSIGNED TO 0 DECIDED WITH LOWER DECISION LEVEL

RELATIONSHIP BETWEEN SETTING OF DECISION LEVELS AND PRIORITIES FOR ENCODING

FIG.43

PRIORITY ENCODER (HIGHER PRIORITIES ARE ASSIGNED TO DECISION RESULTS 0)

| DECISION RESULT | | | | | | | | |
|---|---|---|---|---|---|---|---|---|
| $D_{+3}$ | 1 | 0 | X | X | X | X | X | X |
| $D_{+2}$ | 1 | 1 | 0 | X | X | X | X | X |
| $D_{+1}$ | 1 | 1 | 1 | 0 | X | X | X | X |
| $D_c$ | 1 | 1 | 1 | 1 | 0 | X | X | X |
| $D_{-1}$ | 1 | 1 | 1 | 1 | 1 | 0 | X | X |
| $D_{-2}$ | 1 | 1 | 1 | 1 | 1 | 1 | 0 | X |
| $D_{-3}$ | 1 | 1 | 1 | 1 | 1 | 1 | 1 | 0 |
| 3-BIT ENCODING | | | | | | | | |
| HARD-DECISION | 1 | 1 | 1 | 1 | 0 | 0 | 0 | 1 |
| RELIABILITY | 1 | 1 | 0 | 0 | 0 | 0 | 1 | 1 |
| | 1 | 0 | 1 | 0 | 0 | 1 | 0 | 1 |

X: EITHER 0 OR 1

FIG.44

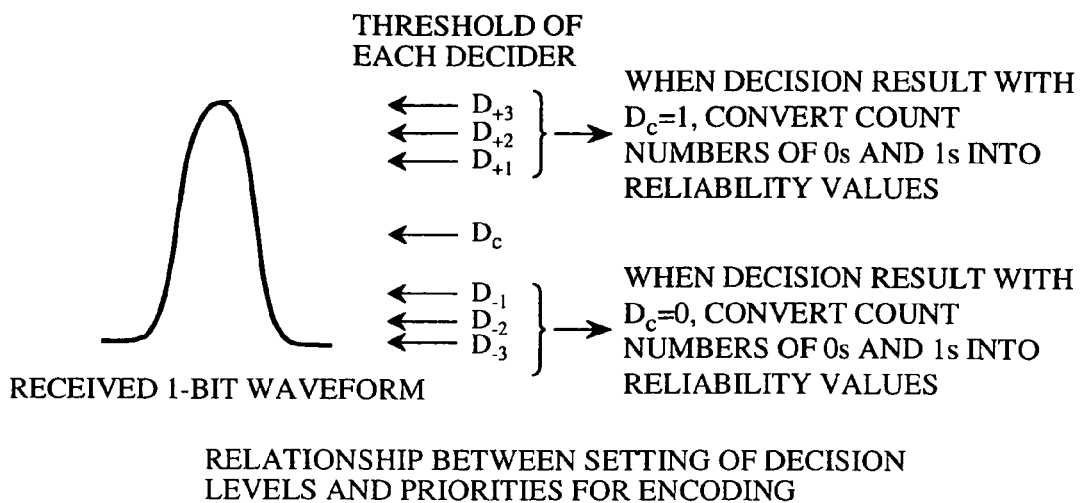

RELATIONSHIP BETWEEN SETTING OF DECISION
LEVELS AND PRIORITIES FOR ENCODING

FIG.45

(a) WHEN DECISION RESULT WITH $D_c=1$

OBTAIN RELIABILITY FROM COUNT NUMBERS OF 0s AND
1s FROM DECIDERS WITH THRESHOLD HIGHER THAN $D_c$

| COUNT NUMBER | | 3-BIT ENCODING | | |
|---|---|---|---|---|
| BIT 1 | BIT 0 | HARD-DECISION | RELIABILITY | |
| 3 | 0 | 1 | 1 | 1 |
| 2 | 1 | 1 | 1 | 0 |
| 1 | 2 | 1 | 0 | 1 |
| 0 | 3 | 1 | 0 | 0 |

(b) WHEN DECISION RESULT WITH $D_c=0$

OBTAIN RELIABILITY FROM COUNT NUMBERS OF 0s AND
1s FROM DECIDERS WITH THRESHOLD LOWER THAN $D_c$

| COUNT NUMBER | | 3-BIT ENCODING | | |
|---|---|---|---|---|
| BIT 1 | BIT 0 | HARD-DECISION | RELIABILITY | |
| 0 | 3 | 0 | 1 | 1 |
| 1 | 2 | 0 | 1 | 0 |
| 2 | 1 | 0 | 0 | 1 |
| 3 | 0 | 0 | 0 | 0 |

RECEIVED 1-BIT WAVEFORM

RELATIONSHIP BETWEEN SETTING OF DECISION
LEVELS AND PRIORITIES FOR ENCODING

| COUNT NUMBER | | 3-BIT ENCODING | | |
|---|---|---|---|---|
| BIT 1 | BIT 0 | HARD-DECISION | RELIABILITY | |
| 7 | 0 | 1 | 1 | 1 |
| 6 | 1 | 1 | 1 | 0 |
| 5 | 2 | 1 | 0 | 1 |
| 4 | 3 | 1 | 0 | 0 |
| 3 | 4 | 0 | 0 | 0 |
| 2 | 5 | 0 | 0 | 1 |
| 1 | 6 | 0 | 1 | 0 |
| 0 | 7 | 0 | 1 | 1 |

RELATIONSHIP BETWEEN SETTING OF DECISION
LEVELS AND PRIORITIES FOR ENCODING

FIG.52

OPTICAL RECEPTION APPARATUS

This application is the national phase under 35 U.S.C. § 371 of PCT International Application No. PCT/JP02/09357 which has an International filing date of Sep. 12, 2002, which designated the United States of America.

FIELD OF THE INVENTION

The present invention relates to a long-distance and large-capacity optical receiver that compensates for signal quality degradation caused by optical transmissions, and that provides high-quality transmission services.

BACKGROUND OF THE INVENTION

FIG. 1 is a block diagram showing the structure of a prior art optical receiver. In the figure, reference numeral 1 denotes the optical receiver, reference numeral 2 denotes a transmission path, reference numeral 3 denotes a photoelectric conversion means, reference numeral 4 denotes a hard-decision deciding means, reference numeral 5 denotes a demultiplexing means, and reference numeral 6 denotes an FEC (Forward Error Correction) decoding means.

Next, a description will be made as to an operation of the prior art optical receiver.

An optical received signal that reaches the optical receiver 1 by way of the transmission path 2 is converted into an electric received signal by the photoelectric conversion means 3, and is decided as mark or space by the hard-decision deciding means 4. The electric received signal is serial-to-parallel converted by the demultiplexing means 5. Bit errors caused by signal quality degradation in the transmission path 2 and included in the output of the demultiplexing means are corrected by the FEC decoding means 6. An error-corrected parallel received signal is then output from the FEC decoding means.

FIG. 2 is a waveform diagram showing an electric received signal input to the hard-decision deciding means. In a good receiving state with a small amount of degradation in the quality of the optical received signal input to the optical receiver by way of the transmission path 2, the electric received waveform has an eye wide open as shown in FIG. 2($a$). On the other hand, in a bad receiving state with a large amount of degradation in the quality of the optical received signal, the electric received waveform has an eye with a small aperture as shown in FIG. 2($b$), and the degradation on the mark side becomes remarkable. To avoid this problem, in the hard judgment deciding means 4 a proper decision level according to which the level of the electric received signal is decided as mark or space is set so that a certain bit error rate is provided in a very-bad receiving state (for example, refer to non-patent reference 1).

Non-patent reference 1: ITU-TG.975 recommendation (issued in November, 1996)

Furthermore, following non-patent references 2 to 4 are disclosed as prior art references related to the background of the present invention.

Non-patent reference 2: FEC techniques in submarine transmission systems (OFC2001, paper TuF1, March)

Non-patent reference 3: CONCATENATED FEC EXPERIMENT OVER 5000 KM LONG STRAIGHT LINE WDM TEST BED (OFC99, paper ThQ6, March)

Non-patent reference 4: Third Generation FEC employing Turbo Code For Long Haul DWDM Transmission Systems (OFC2002, paper WP2)

In the prior art optical receiver that is so constructed as mentioned above, the hard-decision deciding means 4 decides (hard-decides) the level of an input electric received signal as either of binary values, i.e., mark or space, and a technique for raising the transmission rate and raising the ratio of redundancy bits included in an error correction code with respect to the information bit is used in order to improve the error correction ability. A problem is however that because there is a trade-off between a rate of increase in the transmission rate and the amount of degradation in the optical transmission quality, and high-speed devices are needed and it is therefore difficult to lower the cost, it is becoming increasingly difficult to improve the transmission quality of high-speed and large-capacity optical receivers.

The present invention is proposed to solve the above-mentioned problems, and it is therefore an object of the present invention to provide an optical receiver that can improve the quality of high-speed and large-capacity transmission without increasing the transmission rate.

DISCLOSURE OF THE INVENTION

In accordance with an aspect of the present invention, there is provided an optical receiver including a soft-decision deciding means for deciding an electric received signal according to a plurality of decision levels so as to output a multivalued decision signal, a demultiplexing means for serial-to-parallel converting the multivalued decision signal so as to output a multivalued parallel signal, a soft-decision error correction decoding means for making an error correction to the multivalued parallel signal delivered based on reliability information so as to output an error-corrected parallel received signal and decision results indicating the decision of the electric received signal according to the plurality of decision levels, a probability density distribution estimation means for estimating probability density distributions based on distributions of the decision results indicating the decision of the information data according to the plurality of decision levels, and a decision level control means for controlling the plurality of decision levels in the soft-decision deciding means based on the probability density distributions.

Therefore, even if the quality of optical receiving signals degrades, the optical receiver can feature high speed and large capacity and can provide high-quality services.

In accordance with a preferred embodiment, the optical receiver includes a soft-decision decider for deciding an electric received signal by using $2^n-1$ deciders so as to output $2^n-1$ decision results, an encoder for encoding the $2^n-1$ decision results into an n-bit parallel code having reliability information, n demultiplexing circuits for demultiplexing the n-bit parallel code into respective multivalued signals on a bit-by-bit basis, a soft-decision FEC decoding circuit for making an error correction to the multivalued signals based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and a threshold control circuit for controlling the plurality of decision levels of the $2^n-1$ deciders in the soft-decision decider based on the probability density distributions.

Therefore, even if the quality of optical receiving signals degrades, the optical receiver can feature high speed and large capacity and can provide high-quality services.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level, which the soft-decision decider includes in addition to the $2^n-1$ deciders, so as to output one or more decision results, an encoder for encoding the $2^n-1$ decision results into an n-bit parallel code having reliability information, (n+1) or more demultiplexing circuits for demultiplexing the n-bit parallel code and the one or more decision results obtained by the one or more other deciders each of which sweeps its decision level in the soft-decision decider into respective multivalued signals on a bit-by-bit basis, a soft-decision FEC decoding circuit for making an error correction to multivalued signals, which are obtained from the n-bit parallel code by the demultiplexing circuits, based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and multivalued signals into which the one or more decision results obtained by the one or more other deciders each of which sweeps its decision level are demultiplexed by the demultiplexing circuits, a threshold control circuit for controlling the plurality of decision levels of the $2^n-1$ deciders in the soft-decision decider based on the probability density distributions, and a threshold sweeping control circuit for controlling the decision levels of the one or more other deciders each of which sweeps its decision level in the soft-decision decider based on the probability density distributions.

Therefore, even if the quality of optical receiving signals degrades, the optical receiver can feature high speed and large capacity and can provide high-quality services.

In addition, the provision of the one or more sweeping deciders each of which can sweep its decision level in addition to the $2^n-1$ deciders makes it possible to estimate probability density distributions with a higher degree of accuracy and to control the decision level of each decider with a high degree of accuracy.

In accordance with another preferred embodiment, the optical receiver includes a soft-decision decider for deciding an electric received signal by using $2^n$ or more deciders so as to output $2^n$ or more decision results, a selector for selecting $2^n-1$ decision results from among the $2^n$ or more decision results, an encoder for encoding the $2^n-1$ decision results into an n-bit parallel code having reliability information, n demultiplexing circuits for demultiplexing the n-bit parallel code into respective multivalued signals on a bit-by-bit basis, a soft-decision FEC decoding circuit for making an error correction to the multivalued signals based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and a decider selection control circuit for outputting a selection signal for making the selector select the $2^n-1$ decision results from among the $2^n$ or more decision results based on the probability density distributions.

Therefore, even if the quality of optical receiving signals degrades, the optical receiver can feature high speed and large capacity and can provide high-quality services.

In addition, because the optical receiver is provided with a larger number of deciders than necessary for encoding, the optical receiver can easily acquire distributions of decision results of deciders with a high degree of accuracy without finely controlling their respective decision levels.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level and one or more other deciders each of which sweeps its decision phase, which the soft-decision decider includes in addition to the $2^n-1$ deciders, so as to output decision results, an encoder for encoding the $2^n-1$ decision results into an n-bit parallel code having reliability information, (n+2) or more demultiplexing circuits for demultiplexing the n-bit parallel code and the decision results obtained by the one or more other deciders each of which sweeps its decision level and the one or more other deciders each of which sweeps its decision phase in the soft-decision decider into respective multivalued signals on a bit-by-bit basis, a soft-decision FEC decoding circuit for making an error correction to multivalued signals, which are obtained from the n-bit parallel code by the demultiplexing circuits, based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels and multivalued signals into which the decision results obtained by the one or more other deciders each of which sweeps its decision level and the one or more other deciders each of which sweeps its decision phase are demultiplexed by the demultiplexing circuits, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, a clock phase control circuit for controlling decision phases of the $2^n-1$ deciders and the one or more other deciders each of which sweeps its decision level in the soft-decision decider based on the probability density distributions, and a sweeping decider clock phase control circuit for controlling the decision phases of the one or more other deciders each of which sweeps its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision phase in addition to the $2^n-1$ deciders, the optical receiver can find out an optimum decision phase. Furthermore, because the optical receiver includes the one or more sweeping deciders each of which can sweep its decision level, the optical receiver can estimate probability density distributions by using the optimum decision phase with a higher degree of accuracy and can control the decision level of each decider with a high degree of accuracy.

In accordance with another preferred embodiment, the optical receiver includes a soft-decision decider for deciding an electric received signal e by using $2^n-1$ deciders so as to output $2^n-1$ decision results, and for also deciding the electric received signal by using one or more other deciders each of which sweeps its decision level and one or more other deciders each of which sweeps its decision phase, which the soft-decision decider includes in addition to the $2^n-1$ deciders, so as to output decision results, a selector for selecting either one or more decision results obtained by the one or more other deciders each of which sweeps its decision level or one or more decision results obtained by the one or more other deciders each of which sweeps its decision phase, an encoder for encoding the $2^n-1$ decision results into an n-bit parallel code having reliability information, (n+1) or more demultiplexing circuits for demultiplexing the n-bit parallel code and either the one or more decision results obtained by the one or more other deciders each of which sweeps its decision level or the one or more decision results obtained by the one or more other deciders each of which sweeps its decision phase in the soft-decision decider into respective multivalued signals on a bit-by-bit basis, a soft-decision FEC decoding circuit for making an error correction to multivalued signals, which are obtained from the n-bit parallel code by the demultiplexing circuits, based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and multivalued signals into which the one or more decision results obtained by either the one or more other deciders each of which sweeps its decision level or the one or more other deciders each of which sweeps its decision phase are demultiplexed by the demultiplexing circuits, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, a clock phase control circuit for controlling decision phases of the $2^n-1$ deciders and the one or more other deciders each of which sweeps its decision level in the soft-decision decider based on the probability density distributions, and a sweeping decider clock phase control circuit for controlling the decision phases of the one or more other deciders each of which sweeps its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision phase in addition to the $2^n-1$ deciders, the optical receiver can find out an optimum decision phase. Furthermore, because the optical receiver includes the one or more sweeping deciders each of which can sweep its decision level, the optical receiver can estimate probability density distributions by using the optimum decision phase with a higher degree of accuracy and can control the decision level of each decider with a high degree of accuracy.

In addition, the optical receiver can decrease the number of demultiplexing circuits included therein by using the selector. Therefore, the circuit configuration of the optical receiver can be simplified.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level and its decision phase, which the soft-decision decider includes in addition to the $2^n-1$ deciders, so as to output one or more decision results, an encoder for encoding the $2^n-1$ decision results into an n-bit parallel code having reliability information, (n+1) or more demultiplexing circuits for demultiplexing the n-bit parallel code obtained by the encoder and the one or more decision results obtained by the one or more other deciders each of which sweeps its decision level and its decision phase in the soft-decision decider into respective multivalued signals on a bit-by-bit basis, a soft-decision FEC decoding circuit for making an error correction to multivalued signals, which are obtained from the n-bit parallel code by the demultiplexing circuits, based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and multivalued signals into which the one or more decision results obtained by the one or more other deciders each of which sweeps its decision level and its decision phase are demultiplexed by the demultiplexing circuits, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level and its decision phase in the soft-decision decider based on the probability density distributions, a clock phase control circuit for controlling decision phases of the $2^n-1$ deciders in the soft-decision decider based on the probability density distributions, and a sweeping decider clock phase control circuit for controlling the decision phases of the one or more other deciders each of which sweeps its decision level and its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision level and its decision phase in addition to the $2^n-1$ deciders, the optical receiver can find out an optimum decision phase. Furthermore, the optical receiver can estimate probability density distributions by using the optimum decision phase with a higher degree of accuracy and can control the decision level of each decider with a high degree of accuracy.

In addition, the optical receiver can determine the optimum decision phase for the plurality of decoders by simply using one sweeping decider that can sweep its decision level and its decision phase. Therefore, the circuit configuration of the optical receiver can be simplified.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level, which the soft-decision decider includes in addition to the $2^n-1$ deciders, so as to one or more output decision results, an encoder for encoding the $2^n-1$ decision results into an n-bit parallel code having reliability information, (n+1) or more demultiplexing circuits for demultiplexing the n-bit parallel code and the one or more decision results obtained by the one or more other deciders each of which sweeps its decision level in the soft-decision decider into respective multivalued signals on a bit-by-bit basis, a soft-decision FEC decoding circuit for making an error correction to multivalued signals, which are obtained from the n-bit parallel code by the demultiplexing circuits, based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and multivalued signals into which the one or more decision results obtained by the one or more other deciders each of which sweeps its decision level are demultiplexed by the demultiplexing circuits, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, and a clock phase control circuit for controlling decision phases of the $2^n-1$ deciders and the one or more other deciders each of which sweeps its decision level in the soft-decision decider based on a number of counted errors included in the error-corrected parallel received signal from the soft-decision FEC decoding circuit.

Therefore, even if the quality of optical receiving signals degrades, the optical receiver can feature high speed and large capacity and can provide high-quality services.

In addition, because the optical receiver further includes the one or more sweeping deciders each of which can sweep its decision level in addition to the $2^n-1$ deciders, the optical receiver can find out an optimum decision phase. Furthermore, the optical receiver can estimate probability density distributions by using the optimum decision phase with a higher degree of accuracy and can control the decision level of each decider with a high degree of accuracy.

In addition, the optical receiver can determine the optimum decision phase for the plurality of decoders by simply using one sweeping decider that can sweep its decision level without having to use a sweeping decider clock phase control circuit. Therefore, the circuit configuration of the optical receiver can be simplified.

In accordance with another aspect of the present invention, there is provided an optical receiver including a soft-decision deciding means for deciding an electric received signal according to a plurality of decision levels so as to output a multivalued decision signal, a soft-decision error correction decoding means for making an error correction to the multivalued decision signal based on reliability information so as to output an error-corrected received signal and decision results indicating the decision of the electric received signal according to the plurality of decision levels, a probability density distribution estimation means for estimating probability density distributions based on distributions of the decision results indicating the decision of the information data according to the plurality of decision levels, and a decision level control means for controlling the plurality of decision levels in the soft-decision deciding means based on the probability density distributions.

Therefore, even if the quality of optical receiving signals degrades, the optical receiver can feature high speed and large capacity and can provide high-quality services.

In accordance with a preferred embodiment, the optical receiver includes a soft-decision decider for deciding an electric received signal by using $2^n-1$ deciders so as to output $2^n-1$ decision results, an encoder for encoding the $2^n-1$ decision results into an n-bit parallel code having reliability information, a soft-decision FEC decoding circuit for making an error correction to the n-bit parallel code based on the reliability information so as to output an error-corrected received signal and the decision results indicating the decision of the electric received signal according to a plurality of decision levels, a probability density distribution estimation circuit for estimating probability density distributions based on distributions of the decision results indicating the decision of the information data according to the plurality of decision levels, and a threshold control circuit for controlling the plurality of decision levels of the $2^n-1$ deciders in the soft-decision decider based on the probability density distributions.

Therefore, even if the quality of optical receiving signals degrades, the optical receiver can feature high speed and large capacity and can provide high-quality services.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level, which the soft-decision decider includes in addition to the $2^n-1$ deciders, so as to output one or more decision results, an encoder for encoding the $2^n-1$ decision results into an n-bit parallel code having reliability information, a soft-decision FEC decoding circuit for making an error correction to the n-bit parallel code based on the reliability information so as to output an error-corrected received signal and the decision results indicating the decision of the electric received signal according to a plurality of decision levels, a probability density distribution estimation circuit for estimating probability density distributions based on distributions of the decision results indicating the decision of the information data according to the plurality of decision levels, and the one or more decision results obtained by the one or more other deciders each of which sweeps its decision level in the soft-decision decider, a threshold control circuit for controlling the plurality of decision levels of the $2^n-1$ deciders in the soft-decision decider based on the probability density distributions, and a threshold sweeping control circuit for controlling the decision levels of the one or more other deciders each of which sweeps its decision level in the soft-decision decider based on the probability density distributions.

Therefore, even if the quality of optical receiving signals degrades, the optical receiver can feature high speed and large capacity and can provide high-quality services.

In addition, the provision of the one or more sweeping deciders each of which can sweep its decision level in addition to the $2^n-1$ deciders makes it possible to estimate probability density distributions with a higher degree of accuracy and to control the decision level of each decider with a high degree of accuracy.

In accordance with another preferred embodiment, the optical receiver includes a soft-decision decider for deciding an electric received signal by using $2^n$ or more deciders so as to output $2^n$ or more decision results, a selector for selecting $2^n-1$ decision results from among the $2^n$ or more decision results, an encoder for encoding the $2^n-1$ decision results into an n-bit parallel code having reliability information, a soft-decision FEC decoding circuit for making an error correction to the n-bit parallel code based on the reliability information so as to output an error-corrected received signal and the decision results indicating the decision of the electric received signal according to a plurality of decision levels, a probability density distribution estimation circuit for estimating probability density distributions based on distributions of the decision results indicating the decision of the information data according to the plurality of decision levels, and a decider selection control circuit for outputting a selection signal for making the selector select the $2^n-1$ decision results from among the $2^n$ or more decision results based on the probability density distributions.

Therefore, even if the quality of optical receiving signals degrades, the optical receiver can feature high speed and large capacity and can provide high-quality services.

In addition, because the optical receiver is provided with a larger number of deciders than necessary for encoding, the optical receiver can easily acquire distributions of decision results of deciders with a high degree of accuracy without finely controlling their respective decision levels.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level and one or more other deciders each of which sweeps its decision phase, which the soft-decision decider includes in addition to the $2^n-1$ deciders, so as to output decision results, an encoder for encoding the $2^n-1$ decision results into an n-bit parallel code having reliability information, a soft-decision FEC decoding circuit for making an error correction to the n-bit parallel code based on the reliability information so as to output an error-corrected received signal and the decision results indicating the decision of the electric received signal according to a plurality of decision levels, a probability density distribution estimation circuit for estimating probability density distributions based on distributions of the decision results indicating the decision of the information data according to the plurality of decision levels, and the decision results obtained by the one or more other deciders each of which sweeps its decision level and the one or more other deciders each of which sweeps its decision phase in the soft-decision decider, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, a clock phase control circuit for controlling decision phases of the $2^n-1$ deciders and the one or more other deciders each of which sweeps its decision level in the soft-decision decider based on the probability density distributions, and a sweeping decider clock phase control circuit for controlling the decision phases of the one or more other deciders each of which sweeps its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision phase in addition to the $2^n-1$ deciders, the optical receiver can find out an optimum decision phase. Furthermore, because the optical receiver includes the one or more sweeping deciders each of which can sweep its decision level, the optical receiver can estimate probability density distributions by using the optimum decision phase with a higher degree of accuracy and can control the decision level of each decider with a high degree of accuracy.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level and one or more other deciders each of which sweeps its decision phase, which the soft-decision decider includes in addition to the $2^n-1$ deciders, so as to output decision results, a selector for selecting either one or more decision results obtained by the one or more other deciders each of which sweeps its decision level or one or more decision results obtained by the one or more other deciders each of which sweeps its decision phase, an encoder for encoding the $2^n-1$ decision results into an n-bit parallel code having reliability information, a soft-decision FEC decoding circuit for making an error correction to the n-bit parallel code based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and the one or more decision results obtained by either the one or more other deciders each of which sweeps its decision level or the one or more other deciders each of which sweeps its decision phase, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, a clock phase control circuit for controlling decision phases of the $2^n-1$ deciders and the one or more other deciders each of which sweeps its decision level in the soft-decision decider based on the probability density distributions, and a sweeping decider clock phase control circuit for controlling the decision phases of the one or more other deciders each of which sweeps its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision phase in addition to the $2^n-1$ deciders, the optical receiver can find out an optimum decision phase. Furthermore, because the optical receiver includes the one or more sweeping deciders each of which can sweep its decision level, the optical receiver can estimate probability density distributions by using the optimum decision phase with a higher degree of accuracy and can control the decision level of each decider with a high degree of accuracy.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level and its decision phase, which the soft-decision decider includes in addition to the $2^n-1$ deciders, so as to output one or more decision results, an encoder for encoding the $2^n-1$ decision results into an n-bit parallel code having reliability information, a soft-decision FEC decoding circuit for making an error correction to the n-bit parallel code based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and the one or more decision results obtained by the one or more other deciders each of which sweeps its decision level and its decision phase, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level and its decision phase in the soft-decision decider based on the probability density distributions, a clock phase control circuit for controlling decision phases of the $2^n-1$ deciders in the soft-decision decider based on the probability density distributions, and a sweeping decider clock phase control circuit for controlling the decision phases of the one or more other deciders each of which sweeps its decision level and its decision phase in the soft-decision decider based on the probability density distributions.

Therefore, even if the quality of optical receiving signals degrades, the optical receiver can feature high speed and large capacity and can provide high-quality services.

In addition, because the optical receiver further includes the one or more sweeping deciders each of which can sweep its decision level and its decision phase in addition to the $2^n-1$ deciders, the optical receiver can find out an optimum decision phase. Furthermore, the optical receiver can estimate probability density distributions by using the optimum decision phase with a higher degree of accuracy and can control the decision level of each decider with a high degree of accuracy.

In addition, the optical receiver can determine the optimum decision phase for the plurality of decoders by simply using one sweeping decider that can sweep its decision level and its decision phase. Therefore, the circuit configuration of the optical receiver can be simplified.

In accordance with another preferred embodiment, the optical receiver includes a soft-decision decider for deciding an electric received signal by using $2^n-1$ deciders so as to output $2^n-1$ decision results, and for also deciding the electric received signal by using one or more other deciders each of which sweeps its decision level, which the soft-decision decider includes in addition to the $2^n-1$ deciders, so as to one or more output decision results, an encoder for encoding the $2^n-1$ decision results into an n-bit parallel code having reliability information, a soft-decision FEC decoding circuit for making an error correction to the n-bit parallel code based on the reliability information so as to output an error-corrected parallel received signal and the decision results indicating the decision of the electric received signal according to a plurality of decision levels, a probability density distribution estimation circuit for estimating probability density distributions based on distributions of the decision results indicating the decision of the information data according to the plurality of decision levels, and the one or more decision results obtained by the one or more other deciders each of which sweeps its decision level, a threshold control circuit for controlling the plurality of decision levels of the $2^n-1$ deciders in the soft-decision decider based on the probability density distributions, a threshold sweeping control circuit for controlling the decision levels of the one or more other deciders each of which sweeps its decision level in the soft-decision decider based on the probability density distributions, and a clock phase control circuit for controlling decision phases of the $2^n-1$ deciders and the one or more other deciders each of which sweeps its decision level in the soft-decision decider based on a number of counted errors included in the error-corrected parallel received signal from the soft-decision FEC decoding circuit.

Therefore, even if the quality of optical receiving signals degrades, the optical receiver can feature high speed and large capacity and can provide high-quality services.

In addition, because the optical receiver further includes the one or more sweeping deciders each of which can sweep its decision level in addition to the $2^n-1$ deciders, the optical receiver can find out an optimum decision phase. Furthermore, the optical receiver can estimate probability density distributions by using the optimum decision phase with a higher degree of accuracy and can control the decision level of each decider with a high degree of accuracy.

In addition, the optical receiver can determine the optimum decision phase for the plurality of decoders by simply using one sweeping decider that can sweep its decision level without having to use a sweeping decider clock phase control circuit. Therefore, the circuit configuration of the optical receiver can be simplified.

Preferably, the threshold control circuit controls the plurality of decision levels of the $2^n-1$ deciders in the soft-decision decider so that the probability density distributions estimated by the probability density distribution estimation circuit become optimum ones.

Therefore, the optical receiver can improve the transmission quality by optimally controlling the decision level of each of the plurality of deciders.

Preferably, the probability density distribution estimation circuit estimates the probability density distributions based on at least one of the $2^n-1$ decision results obtained by the $2^n-1$ deciders and the one or more decision results obtained by the one or more other deciders each of which sweeps its decision level, and the threshold control circuit controls the plurality f decision levels of the $2^n-1$ deciders in the soft-decision decider so that the probability density distributions estimated by the probability density distribution estimation circuit become optimum ones.

Therefore, the optical receiver can improve the transmission quality by optimally controlling the decision level of each of the plurality of deciders.

Preferably, the probability density distribution estimation circuit also estimates probability density distributions based on the one or more decision results obtained by the one or more other deciders each of which sweeps its decision level, and the threshold control circuit controls the plurality of decision levels of the $2^n-1$ deciders in the soft-decision decider based on the probability density distribution, which is estimated from the one or more decision results by the probability density distribution estimation circuit, so that the probability density distributions obtained from the $2^n-1$ decision results obtained by the $2^n-1$ deciders become optimum ones.

Therefore, the optical receiver can improve the transmission quality by optimally controlling the decision level of each of the plurality of deciders.

Preferably, the decider selection control circuit delivers the selection signal for making the selector select the $2^n-1$ decision results from among the $2^n$ or more decision results so that the probability density distributions estimated by the probability density distribution estimation circuit become optimum ones.

Therefore, the optical receiver can improve the transmission quality by optimally controlling the decision level of each of the plurality of deciders.

Preferably, the optimum probability density distributions are normal distributions.

Therefore, the optical receiver can improve the transmission quality.

Preferably, the encoder encodes the $2^n-1$ decision results into the n-bit parallel code including a hard-decision one of the $2^n-1$ decision results, which is obtained according to a middle one of the plurality of decision levels, and the reliability information associated with the hard-decision result and obtained from other ones of the $2^n-1$ decision results, which are obtained according to decision levels other than the middle decision level.

Therefore, when frame synchronization and descrambling processing are provided for synchronization between the encoder and the soft-decision FEC decoding circuit, the optical receiver only has to process a hard-decision result. Therefore, the circuit configuration of the optical receiver can be simplified.

Preferably, when the soft-decision decider outputs impossible decision results as the decision results obtained according to the decision levels other than the middle decision level, the encoder encodes the $2^n-1$ decision results according to priority information.

Therefore, even if an error occurs in a decision result obtained by a decider, the encoder of the optical receiver encodes the decision results obtained by the plurality of deciders according to the priority information, thereby preventing the occurrence of a decision result pattern which the encoder cannot encode.

Preferably, the priority information indicates that a higher priority is given to a decision result obtained according to a decision level closer to the middle decision level.

Therefore, even if an error occurs in a decision result obtained by a decider, the encoder of the optical receiver encodes the decision results obtained by the plurality of deciders according to the priority information, thereby preventing the occurrence of a decision result pattern which the encoder cannot encode.

Preferably, when the soft-decision decider outputs impossible decision results as the decision results obtained according to the decision levels other than the middle decision level, the encoder corrects the impossible decision results so as to obtain one or more decision result patterns which can be encoded and each of which has a least number of bits that are corrected, and, when obtaining two or more decision results patterns which can be encoded and each of which has a least number of bits that are corrected, selects one of them by assuming that the higher decision levels the more accurate the decision results are so as to generate the reliability information according to the selected decision results pattern.

Therefore, even if an error occurs in a decision result obtained by a decider, the optical receiver obtains one or more corrected decision result patterns each of which has the least number of bits that are corrected, and corrects the error according to the priority information indicating that the closer to the middle decision level the lower probability of occurrence of errors a corresponding decision result has, thereby preventing the occurrence of a decision result pattern which the encoder cannot encode.

Preferably, the encoder gives a higher priority to one of the $2^n-1$ decision results indicating that the electric received signal is decided to be significant and obtained by a decider having a higher decision level, and encodes the $2^n-1$ decision results into the n-bit parallel code including a hard-decision result and the reliability information associated with the hard-decision result according to a higher decision level according to which the electric received signal is decided to be significant.

Therefore, even if an error occurs in a decision result obtained by a decider, the optical receiver corrects the error according to the priority information indicating that higher priorities are given to decision results indicating that electric received signals are decided as to be significant according to higher decision levels, thereby preventing the occurrence of a decision result pattern which the encoder cannot encode.

Preferably, the encoder gives a higher priority to one of the $2^n-1$ decision results indicating that the electric received signal is decided to be insignificant and obtained by a decider having a lower decision level, and encodes the $2^n-1$ decision results into the n-bit parallel code including a hard-decision result and the reliability information associated with the hard-decision result according to a lower decision level according to which the electric received signal is decided to be insignificant.

Therefore, even if an error occurs in a decision result obtained by a decider, the optical receiver corrects the error according to the priority information indicating that higher priorities are given to decision results indicating that electric received signals are decided to be insignificant according to lower decision levels, thereby preventing the occurrence of a decision result pattern which the encoder cannot encode.

Preferably, the encoder generates the reliability information according to a number of decision results indicating that electric received signals are decided to be either significant or insignificant and obtained by deciders having either higher or lower decision levels than the middle decision level.

Therefore, even if an error occurs in a decision result obtained by a decider, the encoder of the optical receiver encodes the decision results obtained by the plurality of deciders based on the numbers of significant results and in significant results decided by deciders having decision levels higher or lower than the middle decision level regardless of a decision result pattern obtained according to the higher or lower decision levels, thereby preventing the occurrence of a decision result pattern which the encoder cannot encode.

Preferably, the encoder encodes the $2^n-1$ decision results obtained by the soft-decision decider into the n-bit parallel code including a hard-decision result and the reliability information associated with the hard-decision result according to a number of decision results indicating that electric received signals are decided to be either significant or insignificant and included in the $2^n-1$ decision results.

Therefore, even if an error occurs in a decision result obtained by a decider, the encoder of the optical receiver encodes the decision results obtained by the plurality of deciders based on the number of significant or insignificant results regardless of the decision result pattern obtained by the plurality of deciders, thereby preventing the occurrence of a decision result pattern which the encoder cannot encode.

Preferably, the encoder includes a priority selection circuit for selecting and outputting either an n-bit parallel code obtained by a significant priority bit encoding circuit or an n-bit parallel code obtained by an insignificant priority bit encoding circuit, and for changing the selection according to a previous n-bit parallel code.

Therefore, when decision errors occur in deciders, the optical receiver can decide the level of each bit of an input bitstream while giving a higher priority to a decision result indicating that a corresponding bit of the bitstream is decided to be significant or insignificant, and can make error correction with a higher degree of accuracy.

Preferably, the encoder gives a higher priority to two of the $2^n-1$ decision results obtained by a decider having a largest decision level and by another decider having a smallest decision level, and, when the soft-decision decider outputs impossible decision results as those decision results, corrects the impossible decision results based on decision results obtained by another decider having a second largest decision level and by another decider having a second smallest decision level and encodes the corrected $2^n-1$ decision results into the n-bit parallel code including a hard-decision result and the reliability information associated with the hard-decision result.

Therefore, even if an error occurs in a decision result obtained by a decider, the encoder of the optical receiver encodes the decision results obtained by the plurality of deciders according to the priority information indicating that the further from a middle decision level the lower probability of occurrence of errors a corresponding decision result has, and, when the decision result obtained by a decider having the highest or lowest decision level is an impossible one, the decision result has to be corrected based on the decision result obtained by another decider having the second highest or lowest decision level", thereby preventing the occurrence of a decision result pattern which the optical receiver cannot encode.

Preferably, the receiver includes a decision level error detection unit for causing the threshold control circuit to control the plurality of decision levels of the $2^n-1$ deciders so that distributions of the decision results obtained by the $2^n-1$ deciders are identical with one another, and for detecting an error in the decision level of each of the $2^n-1$ deciders from differences among the plurality of decision levels controlled by the threshold control circuit, and the threshold control circuit corrects the plurality of decision levels of the $2^n-1$ deciders in the soft-decision decider with errors in the plurality of decision levels detected by the decision level error detection unit and then controls the plurality of decision levels of the $2^n-1$ deciders.

Therefore, the optical receiver can improve the transmission quality by controlling each of the $2^n-1$ deciders so that each of the $2^n-1$ deciders has a decision level connected with a decision level error.

Preferably, the receiver includes a decision level error detection unit for causing the threshold control circuit to control the plurality of decision levels of the $2^n-1$ deciders so that a distribution of decision results obtained by one other decider which sweeps its decision level is identical with a distribution of decision results obtained by each of the $2^n-1$ deciders, and for detecting an error in the decision level of each of the $2^n-1$ deciders from a difference between the decision level of the other decider which sweeps its decision level, which is controlled by the threshold sweeping control circuit, and the decision level of each of the $2^n-1$ deciders, which is controlled by the threshold control circuit, and the threshold control circuit corrects the plurality of decision levels of the $2^n-1$ deciders in the soft-decision decider with errors in the plurality of decision levels detected by the decision level error detection unit and then controls the plurality of decision levels of the $2^n-1$ deciders.

Therefore, the optical receiver can improve the transmission quality by controlling each of the $2^n-1$ deciders so that each of the $2^n-1$ deciders has a decision level connected with a decision level error.

Preferably, the probability density distribution estimation means and the decision level control means are a register for holding the decision results indicating the decision of the information data according to the plurality of decision levels, which are delivered from the soft-decision error correction decoding means, and a digital processing unit for estimating the probability density distribution based on the decision results held by the register, and for controlling the plurality of decision levels in the soft-decision deciding means based on the estimated probability density distribution.

Therefore, even if the quality of optical receiving signals degrades, the optical receiver can feature high speed and large capacity and can provide high-quality services.

BRIEF DESCRIPTION OF THE FIGURES

FIG. 10 is a plot showing the frequencies with which electric received waveforms are decided as mark and space, respectively, by each deciders before and after feedback control is carried out;

FIG. 29 is a plot showing the decision frequencies with which electric received signals are decided as mark and space, respectively, at each decision phase;

FIG. 31 is a plot showing the decision frequencies with which electric received signals are decided as mark and space, respectively, at each decision phase;

FIG. 33 is a flow chart showing an n-bit encoding procedure of an encoder according to embodiment 10 of the present invention;

FIG. 34 is an explanatory drawing showing all decision result patterns;

FIG. 35 is an explanatory drawing showing encoded results obtained from all the decision result patterns;

FIG. 39 is an explanatory drawing showing encoded patterns based on priority information;

FIG. 40 is an explanatory drawing showing an example of an encoding method capable of encoding decision results regardless of decision errors caused by deciders according to embodiment 13 of the present invention;

FIG. 41 is an explanatory drawing showing encoded patterns based on priority information;

FIG. 42 is an explanatory drawing showing an example of an encoding method capable of encoding decision results regardless of decision errors caused by deciders according to embodiment 14 of the present invention;

FIG. 43 is an explanatory drawing showing encoded patterns based on priority information;

FIG. 44 is an explanatory drawing showing an example of an encoding method capable of encoding decision results regardless of decision errors caused by deciders according to embodiment 15 of the present invention;

FIG. 45 is an explanatory drawing showing encoded patterns based on priority information;

FIG. 52 is an explanatory drawing showing encoded patterns;

PREFERRED EMBODIMENTS OF THE INVENTION

In order to explain the present invention in greater detail, the preferred embodiments will be described below with reference to the accompanying figures.

Embodiment 1

Figure 1:
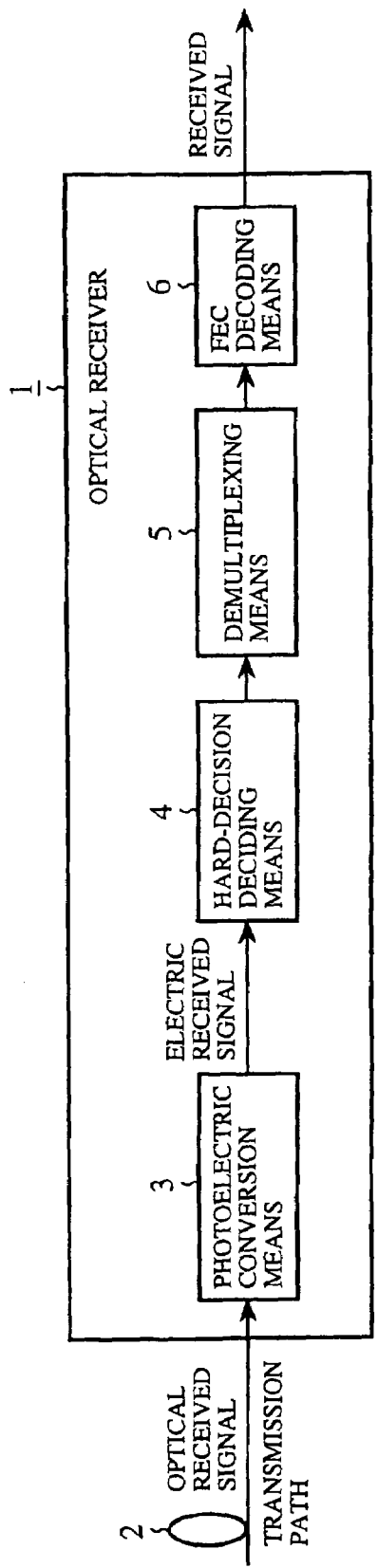
FIG. 1 is a block diagram showing a prior art optical receiver.
Figure 2:
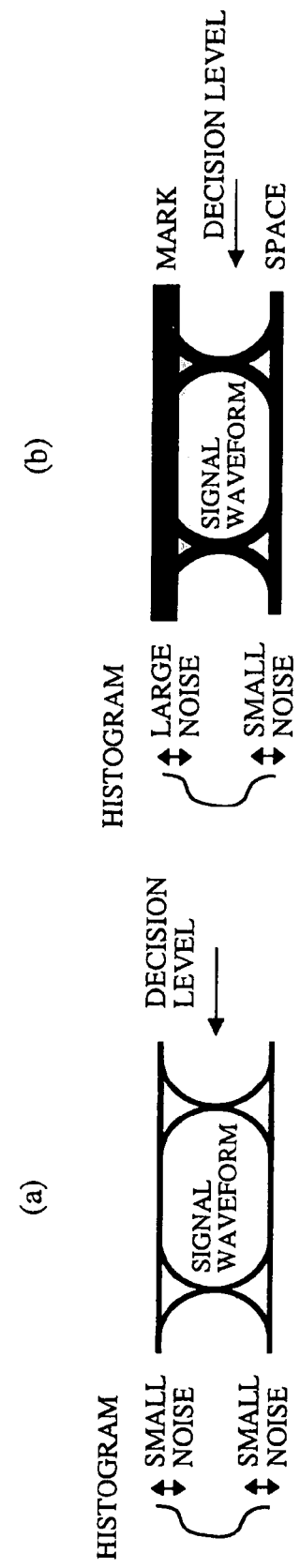
FIG. 2 is a waveform diagram showing an electric received signal input to a hard-decision deciding means.
Figure 3:
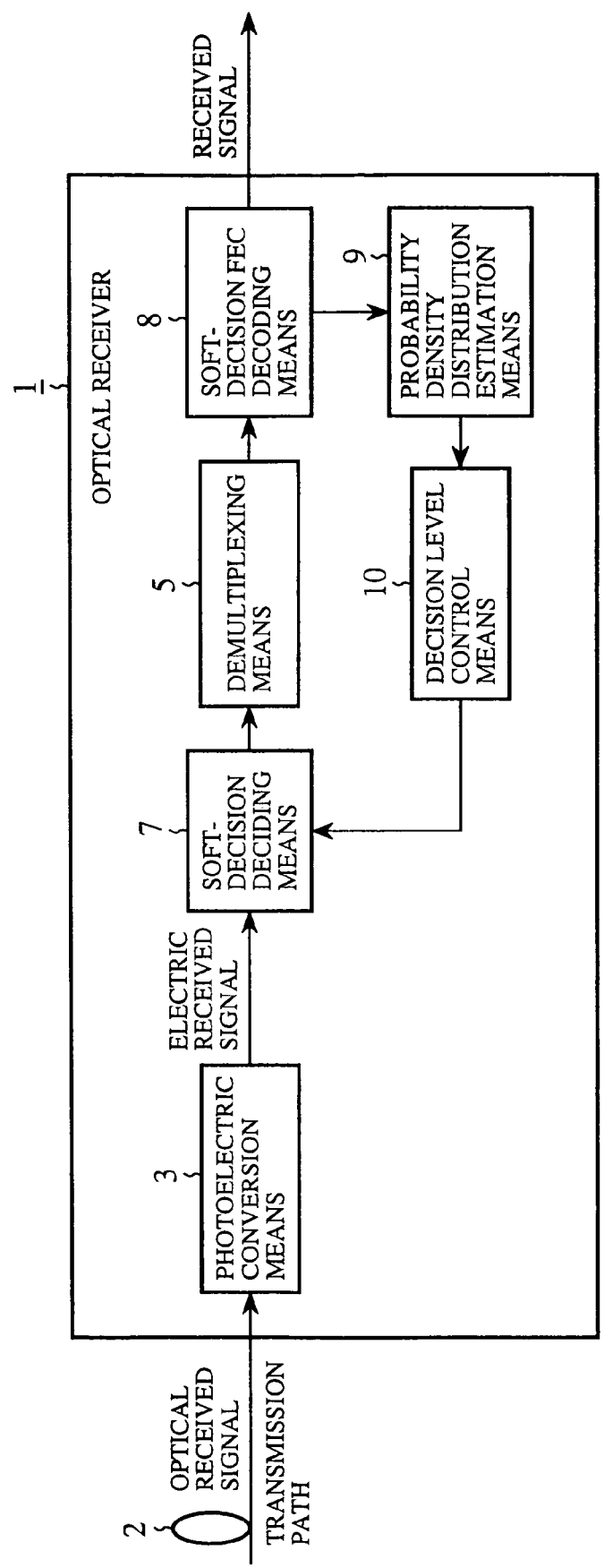
FIG. 3 is a block diagram showing an optical receiver according to embodiment 1 of the present invention.

FIG. 3 is a block diagram showing an optical receiver according to embodiment 1 of the present invention. In the figure, reference numeral 1 denotes the optical receiver, reference numeral 2 denotes a transmission path, reference numeral 3 denotes a photoelectric conversion means, reference numeral 7 denotes a soft-decision deciding means, reference numeral 5 denotes a demultiplexing means, reference numeral 8 denotes a soft-decision FEC decoding means (i.e., a soft-decision error correction decoding means), reference numeral 9 denotes a probability density distribution estimation means, and reference numeral 10 denotes a decision level control means.

The photoelectric conversion means 3 converts an optical received signal applied thereto by way of the transmission path 2 into an electric received signal, and delivers it to the soft-decision deciding means 7. The soft-decision deciding means 7 decides the level of the electric received signal according to a plurality of decision levels, and delivers a multivalued decision signal to the demultiplexing means 5. The demultiplexing means 5 serial-to-parallel converts the multivalued decision signal so as to deliver a multivalued parallel signal to the soft-decision FEC decoding means 8. The soft-decision FEC decoding means 8 makes an error correction to the multivalued parallel signal based on reliability information, outputs the error-corrected parallel received signal, and further generates and delivers the frequencies with which electric received signal are decided as mark and space, respectively, by the soft-decision deciding means from the multivalued decision signal to the probability density distribution estimation means 9. The probability density distribution estimation means 9 then estimates probability density distributions based on the decision frequency result obtained for each decision level, and delivers the estimated probability density distributions to the decision level control means 10. The decision level control means 10 appropriately controls the plurality of decision levels in the soft-decision deciding means 7 based on the probability density distributions.

Figure 4:
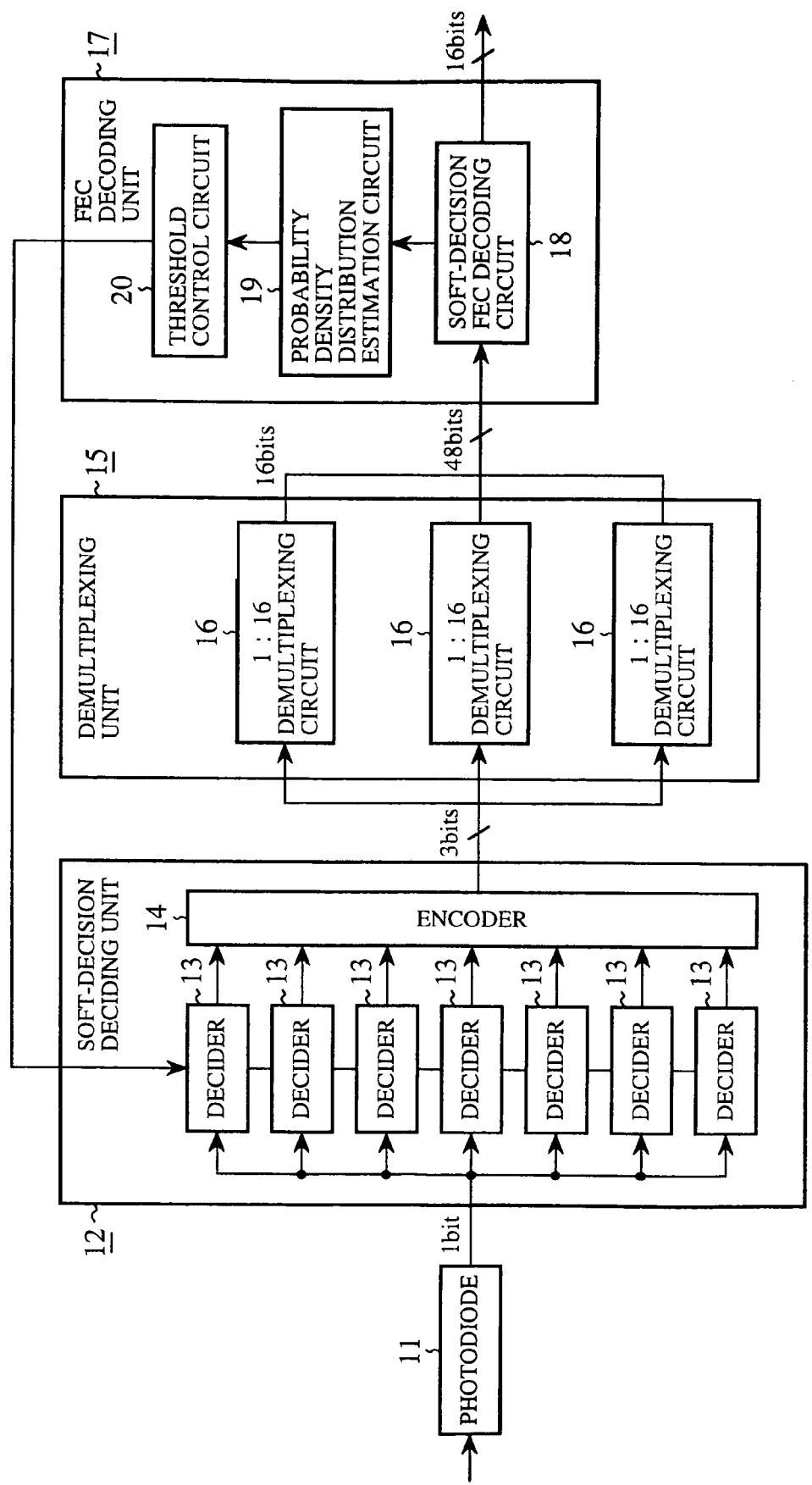
FIG. 4 is a block diagram showing the optical receiver according to embodiment 1 of the present invention in detail.

FIG. 4 is a block diagram showing the structure of the optical receiver according to embodiment 1 of the present invention in detail. In the figure, reference numeral 11 denotes a photodiode corresponding to the photoelectric conversion means 3, for converting an optical received signal applied thereto into an electric received signal, and for delivering it to a soft-decision deciding unit 12.

The soft-decision deciding unit 12 corresponds to the soft-decision deciding means 7. In the soft-decision deciding unit 12, reference numeral 13 denotes each of seven deciders having different decision levels in order to acquire a 3-bit decision signal, each decider 13 deciding the level of the electric received signal as mark or space. A soft-decision decider includes these deciders 13. Reference numeral 14 denotes an encoder for encoding those decision results from the seven deciders so as to generate and deliver a 3-bit parallel code to a demultiplexing unit 15.

Reference numeral 15 denotes the demultiplexing unit corresponding to the demultiplexing means 5. In the demultiplexing unit 15, reference numeral 16 denotes a 1:16 demultiplexing circuit (i.e., a demultiplexing circuit) for serial-to-parallel converting the 3-bit parallel code from the encoder on a bit-by-bit basis, and for delivering an obtained parallel signal to an FEC decoding unit 17.

Reference numeral 17 denotes the FEC decoding unit corresponding to a combination of the soft-decision FEC decoding means 8, the probability density distribution estimation means 9, and the decision level control means 10. In the FEC decoding unit 17, reference numeral 18 denotes a soft-decision FEC decoding circuit for making an error correction to a multivalued signal obtained by the demultiplexing unit 15 based on the reliability information so as to deliver the error-corrected parallel signal, and delivers the decision result obtained according to each decision level to a probability density distribution estimation circuit 19. Reference numeral 19 denotes the probability density distribution estimation circuit for estimating probability density distributions based on distributions of the decision results respectively obtained according to the plurality of decision levels, and delivers it to a threshold control circuit 20. Reference numeral 20 denotes the threshold control circuit for calculating a decision level for each of the plurality of deciders 13 in the soft-decision deciding unit 12 based on the estimated probability density distributions, and delivers the calculated decision level, as a control signal, to the soft-decision deciding unit 12.

Next, a description will be made as to an operation of the optical receiver according to embodiment 1.

In FIG. 4, the photodiode 11 converts an optical received signal applied thereto into an electric received signal, and delivers it to the seven deciders 13 having different decision levels. Each of those deciders 13 decides the level of the electric received signal as mark "1" or space "0" according to its own decision level.

Figures 5, 6:
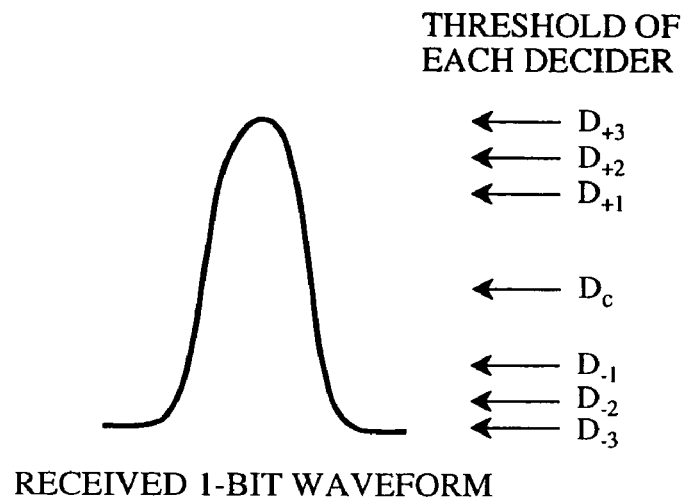
FIG. 5 is an explanatory drawing showing a decision level of each decider with respect to an electric received waveform.
FIG. 6 is an explanatory drawing showing eight possible decision result patterns each indicating decision of an input electric received signal as mark or space.

FIG. 5 is an explanatory drawing showing an example of the different decision levels of the plurality of deciders which are set with respect to electric received waveforms. For example, when the decision level of each of the plurality of deciders 13 is set as shown in this FIG. 5, the set of seven deciders 13 can deliver any of 8 possible decision results.

FIG. 6 is an explanatory drawing showing the 8 possible decision results obtained when each of the plurality of deciders decides the level of the electric received signal as mark or space.

The encoder 14 receives respective decision results from the plurality of deciders 13 and encodes one of the 8 possible decision states into 3-bit binary data.

Figures 7, 8:
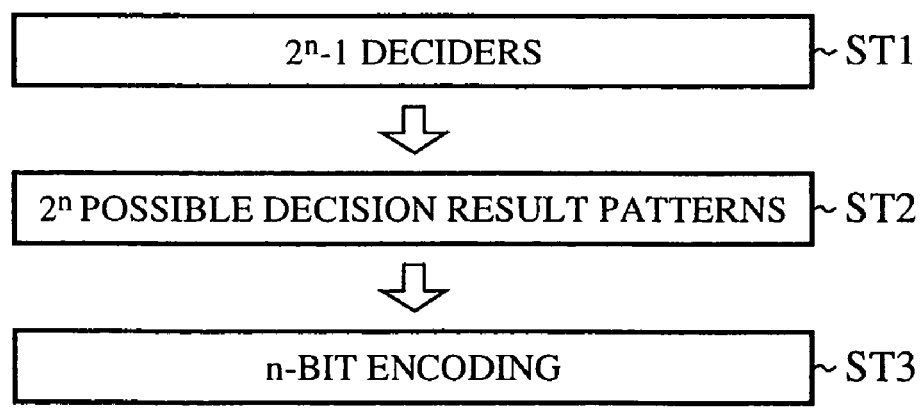
FIG. 7 is an explanatory drawing showing an example of 3-bit encoding of each of the eight possible decision result patterns.
FIG. 8 is a flowchart showing an n-bit encoding procedure.

FIG. 7 is an explanatory drawing showing an example in which each of the 8 possible decision results is encoded into 3-bit binary data. The encoder thus converts the set of decision results from the plurality of deciders 13 into a 3-bit code including reliability information indicating whether the electric received signal is assumed be a close-to-mark mark or a close-to-space mark. The encoder 14 then delivers the obtained 3-bit code to the demultiplexing unit 15 as three parallel signals.

In this embodiment 1, the encoder 14 can alternatively encode one of plural possible decision results into n-bit binary data.

FIG. 8 is a flow chart showing an n-bit encoding procedure. The optical receiver can carry out n-bit encoding by processing steps ST1 to ST3. In this case, $2^n-1$ deciders are needed so that the encoder can encode one of $2^n$ possible decision results into n-bit binary data.

The 3-bit parallel signal from the encoder 14 is delivered to the demultiplexing unit 15. In the demultiplexing unit 15, the three 1:16 demultiplexing circuits 16 serial-to-parallel convert the 3-bit parallel signals on a bit-by-bit basis, respectively, and then deliver a 48-bit parallel signal speed-converted to the FEC decoding unit 17. The soft-decision FEC decoding circuit 18 makes a correction to bit errors included in the 48-bit parallel signal including the reliability information and outputs a 16-bit parallel received signal. The soft-decision FEC decoding circuit 18 further delivers the frequencies with which the electric received signals is decided as mark and space, respectively, by each of the seven deciders 13 to the probability density distribution estimation circuit 19. The probability density distribution estimation circuit 19 estimates probability density distributions based on the frequencies with which electric received signals are decided by each of the seven deciders 13.

The probability density distribution estimation circuit 19 catches a certain amount of input signals including the reliability information so as to finally determine the frequencies with which electric received signals are decided by each of the seven deciders 13. Because the soft-decision FEC decoding circuit 18 makes a correction to bit errors included in the 48-bit parallel signal including the reliability information, a rate of errors included in the decision result obtained by each decider 13 is acquired. The probability density distribution estimation circuit 19 estimates probability density distributions based on this error rate of each decider 13. The estimated probability density distributions are delivered to the threshold control circuit 20. The threshold control circuit 20 delivers a control signal for controlling the decision levels of the seven deciders 13 to the seven deciders 13 in order to feedback-control them so that they have optimum decision levels.

Figure 9:
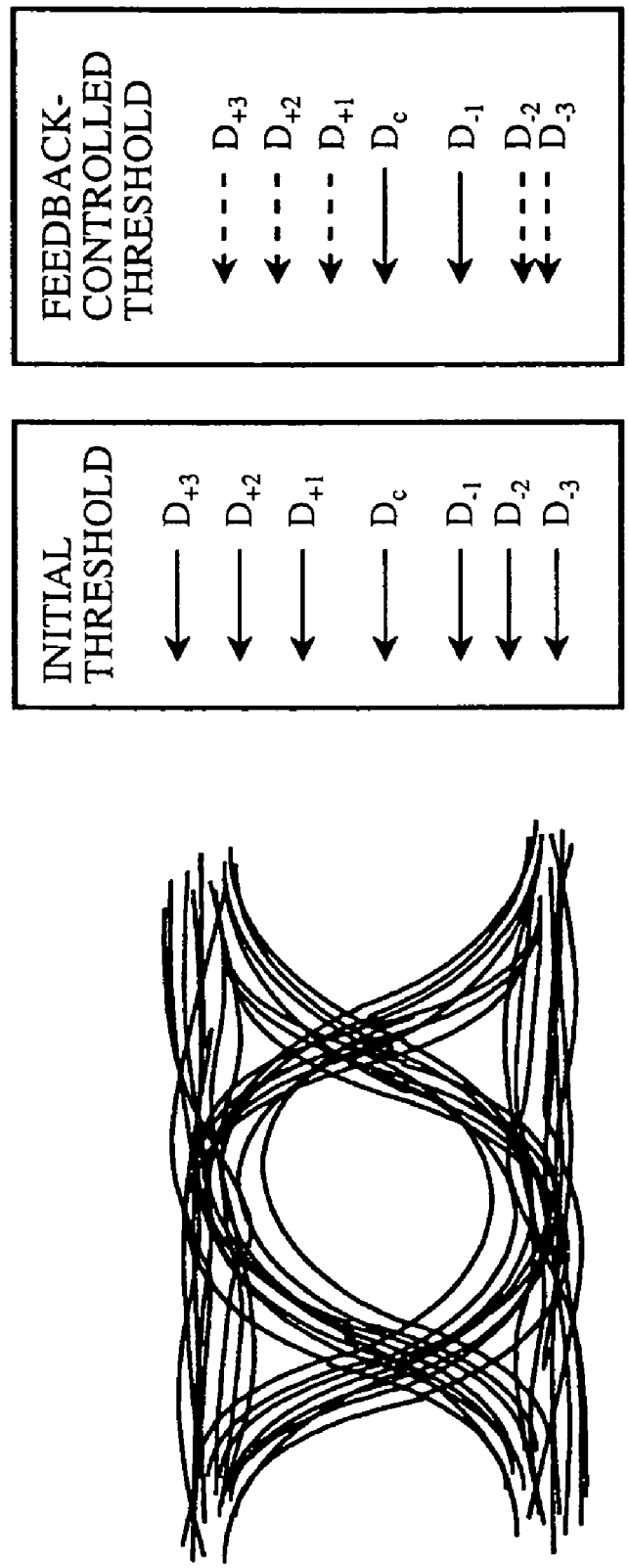
FIG. 9 is an explanatory drawing showing relationship between decision levels and electric received waveforms.
Figure 11:
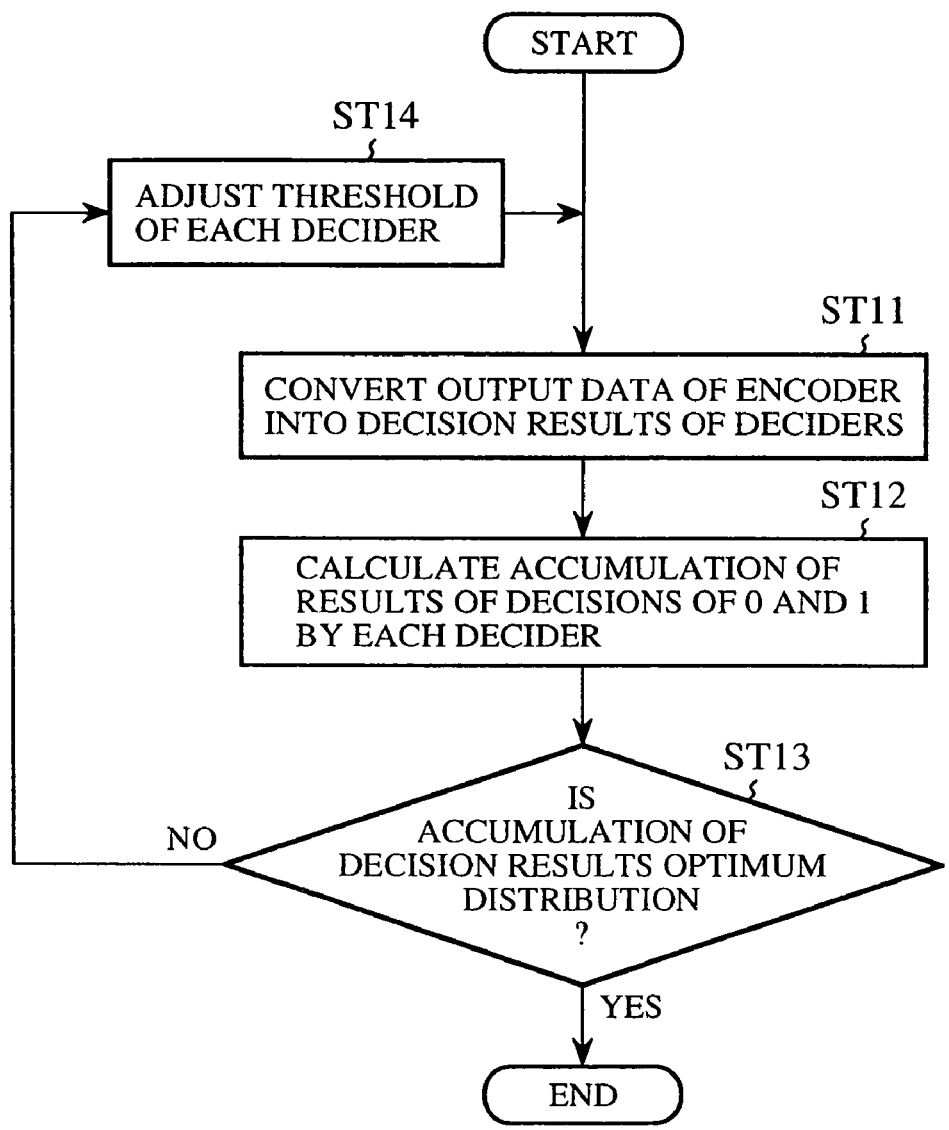
FIG. 11 is a flowchart showing a technique for controlling the decision level of each decider by performing the feedback control according to embodiment 1 of the present invention.

FIG. 9 is an explanatory drawing showing a relationship among the decision levels provided for electric received waveforms, FIG. 10 shows plots of the frequencies with which electric received waveforms are decided as mark and space, respectively, by each of the seven deciders 13 before and after the feedback control is carried out, and FIG. 11 is a flow chart showing a technique for controlling the decision level of each decider by performing the feedback control according to embodiment 1 of the present invention.

Hereafter, a concrete example of controlling the decision level of each decider through the feedback control will be explained with reference to FIGS. 9 to 11, especially, with reference to the procedure as shown in FIG. 11. FIG. 9 shows a relationship among the decision levels provided for electric received waveforms, and each decider 13 decides the level of each electric received applied thereto according to an initial threshold and catches the frequencies with which electric received signals are decided as mark and space, respectively, according to its own decision level (in steps ST11 and ST12). Assume that the resultant frequencies with which electric received signals are decided as mark and space, respectively, according to each of the plurality of decision levels are obtained as shown in FIG. 10(a). As can be seen from the figure, there is a bias in the frequencies with which electric received signals are decided as mark and space, respectively, by each of the seven deciders 13 and the setting of the decision level is not optimized for each decider 13 (in step ST13). There can be a frequency distribution that maximizes the error correction performance of the optical receiver. Hereafter, a description will be made as to an example of controlling the distributions of the resultant frequencies with which electric received signals are decided as mark and space, respectively, assuming that a straight line distribution is the distribution that maximizes the error correction performance of the optical receiver.

The decision level of each decider 13 is adjusted to bring each of the frequency distributions for mark and space close to this straight line distribution. By increasing $D_{-3}$ level, decreasing $D_{-2}$ level, and further decreasing $D_{+1}$, $D_{+2}$, and $D_{+3}$ levels, the decision frequencies for each decider 13 for mark and space can be brought close to desired ones (in step ST14). As shown in FIG. 10(b), according to the feedback-controlled thresholds as shown in FIG. 9 the decision frequencies of each decider 13 for mark and space can be set to desired decision frequencies.

In the above-mentioned example, the optimum distribution is a straight line distribution. As an alternative, the decision level of each decider 13 can be adjusted to bring each of the frequency distributions for mark and space close to a normal distribution, for example.

According to this embodiment 1, the probability density distribution estimation circuit 19 estimates probability density distributions from the decision results from all the seven deciders 13. As an alternative, the probability density distribution estimation circuit 19 can estimate the probability density distributions from decision results from part of all the deciders 13.

Furthermore, in accordance with this embodiment 1, the probability density distribution estimation circuit 19 estimates the probability density distributions from the frequencies with which electric received signals are decided as mark and space, respectively, according to each of the plurality of decision levels. As an alternative, the probability density distribution estimation circuit 19 can estimate the probability density distributions as follows:

Each of the frequencies with which electric received signals are decided as mark and space, respectively, by each of the plurality of deciders 13 is determined based on an accumulated number of decision results. The probability of misdeciding mark as space is $(\frac{1}{2})$ erfc$((I1-IDk)/(\sigma1\cdot\sqrt{2}))$. If the frequency with which electric received signals are decided as mark is $\frac{1}{2}$, the probability of misdeciding mark as space becomes $(\frac{1}{4})$ erfc$((I1-IDk)/(\sigma1\cdot\sqrt{2}))$ and therefore becomes a probability of misdeciding mark as space according to the k-th threshold IDk. This probability concerning mark is thus calculated for each of the seven deciders, and is then fit to the characteristic of erfc, so that I1 (i.e., an average voltage at which marks are decided) and $\sigma1$ (i.e., a decentralized voltage at which marks are decided) are determined. The same processing is similarly carried out as for space. As a result, the probability density distributions can be estimated.

As mentioned above, in accordance with this embodiment 1, a multivalued signal acquired from decision results obtained by the plurality of deciders 13 having their respective decision levels contains reliability information about the reliability of decision between mark and space, and the plurality of decision levels are set to the ones at which the error correction ability of the optical receiver is maximized, so that the optical receiver can optimally make an error correction to electric received signals. Therefore, even if the quality of the optical received signal decreases, the optical receiver can be implemented as a high-speed and large-capacity receiver and can provide high-quality services. Furthermore, because the soft-decision FEC decoding circuit 18 carries out the error correction based on the parallel multivalued signal and the paralleled reliability information, the optical receiver can be constructed of a CMOS LSI that can provide a high degree of integration and can reduce power consumption. Therefore, the optical receiver can be downsized and the power consumption can be reduced.

Embodiment 2

Figure 12:
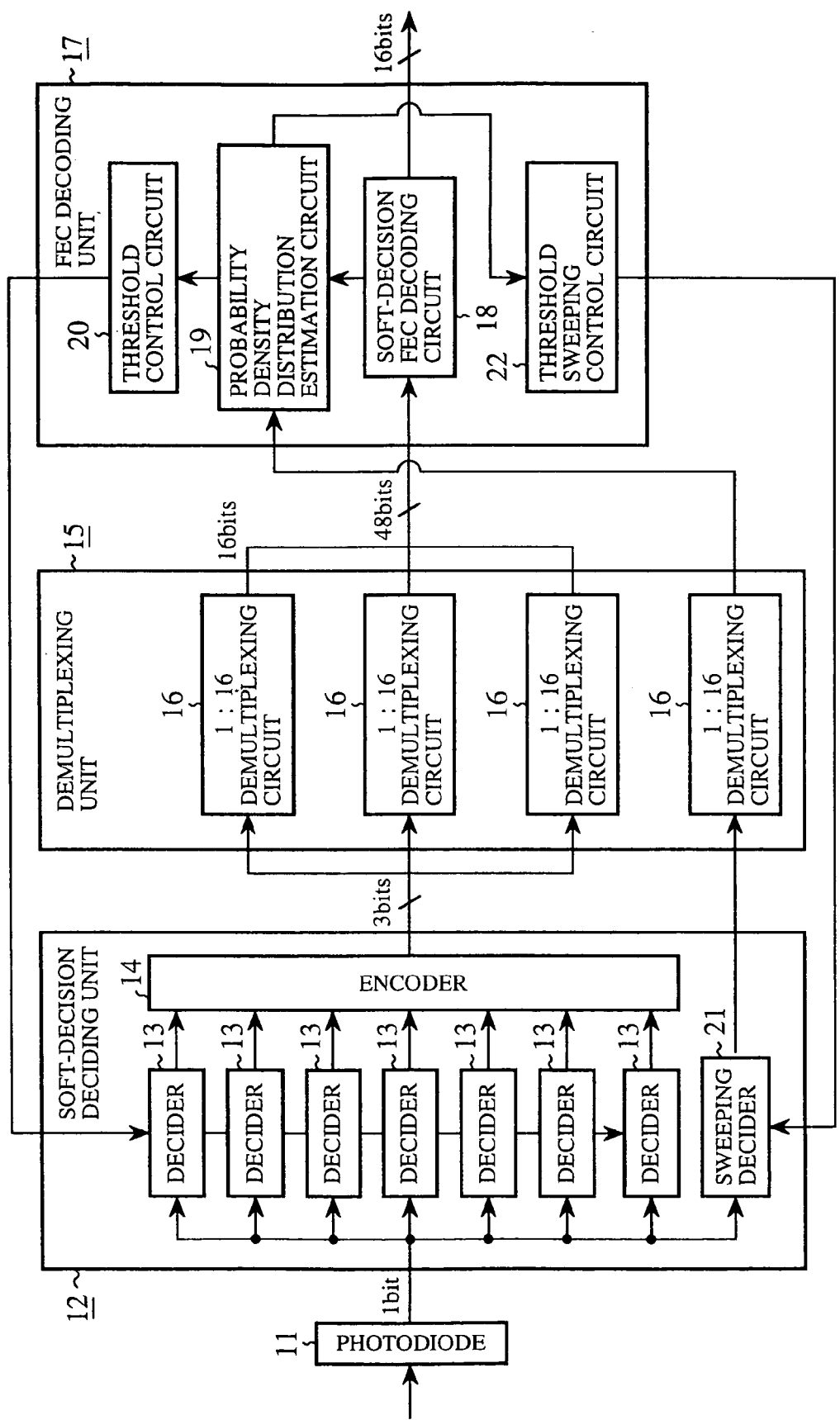
FIG. 12 is a block diagram showing an optical receiver according to embodiment 2 of the present invention in detail.

FIG. 12 is a block diagram showing the structure of an optical receiver according to embodiment 2 of the present invention in detail. In addition to the structure of the optical receiver 1 of embodiment 1 shown in FIG. 4, the optical receiver of this embodiment 2 includes a sweeping decider 21 (i.e., a decider) capable of sweeping its decision level, in addition to $2^n-1$ deciders 13, a 1:16 demultiplexing circuit 16 (i.e., a demultiplexing circuit) for converting a decision result from the sweeping decider 21 into a parallel signal, and a threshold sweeping control circuit 22 for controlling the decision level of the sweeping decider 21.

The decision result from this sweeping decider 21 is delivered to a demultiplexing unit 15, is converted into a 16-bit parallel signal by the 1:16 demultiplexing circuit 16, and is then sent to a probability density distribution estimation circuit 19. The probability density distribution estimation circuit 19 sends estimated probability density distributions to the threshold sweeping control circuit 22. The threshold sweeping control circuit 22 then controls the decision level of the sweeping decider 21 based on these estimated probability density distributions.

Next, a description will be made as to an operation of the optical receiver according to embodiment 2.

The decision level of the sweeping decider 21 is set to a value that is interpolated among the plurality of decision levels of the $2^n-1$ deciders 13. The sweeping decider 21 decides the level of an electric received signal as mark or space. The decision result is then sent to the demultiplexing unit 15. The data sent to the demultiplexing unit 15 is an information bit representing mark or space. The demultiplexing unit 15 delivers a parallel signal into which the decision result from the sweeping decider is speed-converted by the 1:16 demultiplexing circuit 16 to an FEC decoding unit. The probability density distribution estimation circuit 19 calculates accumulated frequencies with which electric received signals are decided as mark and space, respectively, by the sweeping decider 21, in addition to accumulations of the decision results from the other seven deciders 13. The probability density distribution estimation circuit 19 then estimates probability density distributions from those accumulated results, like that of embodiment 1, and delivers the probability density distributions to the threshold sweeping control circuit 22. The FEC decoding unit delivers a control signal through the threshold sweeping control circuit 22 in order to set the threshold of the sweeping decider 21 to a value that is interpolated among the decision levels of the other seven deciders 13.

Figure 13:
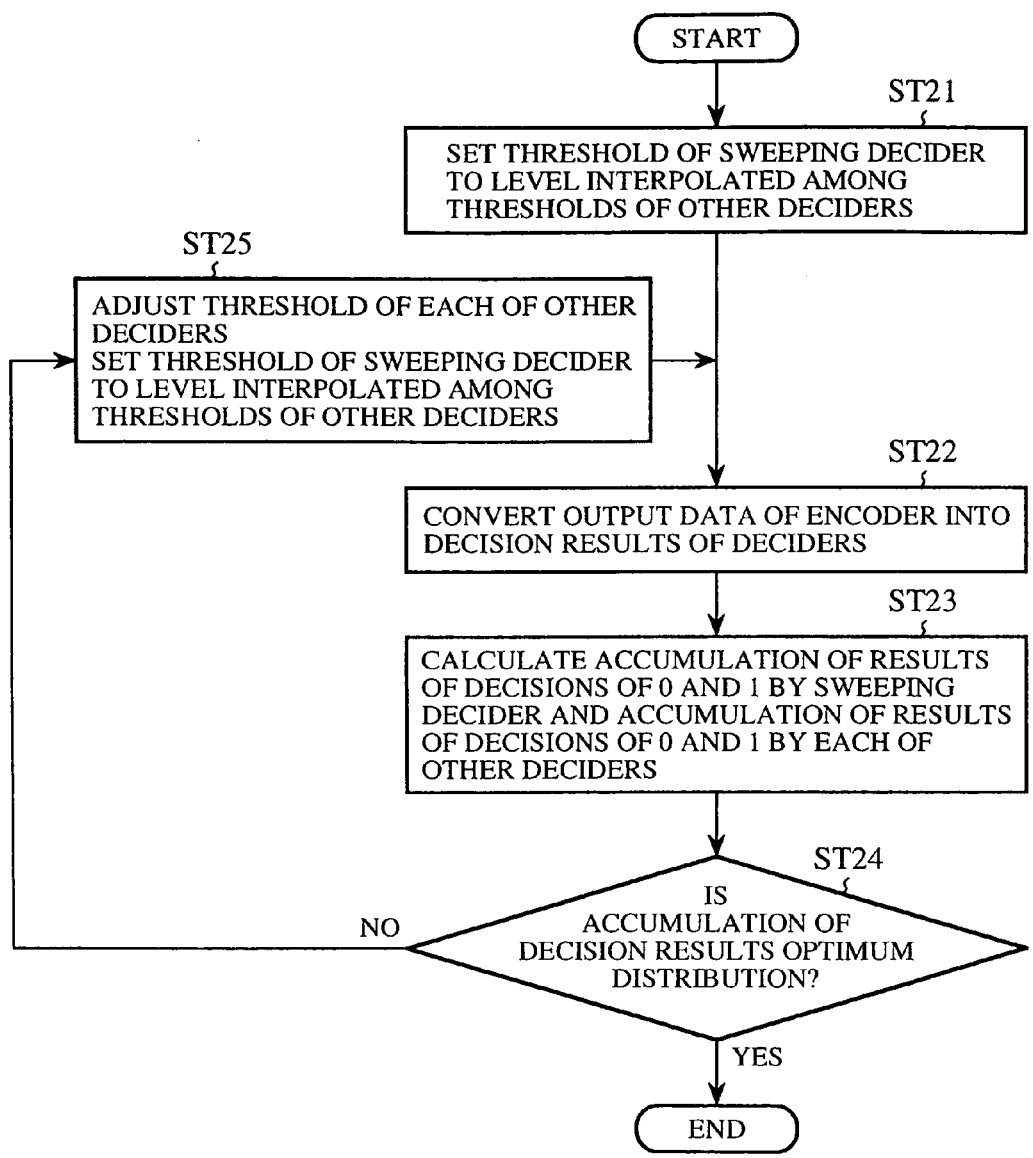
FIG. 13 is a flowchart showing a technique for controlling the decision level of each decider by performing the feedback control according to embodiment 2 of the present invention.

FIG. 13 is a flowchart showing a technique for controlling the decision level of each decider through feedback control in accordance with embodiment 2 of the present invention.

Initially, the FEC decoding unit sets the decision level of the sweeping decider 21 to a value that is interpolated among the decision levels of the other seven deciders 13 (in step ST21). When the decision level of the sweeping decider 21 is so controlled that it is interpolated among the decision levels of the other seven deciders 13, according to a procedure similar to that without the sweeping decider 21 (see FIG. 11), the optical receiver can adjust the distribution of each of the frequencies with which electric received signals are decided as mark and space, respectively, by each of the other seven deciders to a desired one that can improve the error correction performance (in steps ST22 to ST25). The optical receiver of this embodiment 2 performs other operations in the same manner that that of embodiment 1 does.

In accordance with this embodiment 2, the probability density distribution estimation circuit 19 estimates a probability density distribution from each of the decision frequencies obtained from the decision results of both the seven deciders 13 and the sweeping decider 21. As an alternative, the probability density distribution estimation circuit 19 can estimate probability density distributions from part of the decision results from both the seven deciders 13 and the sweeping deciders 21 or from only the decision result of the sweeping decider 21 without using all the decision results.

In addition, in accordance with this embodiment 2, the decision result of the sweeping decider 21 is delivered, by way of the corresponding 1:16 demultiplexing circuit 16, directly to the probability density distribution estimation circuit 19. As an alternative, the decision result of the sweeping decider 21 can be delivered, by way of the corresponding 1:16 demultiplexing circuit 16 and a soft-decision FEC decoding circuit 18, to the probability density distribution estimation circuit 19.

As previously mentioned, in accordance with this embodiment 2, only one sweeping decider 21 is disposed in the optical receiver. As an alternative, a plurality of sweeping deciders 21 can be so disposed that the decision levels of the plurality of sweeping deciders 21 can be controlled by the threshold sweeping control circuit 22.

As mentioned above, in accordance with this embodiment 2, the provision of the sweeping decider 21 that can sweep its decision level in addition to the $2^n-1$ deciders makes it possible to estimate probability density distributions with a higher degree of accuracy and to control the decision level of each decider 13 with a high degree of accuracy. Even in this embodiment 2, the optical receiver can encode the decision results obtained by the $2^n-1$ deciders into an n-bit code.

Embodiment 3

Figure 14:
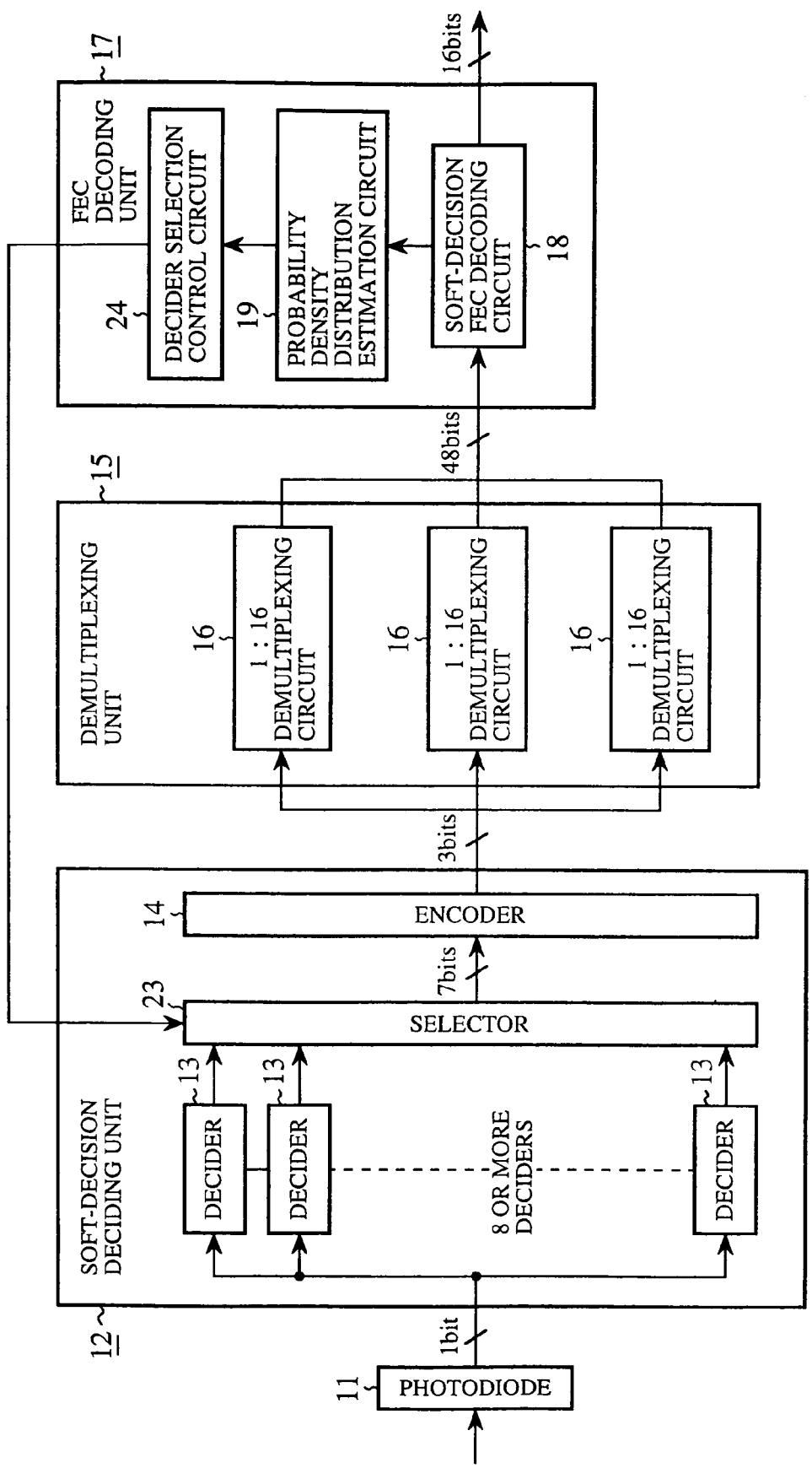
FIG. 14 is a block diagram showing an optical receiver according to embodiment 3 of the present invention in detail.

FIG. 14 is a block diagram showing the structure of an optical receiver according to embodiment 3 of the present invention in detail. The optical receiver 1 is so constructed as to select seven deciders 13 from among eight or more deciders 13 and to deliver a 7-bit decision signal.

The optical receiver of this embodiment 3 as shown in the figure differs from the optical receiver 1 of embodiment 1 shown in FIG. 4 in that the optical receiver has the eight or more deciders 13, a selector 23 for selecting seven deciders 13 from among the eight or more deciders 13, and a decider selection control circuit 24 instead of the threshold control circuit 20.

The eight or more deciders 13 deliver their decision results to the selector 23, so that the selector 23 can select the decision results obtained by seven of the eight or more deciders 13 that are necessary for 3-bit encoding and deliver the selected decision results to an encoder 14. A probability density distribution estimation circuit 19 estimates probability density distributions from the decision frequencies from each decider 13, like that of embodiment 1, and the decider selection control circuit 24 determines which seven of the eight or more deciders 13 should be selected based on the probability density distribution from the probability density distribution estimation circuit 19. The optical receiver of this embodiment 3 performs other operations in the same manner that that of embodiment 1 does.

In this embodiment 3, an example of the 3-bit encoding is shown. As an alternative, by selecting $2^n-1$ deciders 13 from $2^n$ or more deciders 13, the encoder can encode the $2^n-1$ decision results obtained by the selected $2^n-1$ deciders 13 into an n-bit code.

As previously mentioned, in accordance with this embodiment 3, the probability density distribution estimation circuit 19 estimates probability density distributions from the selected seven deciders 13. As an alternative, the probability density distribution estimation circuit 19 can estimate probability density distributions without using all the selected seven deciders 13.

As mentioned above, in accordance with this embodiment 3, the optical receiver is provided with a larger number of deciders than necessary for encoding. Therefore, the optical receiver of this embodiment 3 can easily acquire distributions of decision results of deciders with a high degree of accuracy without finely controlling their respective decision levels.

Embodiment 4

Figure 15:
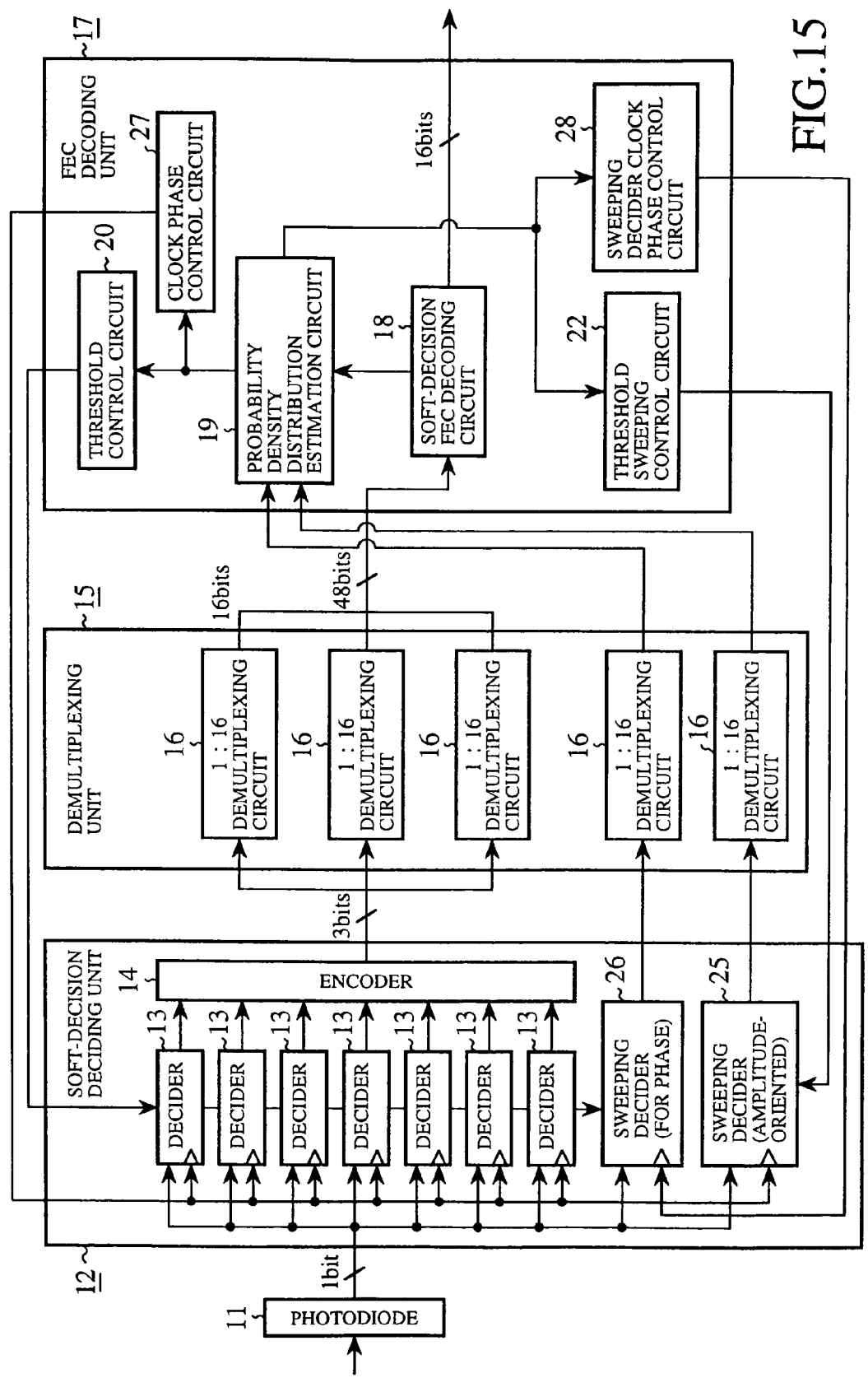
FIG. 15 is a block diagram showing an optical receiver according to embodiment 4 of the present invention in detail.

FIG. 15 is a block diagram showing the structure of an optical receiver according to embodiment 4 of the present invention in detail. In addition to the structure of the optical receiver 1 of embodiment 2 as shown in FIG. 12, the optical receiver of this embodiment includes a sweeping decider 25 (i.e., an amplitude-oriented decider) that can sweep its decision level, in addition to $2^n-1$ deciders 13, another sweeping decider 26 (i.e., a phase decider) that can sweep its decision phase, two 1:16 demultiplexing circuits 16 (i.e., a demultiplexing circuit) for converting decision results from the sweeping deciders 25 and 26 into parallel signals, respectively, a clock phase control circuit 27 for controlling the decision phases of the $2^n-1$ deciders 13 and the sweeping decider 25 (i.e., the amplitude-oriented decider), and a sweeping decider clock phase control circuit 28 for controlling the decision phase of the sweeping decider 26 (i.e., the phase decider).

Next, a description will be made as to an operation of the optical receiver according to embodiment 4.

In FIG. 15, the optical receiver is provided with seven deciders 13 to acquire a 3-bit decision signal. A photodiode 11 converts an optical received signal applied thereto into an electric received signal, and delivers it to a soft-decision deciding unit 12.

The soft-decision deciding unit 12 is provided with the seven deciders 13 having different decision levels, the sweeping decider 25 that can sweep its decision level, the other sweeping decider 26 that can sweep its decision phase, and an encoder 14 for encoding decision results from the seven deciders 13, decides the level of an input electric signal as mark or space, encodes the decision results obtained by the seven deciders 13 by using the encoder 14, and delivers a coded result to a demultiplexing unit 15. The decision result from the sweeping decider 25 intended for sweeping of decision level and the decision result from the other sweeping decider 26 intended for sweeping of decision phase are also delivered to the demultiplexing unit 15.

The demultiplexing unit 15 is provided with a plurality of 1:16 demultiplexing circuits 16 for serial-to-parallel converting the decision results from the soft-deciding unit 12 on a bit-by-bit basis, and delivers an obtained parallel signal to an FEC decoding unit 17.

The FEC decoding unit 17 is provided with a soft-decision FEC decoding circuit 18, a probability density distribution estimation circuit 19, a threshold control circuit 20, a threshold sweeping control circuit 22, the clock phase control circuit 27, and the sweeping decider clock phase control circuit 28. The parallel signal obtained by the encoder 14 is input to the soft-decision FEC decoding circuit 18 and the probability density distribution estimation circuit 19. A parallel signal from the sweeping decider 25 intended for sweeping of decision level and a parallel signal from the other sweeping decider 26 intended for sweeping of decision phase are input to the probability density distribution estimation circuit 19. The soft-decision FEC decoding circuit 18 then delivers the error-corrected parallel signal to the probability density distribution estimation circuit 19. The probability density distribution estimation circuit 19 estimates probability density distributions from the decision result obtained by each decider, and delivers the estimated probability density distribution to the threshold control circuit 20 and the threshold sweeping control circuit 22. The probability density distribution estimation circuit 19 further delivers decision frequencies respectively obtained according to phases to the clock phase control circuit 27 and the sweeping decider clock phase control circuit 28. The threshold control circuit 20 and the threshold sweeping control circuit 22 calculate thresholds based on the estimated probability density distribution and deliver their respective control signals to the soft-decision deciding unit 12. The clock phase control circuit 27 and the sweeping decider clock phase control circuit 28 adjust their respective clocks based on the decision frequencies respectively obtained according to phases so that they have optimum phases.

Figure 16:
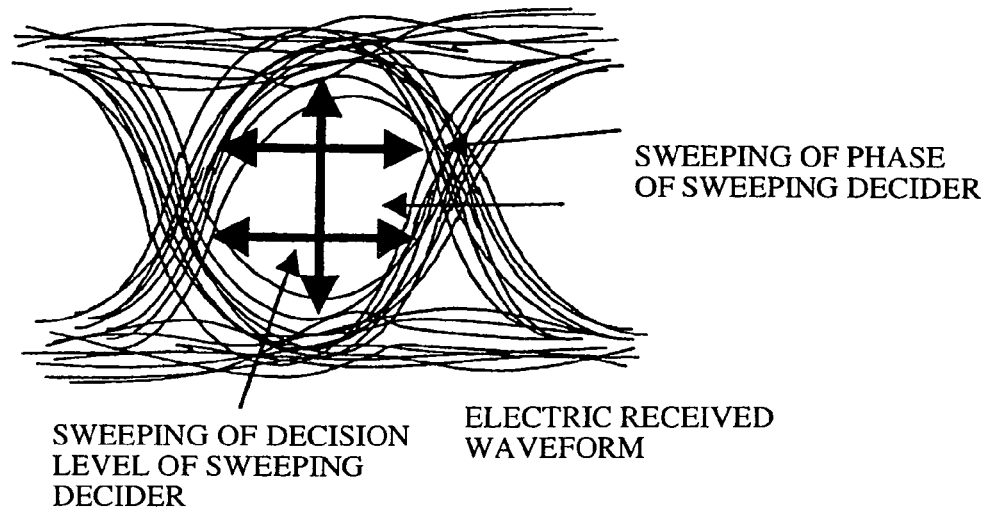
FIG. 16 is an explanatory drawing showing a technique for searching for an optimum decision phase and an optimum decision level.
Figure 17:
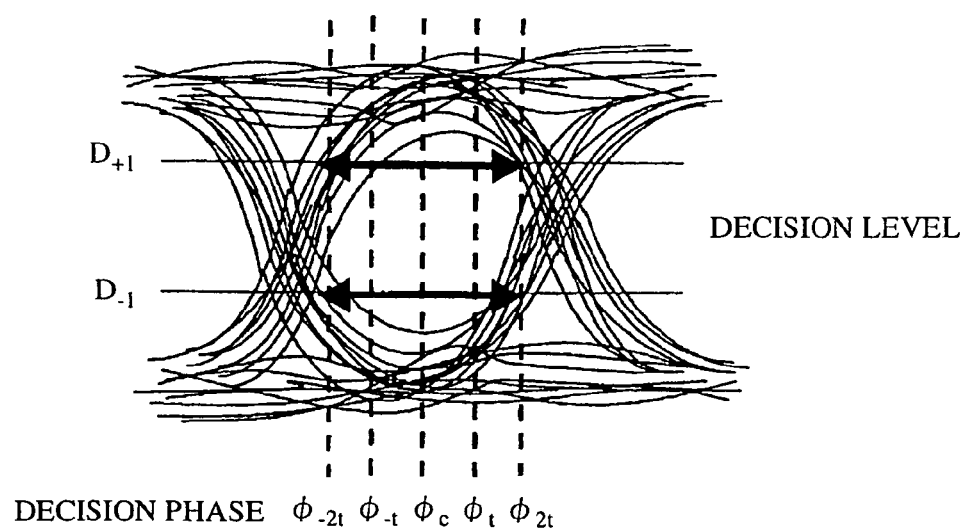
FIG. 17 is an explanatory drawing showing a technique for searching for an optimum decision phase.
Figure 18:
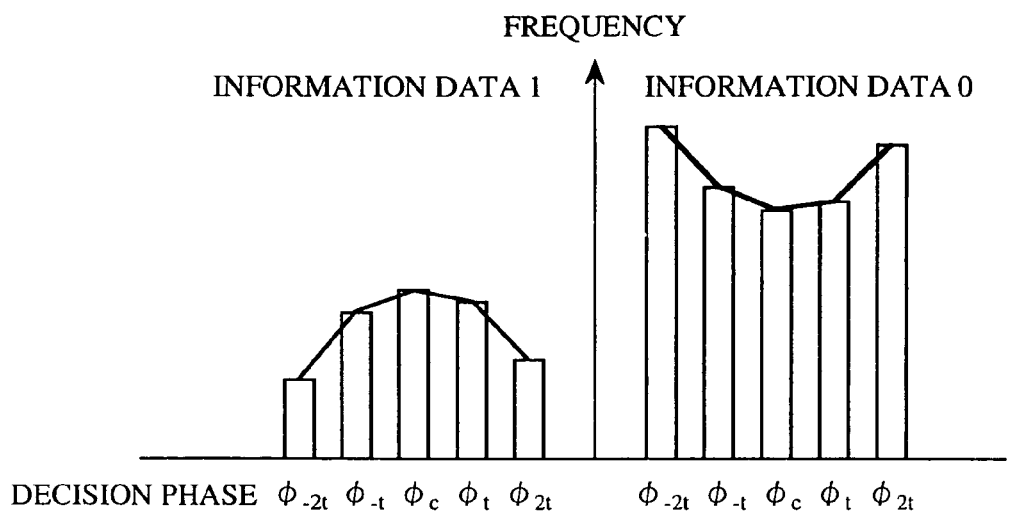
FIG. 18 is a plot showing the decision frequencies with which electric received signals are decided as mark and space, respectively, according to a decision level $D_{+1}$.
Figure 19:
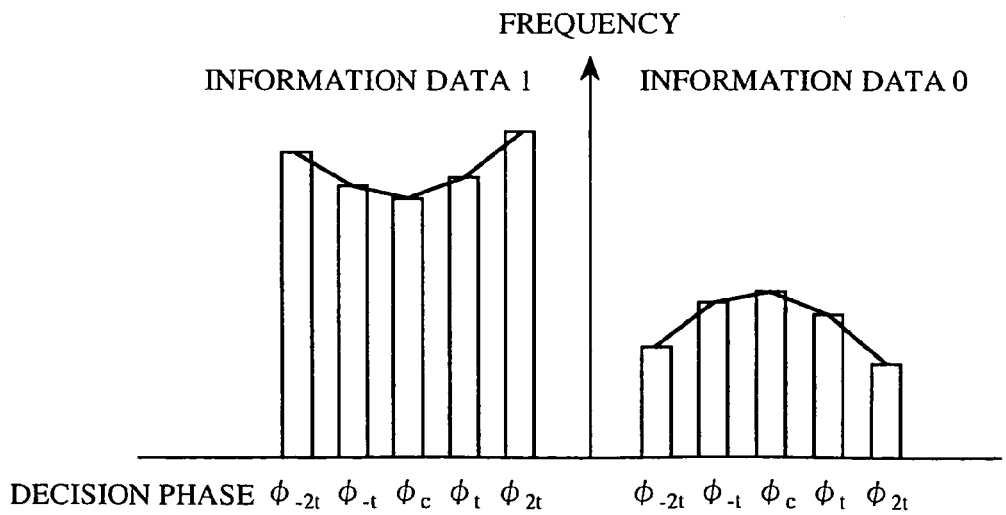
FIG. 19 is a plot showing the decision frequencies with which electric received signals are decided as mark and space, respectively, according to a decision level $D_{-1}$.

FIG. 16 is an explanatory drawing showing a technique for searching for a decision phase and a decision level, FIG. 17 is an explanatory drawing showing a technique for searching for a decision phase, FIG. 18 is a plot showing the decision frequencies with which electric received signals are decided as mark and space, respectively, according to a decision level $D_{+1}$, and FIG. 19 is a plot showing the decision frequencies with which electric received signals are decided as mark and space, respectively, according to a decision level $D_{-1}$.

FIG. 16 shows that in order to adjust the decision level and decision phase of each decider 13, the optical receiver searches for an optimum decision phase with respect to electric received waveforms by using the sweeping decider 26 that can sweep its decision phase, and searches for an optimum decision level with respect to electric received waveforms by using the sweeping decider 25 that can sweep its decision level. Next, a phase adjustment procedure will be explained.

FIG. 17 shows the phase searching method. First of all, the time duration corresponding to 1 bit is divided into some portions. For example, the time duration is divided into four portions separated by the following five phase points: $\phi_{-2t}$ to $\phi_{2t}$. The optical receiver then fixes the decision level of the sweeping decider 26 that can sweep its decision phase to $D_{+1}$, and calculates the decision frequencies with which the levels of electric received signals are decided as 0 and 1 at each of the five phase points based on decision results obtained by the sweeping decider 26 that can sweep its decision phase. Hereafter, assume that the decision frequencies for 0 and 1 are as shown in FIG. 18. An envelope of the decision frequencies for the information data 1 has a convex-up shape, and an envelope of the decision frequencies for the information data 0 has a convex-down shape.

The optical receiver then fixes the decision level of the sweeping decider 26 that can sweep its decision phase to $D_{-1}$, and calculates the decision frequencies with which the levels of electric received signals are decided as 0 and 1 at each of the five phase points based on decision results obtained by the sweeping decider 26. Hereafter, assume that the decision frequencies for 0 and 1 are as shown in FIG. 19. Because the decision level is set to be lower than that in the above case, an envelope of the decision frequencies for the information data 1 has a convex-down shape, and an envelope of the decision frequencies for the information data 0 has a convex-up shape.

Because if information data 0 and 1 are transmitted to the optical receiver at the same probability of ½, respectively, as the decision level approaches its middle value, the decision frequencies for 0 and 1 becomes equal to each other, a phase that provides a minimum or maximum of each of the convex distributions for 0 and 1 can be assumed to be an optimum decision phase. In this case, the middle decision phase $\phi_c$ that provides a minimum or maximum of each of the convex distributions for 0 and 1 obtained according to each of the decision levels $D_{+1}$ and $D_{-1}$ can be defined as an optimum decision phase.

After the optimum decision phase is determined by the sweeping decider 26 that can sweep its decision phase, the optical receiver sets the decision phases of each decider 13 and the sweeping decider 25 that can sweep its decision level to the optimum decision phase.

Figure 20:
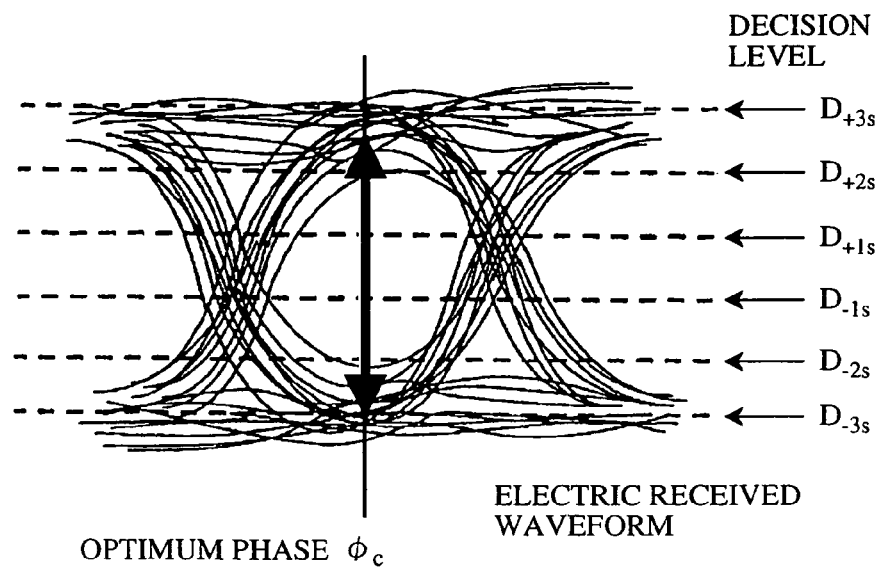
FIG. 20 is an explanatory drawing showing a technique for searching for an optimum decision level.
Figure 21:
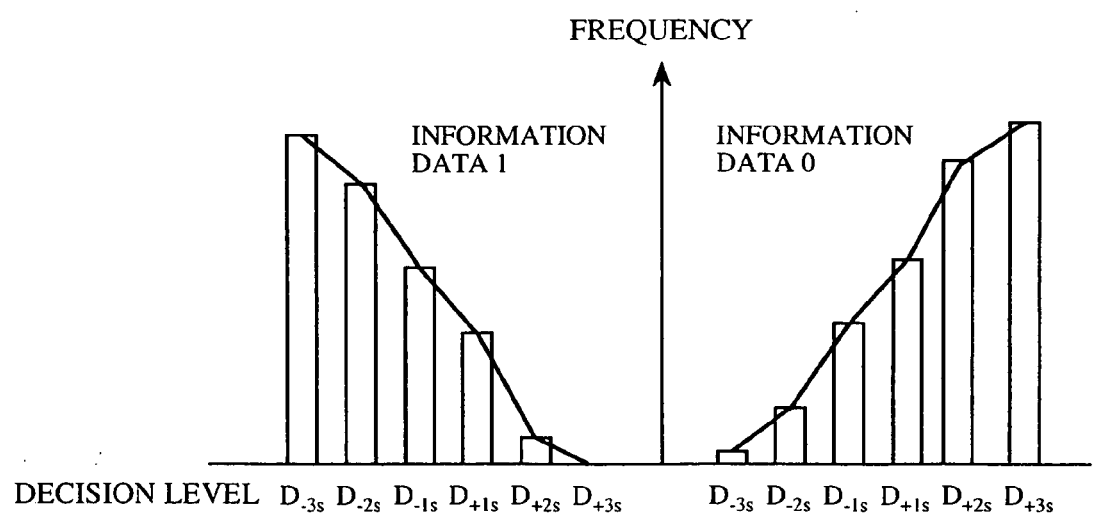
FIG. 21 is a plot showing the decision frequencies with which electric received signals are decided as mark and space, respectively, according to each decision level.

FIG. 20 is an explanatory drawing showing a technique for searching for an optimum decision level, and FIG. 21 is a plot showing the decision frequencies with which electric received signals are decided as mark and space, respectively, according to each of the plurality of decision levels.

FIG. 20 shows decision levels each of which can be set to the sweeping decider 25 that can sweep its decision level in order to search for the optimum decision level at the optimum decision phase. The sweeping decider 25 that can sweep its decision level sets its decision level to a value that is interpolated among the decision levels of the plurality of deciders 13 and acquires the decision frequencies with which electric received signals are decided as mark and space, respectively, according to the set decision level. In this case, the sweeping decider 25 sequentially sets its decision level to each of six values $D_{+3s}$ to $D_{-3s}$. FIG. 21 shows the decision frequencies with which electric received signals are decided as mark and space, respectively, according to each of the six decision levels. Because there are provided the decision frequencies, not shown in the figure, with which electric received signals are decided as mark and space, respectively, according to each of the plurality of decision levels of the $2^n-1$ deciders 13, the probability density distribution estimation circuit 19 can acquire very accurate distributions of the decision frequencies with which electric received signals are decided as mark and space, respectively, and can estimate the probability density distribution with a high degree of accuracy.

The optical receiver can find out the probability density distribution at the optimum decision phase by using the plurality of deciders 13 and the sweeping decider 25 that can sweep its decision level. The decision level of each of the plurality of deciders 13 is adjusted to an optimum one based on the probability density distribution.

In accordance with this embodiment 4, the decision level of the sweeping decider 26 that can sweep its decision phase is successively varied through two values when searching for the optimum phase. As an alternative, the decision level of the sweeping decider 26 can be successively varied through three or more values. In this case, the optimum phase can be searched for with a higher degree of accuracy. Thus the optical receiver can prevent each decider 13 from misdeciding the level of the electric received signal through this optimum phase searching, and can therefore carry out the soft-decision deciding process with a higher degree of accuracy.

As mentioned above, in accordance with this embodiment 4, the optical receiver further includes the sweeping decider 26 that can sweep its decision phase. Therefore, the optical receiver can find out an optimum decision phase. Furthermore, because the optical receiver includes the sweeping decider 25 that can sweep its decision level, the optical receiver can estimate probability density distributions by using the optimum decision phase with a higher degree of accuracy and can control the decision level of each decider 13 with a high degree of accuracy.

Embodiment 5

Figure 22:
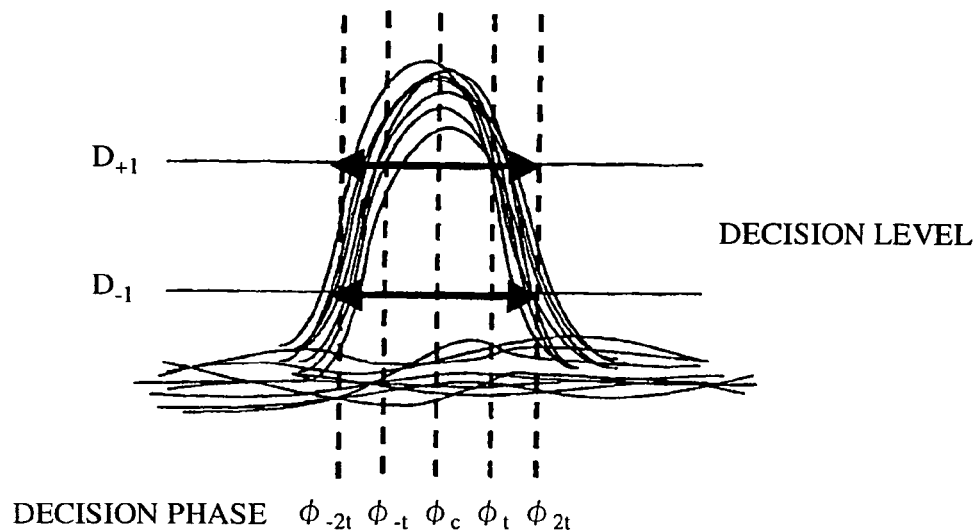
FIG. 22 is an explanatory drawing showing a signal format according to embodiment 5 of the present invention.
Figure 23:
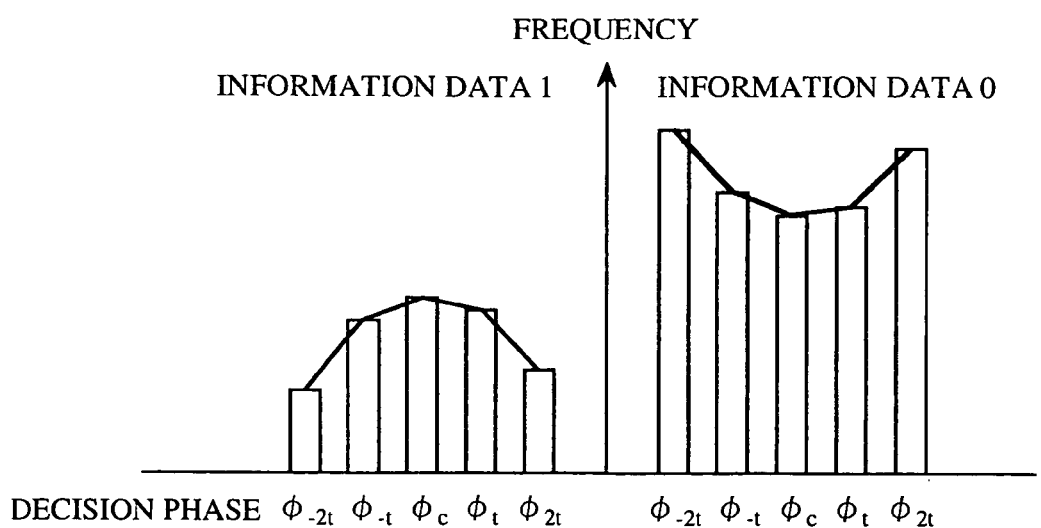
FIG. 23 is a plot showing the decision frequencies with which electric received signals are decided as mark and space, respectively, according to a decision level $D_{+1}$.
Figure 24:
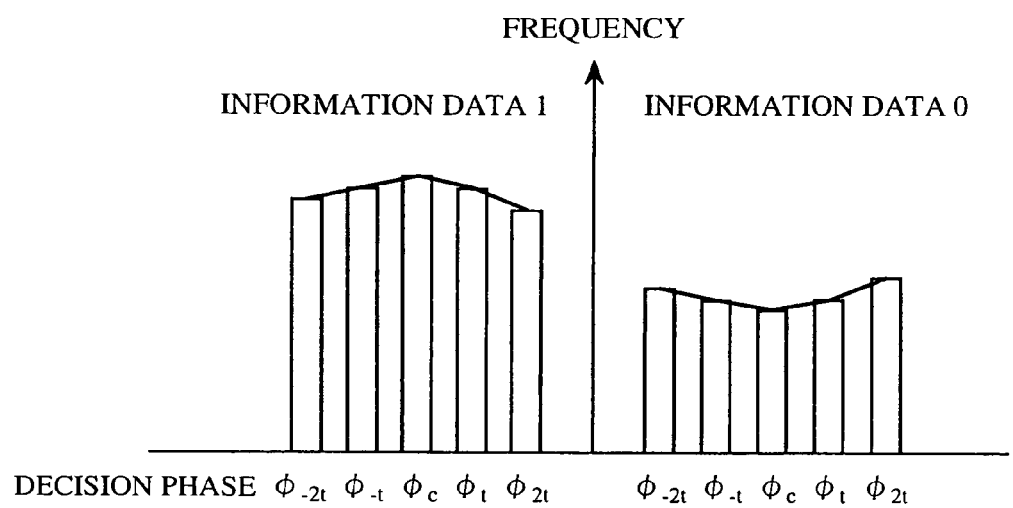
FIG. 24 is a plot showing the decision frequencies with which electric received signals are decided as mark and space, respectively, according to a decision level $D_{-1}$.

FIG. 22 is an explanatory drawing showing a signal format according to embodiment 5 of the present invention, FIG. 23 is a plot showing the decision frequencies with which electric received signals are decided as mark and space, respectively, according to a decision level $D_{+1}$, and FIG. 24 is a plot showing the decision frequencies with which electric received signals are decided as mark and space, respectively, according to a decision level $D_{-1}$.

In above-mentioned embodiment 4, the signal format is a NRZ (Non Return to Zero) format. As an alternative, the signal format can be a RZ (Return to Zero) format as shown in FIG. 22.

An optical receiver according to embodiment 5 of the present invention can vary the decision level of a sweeping decider 26 that can sweep its decision phase through two or more values and obtain the decision frequencies with which electric received signals are decided as mark and space, respectively, at each decision phase, like that of above-mentioned embodiment 4. For example, in a case where the decision level of the sweeping decider 26 that can sweep its decision phase is varied through two values, the decision frequencies for information data 0 and 1 as shown in FIGS. 23 and 24 are obtained. Because the signal format is a RZ format, the higher decision level the sharper plot the distribution of the decision frequencies has, and the lower decision level the flatter plot the distribution of the decision frequencies has. A phase that provides a minimum or maximum of each of the convex distributions for information data 0 and 1 can be defined as an optimum decision phase.

As mentioned above, in accordance with this embodiment 5, the optical receiver can determine an optimum decision phase even when the signal format is a RZ format.

Embodiment 6

Figure 25:
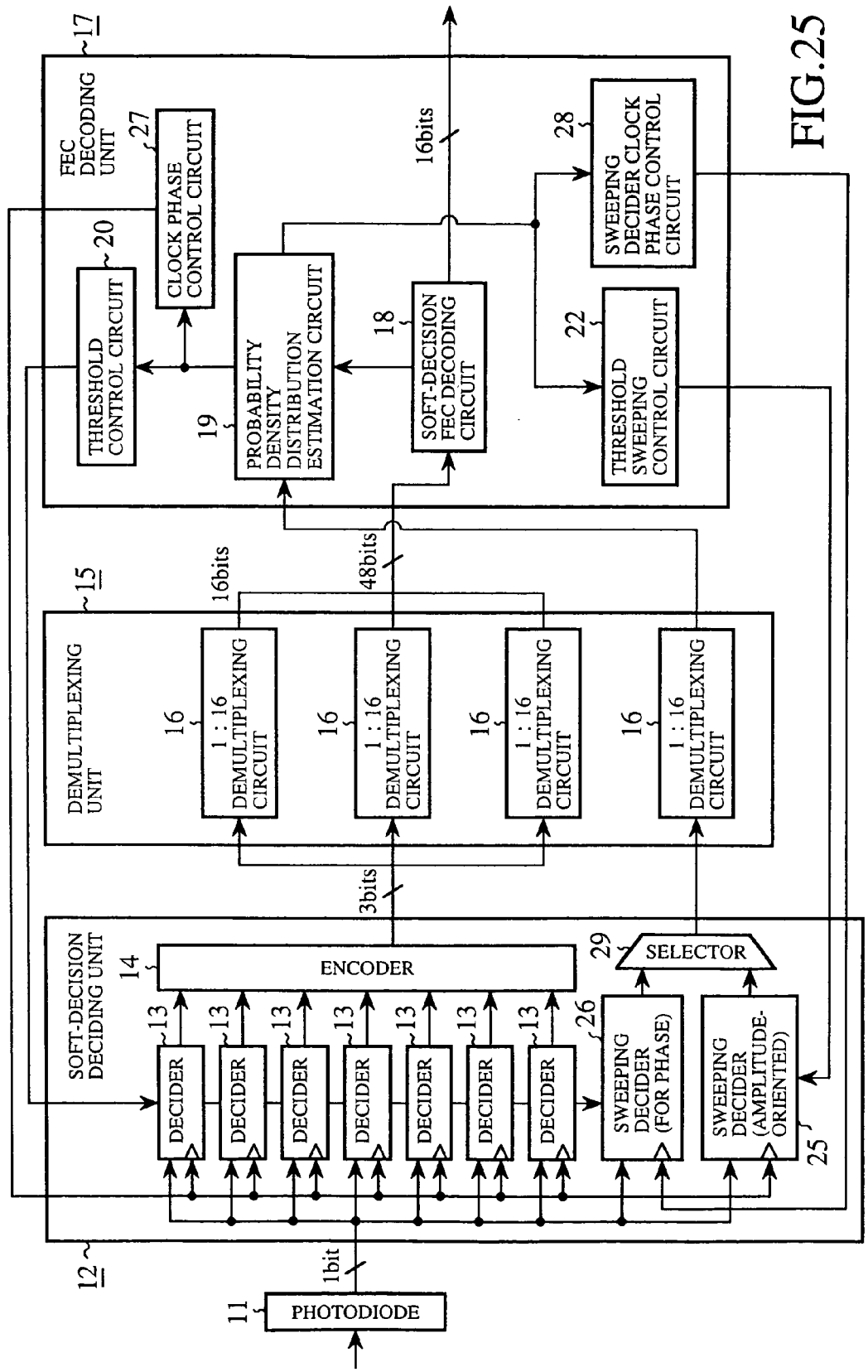
FIG. 25 is a block diagram showing an optical receiver according to embodiment 6 of the present invention in detail.

FIG. 25 is a block diagram showing the structure of an optical receiver according to embodiment 6 of the present invention in detail. The optical receiver according to embodiment 6 further includes a selector 29 in addition to the structure of the optical receiver 1 of embodiment 4 as shown in FIG. 15.

Next, a description will be made as to an operation of the optical receiver according to embodiment 6 of the present invention.

As shown in FIG. 25, in the optical receiver according to embodiment 6 of the present invention, the selector 29 accepts outputs of a sweeping decider 25 that can sweep its decision level and a sweeping decider 26 that can sweep its decision phase of the optical receiver 1, which are previously explained in Embodiment 4. When searching for an optimum decision phase, the optical receiver does not use the sweeping decider 25 intended for sweeping of decision level, whereas when searching for an optimum decision level, the optical receiver does not use the sweeping decider 26 intended for sweeping of decision phase. The selector 29 therefore selects only either one of search results output from the sweeping deciders 25 and 26. The selector then sends its output to one 1:16 demultiplexing circuits 16. Therefore, because the number of 1:16 demultiplexing circuits 16 included in the optical receiver can be reduced by the use of the selector 29 and hence the number of serial-to-parallel conversions can be reduced, the circuit configuration of the optical receiver can be simplified.

As mentioned above, in accordance with this embodiment 6, the optical receiver can decrease the number of 1:16 demultiplexing circuits 16 included therein by using the selector 29. Therefore, the circuit configuration of the optical receiver can be simplified.

Embodiment 7

Figure 26:
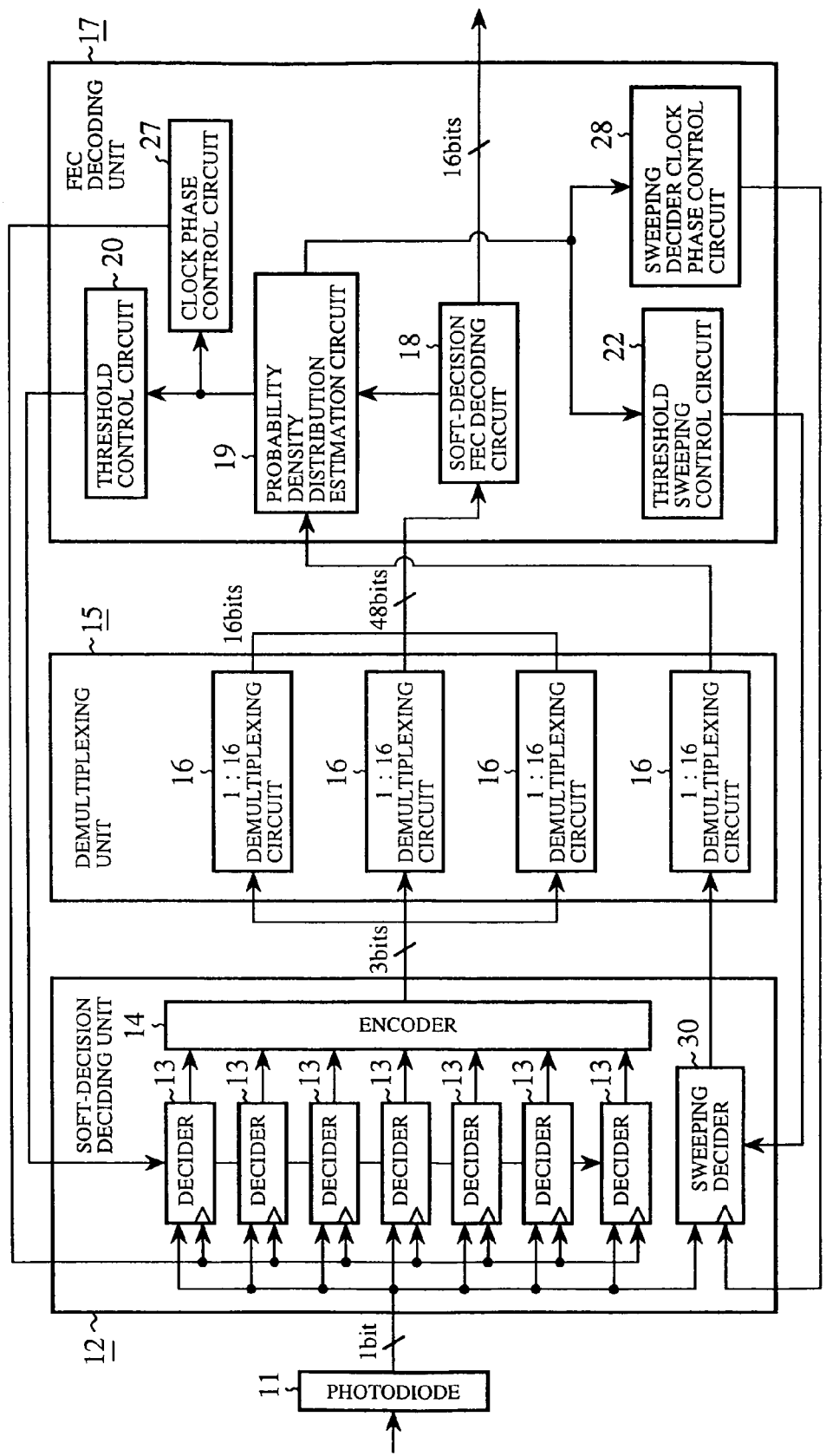
FIG. 26 is a block diagram showing an optical receiver according to embodiment 7 of the present invention in detail.

FIG. 26 is a block diagram showing the structure of an optical receiver according to embodiment 7 of the present invention in detail. In addition to the structure of the optical receiver 1 of embodiment 4 as shown in FIG. 15, the optical receiver of this embodiment 7 further includes a sweeping decider 30 (i.e., a decider) that can sweep its decision level and its decision phase in addition to $2^n-1$ deciders 13.

Next, a description will be made as to an operation of the optical receiver according to embodiment 7 of the present invention.

As shown in FIG. 26, the optical receiver is provided with seven deciders 13 in order to acquire a 3-bit decision signal. A photodiode 11 converts an optical received signal applied thereto into an electric received signal, and delivers it to a soft-decision deciding unit 12.

The soft-decision deciding unit 12 is provided with the seven deciders 13 having different decision levels, the sweeping deciders 30 that can sweep its decision level and its decision phase, and an encoder 14 for encoding decision results obtained by the seven deciders 13. The soft-decision deciding unit 12 decides the level of the electric received signal as mark or space, encodes the decision results obtained by the seven deciders 13 by using the encoder 14, and delivers an encoded result obtained by the encoder 14 to a demultiplexing unit 15. A decision result obtained by the sweeping decider 30 that can sweep its decision level and its decision phase is also delivered to the demultiplexing unit 15.

The demultiplexing unit 15 is provided with a plurality of 1:16 demultiplexing circuits 16 that serial-to-parallel convert the encoded result on a bit-by-bit basis into a parallel signal, and delivers the obtained parallel signal to an FEC decoding unit 17.

The FEC decoding unit 17 is provided with a soft-decision FEC decoding circuit 18, a probability density distribution estimation circuit 19, a threshold control circuit 20, a threshold sweeping control circuit 22, a clock phase control circuit 27, and a sweeping decider clock phase control circuit 28. A parallel signal obtained by the encoder 14 is input to the soft-decision FEC decoding circuit 18 and the probability density distribution estimation circuit 19. A parallel signal from the sweeping decider 30 intended for sweeping of decision level and decision phase is input to the probability density distribution estimation circuit 19. An error-corrected parallel signal is output by the soft-decision FEC decoding circuit 18. The probability density distribution estimation circuit 19 estimates a distribution from the decision result obtained by each decider 13, and sends the estimated distribution to the threshold control circuit 20 and the threshold sweeping control circuit 22. Probability density distributions associated with each phase are delivered to the clock phase control circuit 27 and the sweeping decider clock phase control circuit 28. The clock phase control circuit 27 and the sweeping decider clock phase control circuit 28 adjust the decision phases of each decider 13 and the sweeping decider 30 intended for sweeping of decision level and decision phase based on the probability density distribution associated with each phase to respective optimum clock phases. The threshold control circuit 20 and the threshold sweeping control circuit 22 calculate thresholds based on the estimated distribution at the optimum clock phases and deliver respective control signals to the soft-decision deciding unit 12.

Figure 27:
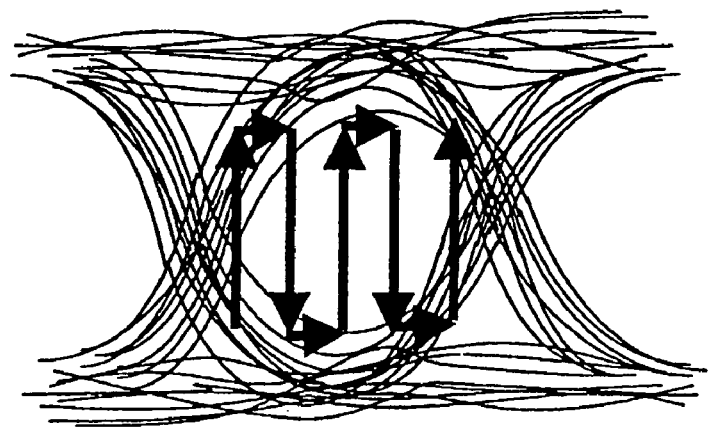
FIG. 27 is an explanatory drawing showing a technique for searching for an optimum decision phase and an optimum decision level.
Figure 28:
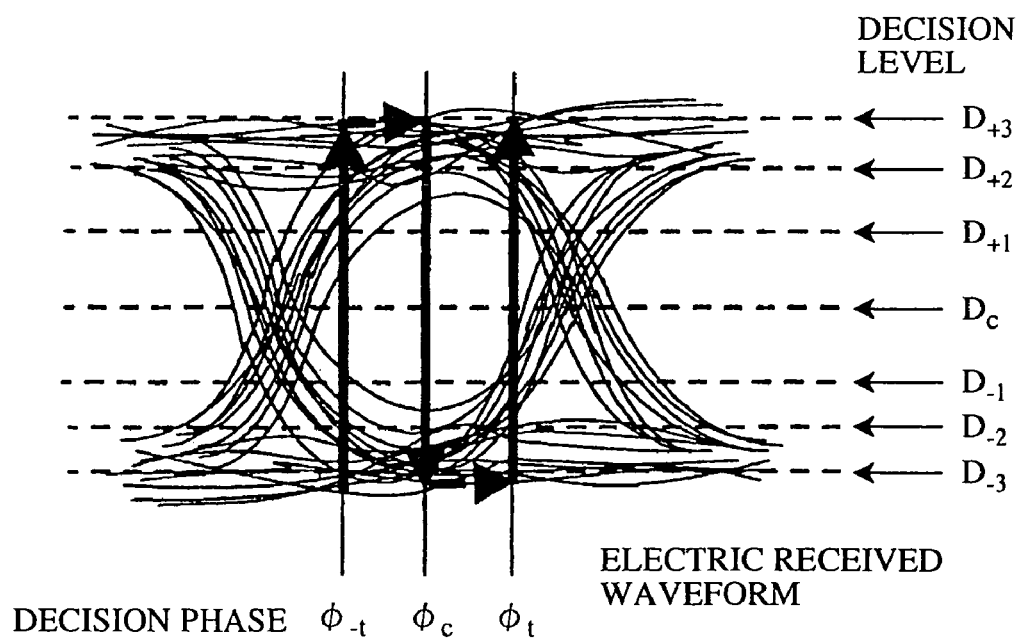
FIG. 28 is an explanatory drawing showing a technique for searching for an optimum decision phase.

FIG. 27 is an explanatory drawing showing a technique for searching for an optimum decision phase and an optimum decision level, FIG. 28 is an explanatory drawing showing a technique for searching for an optimum decision phase, and FIG. 29 is a plot showing the decision frequencies with which electric received signals are decided as mark and space, respectively, at each decision phase.

FIG. 27 shows that in order to adjust the decision level and decision phase of each decider 13, the optical receiver can search for an optimum decision phase for the plurality of deciders 13 from the decision frequencies obtained at a certain phase that is varied through a range corresponding to a time width of 1 bit by alternately sweeping the decision level and decision phase of the sweeping decider 30 that can sweep its decision level and its decision phase with respect to electric received waveforms. Next, the procedure for searching for the optimum decision phase will be explained.

FIG. 28 shows the optimum phase searching method. First of all, the time width of 1-bit is divided into some portions. For simplicity, a case where the time width of 1-bit is divided into two portions by three phase values will be explained. Then the decision levels according to which the decision frequencies for information data 1 and 0 are obtained are determined for each of the three phase values. In this case, the decision frequencies with which the levels of electric received signals are decided as 0 and 1 according to each of the seven decision levels $D_{+3}$ to $D_{-3}$ are obtained for each of the three phase values. The optical receiver acquires the decision frequencies while adjusting the decision level and decision phase of the sweeping decider 30 that can sweep its decision level and its decision phase by using the threshold sweeping control circuit 22 and the sweeping decider clock phase control circuit 28. When the decision frequencies according to each decision level are obtained for each phase value, a distribution of the decision frequencies at each decision phase as shown in FIG. 29, that is, probability density distributions are acquired. When information data 0 and 1 are transmitted with the same probability, because both edge portions of the time width of 1-bit correspond to rising and falling edges of electric received waveforms, respectively, the frequency with which the levels of electric received signals are decided as 0 according to a higher decision level increases extremely, whereas the frequency with which the levels of electric received signals are decided as 1 according to a lower decision level increases extremely. As a result, because the optical receiver makes it possible to determine the positions of both ends of the time width of 1 bit, the middle between them can be defined as the optimum decision phase and the decision phase of each decider 13 is set to the optimum decision phase. The optical receiver then estimates probability density distributions from the decision frequencies at the optimum decision phase, and adjusts the decision level of each decider 13 from this estimated probability density distribution. An example of determining the decision frequencies for three phase values is shown above. The accuracy of determining the optimum decision phase can be improved by acquiring the decision frequencies for four or more phase values.

As mentioned above, in accordance with this embodiment 7, the optical receiver can determine an optimum decision phase for the plurality of decoders 13 by simply using one sweeping decider 30 that can sweep its decision level and its decision phase. Therefore, the circuit configuration of the optical receiver can be simplified.

Embodiment 8

Figure 30:
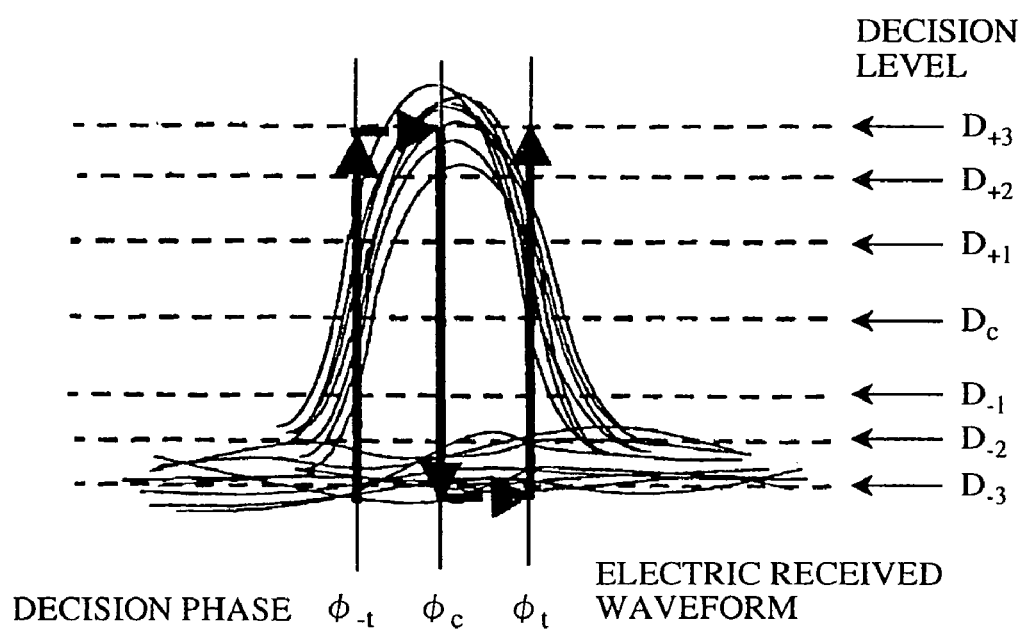
FIG. 30 is an explanatory drawing showing a signal format according to embodiment 8 of the present invention.

FIG. 30 is an explanatory drawing showing a signal format according to embodiment 8 of the present invention, and FIG. 31 is a plot showing the decision frequencies with which electric received signals are decided as mark and space, respectively, at each decision phase.

In above-mentioned embodiment 7, the signal format is a NRZ (Non Return to Zero) format. As an alternative, the signal format can be a RZ (Return to Zero) format as shown in FIG. 30.

An optical receiver according to embodiment 8 of the present invention can vary the decision level of a sweeping decider 30 that can sweep its decision level and its decision phase through two or more values so as to obtain the decision frequencies with which electric received signals are decided as mark and space, respectively, at each decision phase, like that of above-mentioned embodiment 7. For example, in a case where the decision phase of the sweeping decider 30 is varied through three values, the decision frequencies for information data 0 and 1 as shown in FIG. 31 can be obtained. Because the signal format is a RZ one, both edge portions of the time width of 1-bit correspond to rising and falling edges of electric received waveforms, respectively. Therefore, the frequency with which the levels of electric received signals are decided as 0 according to a higher decision level increases, whereas the frequency with which the levels of electric received signals are decided as 1 according to a lower decision level increases. The distribution of the decision frequencies for 0 or 1 is inclined gradually at phases close to the middle of the time width of 1-bit. As a result, because the optical receiver makes it possible to determine the positions of both ends of the time width of 1 bit, like that of above-mentioned embodiment 7, the middle between them can be defined as the optimum decision phase and the decision phase of each decider 13 is set to the optimum decision phase. The optical receiver then estimates probability density distributions from the decision frequencies at the optimum decision phase, and adjusts the decision level of each decider 13 from this estimated probability density distribution. An example of determining the decision frequencies for three phase values is shown above. The accuracy of determining the optimum decision phase can be improved by acquiring the decision frequencies for four or more phase values.

As mentioned above, in accordance with this embodiment 8, the optical receiver can determine an optimum decision phase even when the signal format is a RZ format.

Embodiment 9

Figure 32:
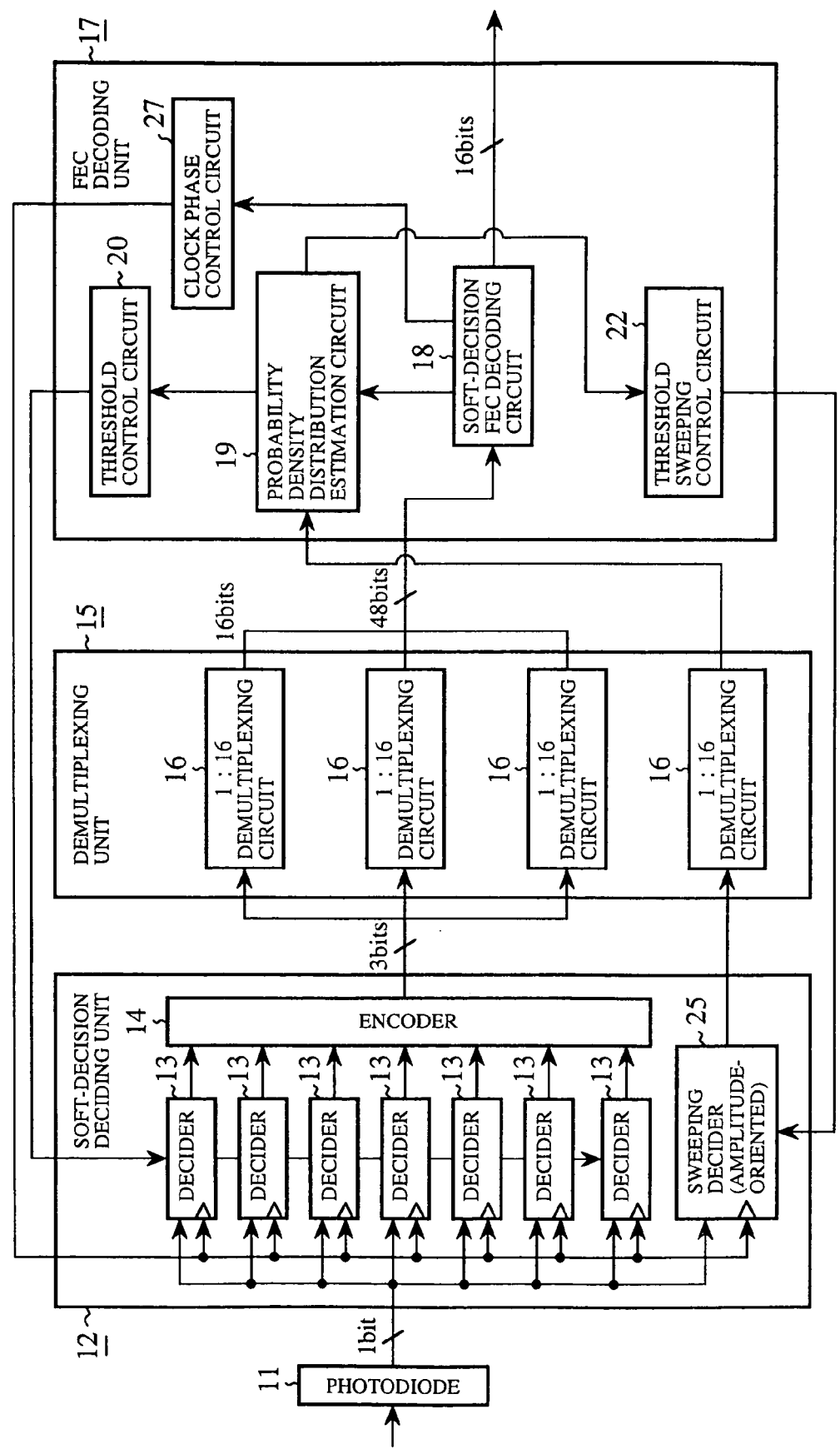
FIG. 32 is a block diagram showing an optical receiver according to embodiment 9 of the present invention in detail.

FIG. 32 is a block diagram showing the structure of an optical receiver according to embodiment 9 of the present invention in detail. The optical receiver of this embodiment 9 differs from the optical receiver 1 of embodiment 6 as shown in FIG. 25 in that the sweeping decider 26 that can sweep its decision phase is eliminated and the number of errors counted when a soft-decision FEC decoding circuit 18 carries out soft-decision error correction is delivered to a clock phase control circuit 27. In addition, the sweeping decider clock phase control circuit 28 is eliminated from the optical receiver of this embodiment 9.

Next, a description will be made as to an operation of optical receiver according to embodiment 9 of the present invention.

In FIG. 32, the optical receiver varies the decision phases of each decider 13 and a sweeping decider 25 that can sweep its decision level by using the clock phase control circuit 27. Therefore, the number of errors counted by the soft-decision FEC decoding circuit 18 changes, too. A phase that provides the smallest number of counted errors can be defined as an optimum decision phase. The clock phase control circuit 27 adjusts the decision phases of each decider 13 and the sweeping decider 25 to the optimum decision phase. The procedure for determining probability density distributions from the decision frequencies obtained at the optimum decision phase, and adjusting the decision level of each decider 13 is similar to that explained in any one of the above-mentioned embodiments.

As mentioned above, in accordance with this embodiment 9, the sweeping decider 26 that can sweep its decision phase and the sweeping decider clock phase control circuit 28 can be eliminated. Therefore, the circuit configuration of the optical receiver can be simplified.

Embodiment 10

FIG. 33 is a flow chart showing an n-bit encoding procedure of an encoder of an optical receiver according to embodiment 10 of the present invention, FIG. 34 is an explanatory drawing showing all decision result patterns, and FIG. 35 is an explanatory drawing showing encoded results obtained from all the decision result patterns.

A description will be made as to an operation of the encoder with reference to the procedure shown in FIG. 33.

When the optical receiver decides the level of an electric received signal by using $2^n-1$ deciders 13 (in step ST31), the optical receiver can acquire any one of eight possible decision result patterns when the number of deciders 13 is seven, as shown in FIG. 34. The encoder then encodes the acquired decision result pattern into a 3-bit code indicating this state.

When a decision result obtained according to a middle decision level is a mark, decision results acquired by all other deciders 13 with decision levels that are lower than the middle decision level are marks (in step ST32) and there are four possible decision result patterns obtained by the remaining deciders 13 having higher decision levels. The encoder converts the set of decision results of the remaining deciders 13 having higher decision levels into a 2-bit binary code having reliability information indicating any one of the four possible states including a state showing a close-to-mark mark in which all the decision results of the remaining deciders 13 having higher decision levels $D_{+1}$, $D_{+2}$ and $D_{+3}$ are marks, and a state showing a close-to-space mark in which all the decision results of the remaining deciders 13 having higher decision levels $D_{+1}$, $D_{+2}$ and $D_{+3}$ are spaces.

FIG. 35 shows such encoded results. The encoder allocates a first bit of the 3-bit code to the decision result that is obtained by deciding the level of the electric received signal as mark or space according to the middle decision level through hard decision, and allocates remaining 2 bits to the reliability information associated with the hard-decision result. For example, the two bits become 0, 0 when the decision results of the remaining deciders 13 having higher decision levels are spaces (the reliability of mark is low), whereas the two bits become 1, 1 when the decision results of the remaining deciders 13 having higher decision levels are marks (the reliability of mark is high). When the input electric received signal is decided as space according to the middle decision level, the encoder similarly allocates the first bit of the 3-bit code to the decision result that is obtained by deciding the electric received signal as mark or space according to the middle decision level through hard decision, and allocates the remaining two bits to the reliability information associated with the hard-decision result, and encodes the decision results obtained by the remaining deciders 13 having lower decision levels. As an alternative, the encoder can carry out n-bit encoding according to a similar procedure (in steps ST33 and ST34). The optical receiver of this embodiment 10 performs other operations in the same manner that that of either of embodiments 1 to 3 does.

As mentioned above, in accordance with this embodiment 10, when frame synchronization and descrambling processing not shown in the figure are provided for synchronization between a soft-decision deciding unit 12 and an FEC decoding unit 17, the optical receiver only has to process the first bit of the encoded result indicating the hard-decision result (i.e., the decision result obtained by a middle decider having the middle decision level $D_C$) by using the above-mentioned encoding method. Therefore, the circuit configuration of the optical receiver can be simplified.

Embodiment 11

Figure 36:
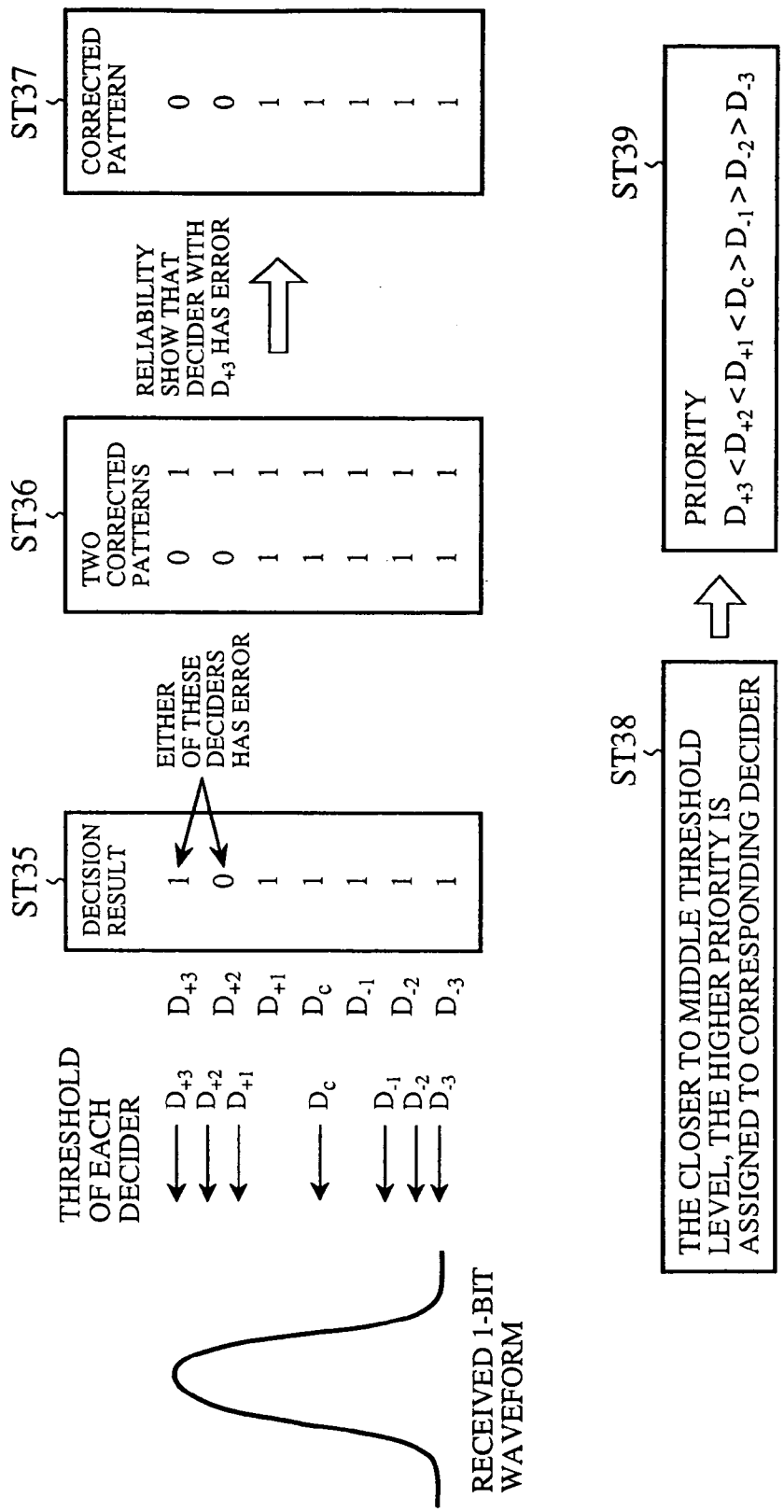
FIG. 36 is an explanatory drawing showing a technique for correcting decision errors in an encoder according to embodiment 11 of the present invention.

FIG. 36 is an explanatory drawing showing a technique for correcting decision errors in an encoder according to embodiment 11 of the present invention.

An optical receiver in accordance with this embodiment 11 makes it possible for the encoder 14 to carry out encoding even if errors occur in decision results obtained by a plurality of deciders 13. When the decision levels of the seven deciders 13 are set as shown in FIG. 36 and decision results as shown in FIG. 36 are obtained (in step ST35), it can be assumed that those decision results are impossible ones and an error is included in the decision result obtained by either one of the seven deciders 13. In this case, it can be assumed from the decision result pattern that an error occurs in one decider 13 having a decision level $D_{+3}$ or $D_{+2}$. Therefore, two possible corrected decision result patterns are provided (in step ST36). For example, according to priority information indicating that "the closer to a middle decision level $D_c$ the lower probability of occurrence of errors, and a higher priority is therefore given to a decision result obtained according to a decision level close to the middle decision level" (in steps ST37 and ST38), it is determined that in the above-mentioned case of FIG. 36 an error has occurred in the decision result according to the decision level $D_{+3}$. This decision result is corrected, and one corrected decision result pattern as shown in the figure is acquired (in step ST39). The optical receiver of this embodiment performs other operations in the same manner that that according to any one of embodiments 1 to 3 does.

As mentioned above, in accordance with this embodiment 11, even if an error occurs in a decision result obtained by a decider 13, the optical receiver can correct the error according to certain priority information, thereby preventing the occurrence of a decision result pattern which the encoder 14 cannot encode.

Embodiment 12

Figures 37, 38:
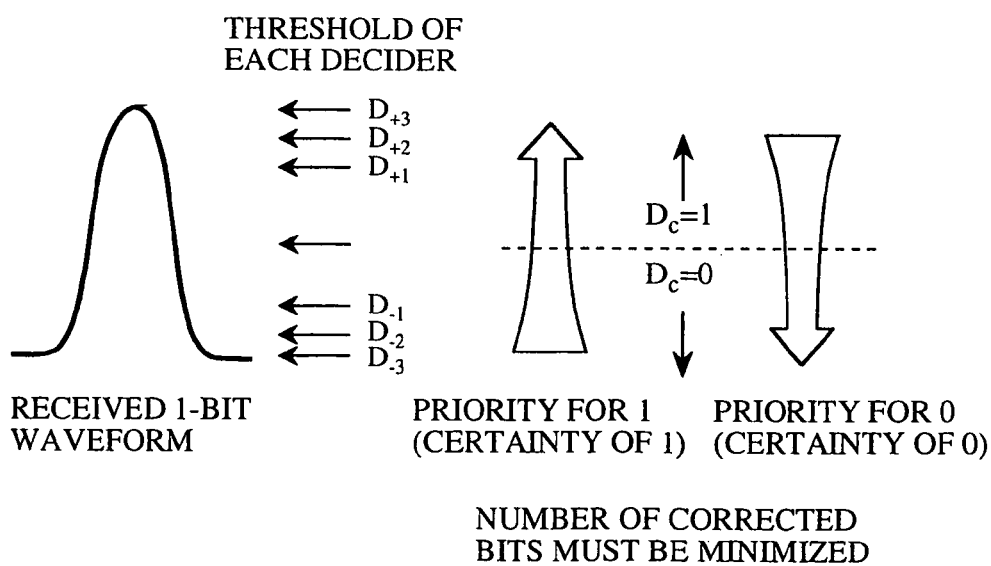
FIG. 37 is an explanatory drawing showing normal decision results obtained when deciders according to embodiment 12 of the present invention work without making an error.
FIG. 38 is an explanatory drawing showing an example of an encoding method capable of encoding decision results regardless of decision errors caused by the deciders.

FIG. 37 is an explanatory drawing showing normal decision results obtained when deciders of an optical receiver according to embodiment 12 of the present invention work without making an error, and corresponds to a combination of FIGS. 34 and 35 explained in above-mentioned embodiment 10. FIG. 38 is an explanatory drawing showing an example of an encoding method capable of encoding decision results regardless of decision errors caused in the deciders, and FIG. 39 is an explanatory drawing showing encoded patterns based on priority information.

As shown in FIG. 34, if each decider operates without making an error, the optical receiver can encode electric received signals by using the encoding method as shown in above-mentioned embodiment 10. In contrast, if a decider makes an error, the optical receiver cannot encode electric received signals. Decision errors are caused by an insufficient adjustment of the difference among the plurality of deciders included in the optical receiver. FIG. 38 shows an example of an encoding method capable of encoding decision results regardless of decision errors caused in the plurality of deciders included in the optical receiver. An encoder of the optical receiver carries out an encoding process by obtaining "one or more candidates for a corrected decision result pattern, each of which has the least number of bits that are corrected", and, when obtaining two or more candidates for the corrected decision result pattern, selecting one of them according to priority information indicating that "the closer to a middle decision level the lower probability of occurrence of errors a corresponding decision result has". FIG. 39 shows encoded patterns based on the priority information. If each decider can decide the levels of electric received signals without making an error, this encoding method provides 3-bit encoded patterns similar to those shown in FIG. 35. When an error occurs in one or more deciders of the optical receiver, for example, when the decision result obtained according to the middle decision level $D_c$ is 1 and $(D_{+3}, D_{+2}, D_{+1})$ is (1,0,1), where $(D_{+3}, D_{+2}, D_{+1})$ mean the decision result obtained by a decider having the highest decision level $D_{+3}$, the decision result obtained by another decider having the second largest decision level $D_{+2}$, and the decision result obtained by another decider having the third largest decision level $D_{+1}$, two candidates for the corrected decision result pattern, in each of which one bit is corrected: (1,1,1) and (0,0,1) are provided as $(D_{+3},D_{+2},D_{+1})$. (0,0,1) is selected as the corrected decision result pattern according to the priority information indicating that "the closer to a middle decision level the lower probability of occurrence of errors a corresponding decision result has". The encoder then encodes the corrected decision result pattern into a 3-bit code. In the case of the decision result obtained according to the middle decision level $D_c=0$, the encoder similarly carries out correcting and encoding processes.

As mentioned above, in accordance with this embodiment 12, even if an error occurs in a decision result obtained by a decider 13, the optical receiver obtains one or more corrected decision result patterns which can be encoded and each of which has the least number of bits that are corrected, and, when obtaining two or more corrected decision result patterns which can be encoded and each of which has the least number of bits that are corrected, and selects one of them to correct the error according to priority information indicating that the closer to the middle decision level the lower probability of occurrence of errors a corresponding decision result has, thereby preventing the occurrence of a decision result pattern which the encoder cannot encode.

Embodiment 13

FIG. 40 is an explanatory drawing showing an example of an encoding method capable of encoding decision results regardless of decision errors caused in deciders of an optical receiver according to embodiment 13 of the present invention, and FIG. 41 is an explanatory drawing showing encoded patterns based on priority information.

In accordance with this embodiment 13, an encoder of the optical receiver encodes the decision results obtained by the plurality of deciders according to priority information indicating that a higher priority is given to the decision result obtained by a decider having a higher decision level and indicating that the levels of electric received signals are decided as 1. FIG. 41 shows encoded patterns based on the priority information. In the figure, encoded patterns corresponding to hatched decision results differ from those shown in FIG. 39 and generated by using the encoding method according to above-mentioned embodiment 12. Even in this embodiment 13, if each decider operates without making an error, the encoder of the optical receiver carries out 3-bit encoding in the same manner as shown in FIG. 35. When errors occur in two or more deciders and the level of an electric received signal is erroneously decided as 0 and 1 by those deciders, the encoder gives a higher priority to the decision result obtained by a decider having a higher decision level and indicating that the level of the electric received signal is decided as 1. The encoder then assumes that the decision results obtained by all other deciders having lower decision levels are all 1 and encodes the decision results obtained by all the deciders into a 3-bit code including the hard-decision result and reliability information.

As mentioned above, in accordance with this embodiment 13, even if an error occurs in a decision result obtained by a decider, the optical receiver corrects the error according to priority information indicating that higher priorities are given to decision results indicating that the levels of electric received signals are decided as 1, thereby preventing the occurrence of a decision result pattern which the encoder cannot encode.

Embodiment 14

FIG. 42 is an explanatory drawing showing an example of an encoding method capable of encoding decision results regardless of decision errors caused in deciders of an optical receiver according to embodiment 14 of the present invention, and FIG. 43 is an explanatory drawing showing encoded patterns based on priority information.

In accordance with this embodiment 14, an encoder of the optical receiver encodes the decision results obtained by a plurality of deciders according to priority information indicating that a higher priority is given to the decision result obtained by a decider having a lower decision level and indicating that the level of the electric received signal is decided as 0. FIG. 43 shows encoded patterns based on the priority information. Like that of above-mentioned embodiment 13, if each decider operates without making an error, the encoder of the optical receiver provides 3-bit encoded patterns as shown in FIG. 35. In FIG. 43, encoded patterns corresponding to hatched decision results differ from those generated by using the encoding method according to above-mentioned embodiment 12. When errors occur in two or more deciders and the level of an electric received signal is erroneously decided as 0 and 1 by those deciders, the encoder gives a higher priority to the decision result obtained by a decider having a lower decision level and indicating that the level of the electric received signal is decided as 0. The encoder then assumes that the decision results obtained by all other deciders having higher decision levels are all 0 and encodes the decision results obtained by all the deciders into a 3-bit code including the hard-decision result and reliability information.

As mentioned above, in accordance with this embodiment 14, even if an error occurs in a decision result obtained by a decider, the optical receiver corrects the error according to priority information indicating that higher priorities are given to decision results indicating that the levels of electric received signals are decided as 0, thereby preventing the occurrence of a decision result pattern which the encoder cannot encode.

Embodiment 15

FIG. 44 is an explanatory drawing showing an example of an encoding method capable of encoding decision results regardless of decision errors caused in deciders of an optical receiver according to embodiment 15 of the present invention, and FIG. 45 is an explanatory drawing showing encoded patterns based on priority information.

In accordance with this embodiment 15, an encoder of the optical receiver generates reliability information from the decision results obtained by either deciders having decision levels higher than a middle decision level or deciders having decision levels lower than the middle decision level according to the decision result obtained by a middle decider having the middle decision level. FIG. 45 shows encoded patterns obtained by using this method. When the decision result obtained by the middle decider having the middle decision level is 1, the encoder generates reliability information based on the numbers of 0s and 1s decided by the three deciders having decision levels higher than the middle decision level. When all the three deciders having decision levels higher than the middle decision level decide the level of the electric received signal as 1, the reliability information is set to 11. When two of the three deciders having decision levels higher than the middle decision level decide the level of the electric received signal as 1 and the remaining one of the three deciders decides the level of the electric received signal as 0, the reliability information is set to 10. When all the three deciders having decision levels higher than the middle decision level decide the level of the electric received signal as 0, the reliability information is set to 00. When the decision result obtained by the middle decider is 0, the encoder generates the reliability information based on the numbers of 0s and 1s decided by the three deciders having decision levels lower than the middle decision level. When all the three deciders having decision levels lower than the middle decision level decide the level of the electric received signal as 0, the reliability information is set to 11. When all the three deciders having decision levels lower than the middle decision level decide the level of the electric received signal as 1, the reliability information is set to 00. When no error occurs in any one of the plurality of deciders included in the optical receiver, the encoder generates the reliability information in the same manner that the reliability information is generated by using another encoding method previously mentioned.

As mentioned above, in accordance with this embodiment 15, even if an error occurs in a decision result obtained by a decider, the encoder of the optical receiver encodes the decision results obtained by the plurality of deciders based on the numbers of 0s and 1s decided by deciders having decision levels higher or lower than a middle decision level regardless of a decision result pattern obtained according to the higher or lower decision levels, thereby preventing the occurrence of a decision result pattern which the encoder cannot encode.

Embodiment 16

Figures 46, 47:
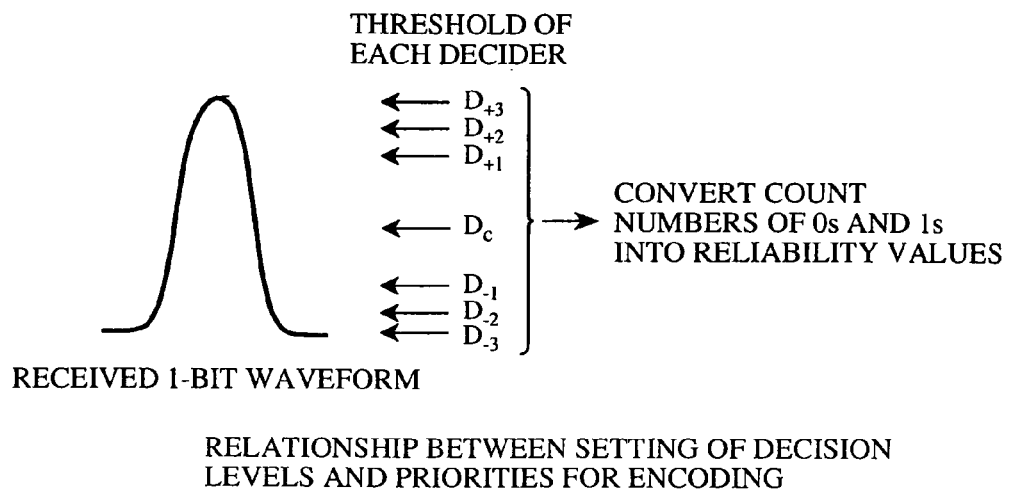
FIG. 46 is an explanatory drawing showing an example of an encoding method capable of encoding decision results regardless of decision errors caused by deciders according to embodiment 16 of the present invention.
FIG. 47 is an explanatory drawing showing encoded patterns based on priority information.

FIG. 46 is an explanatory drawing showing an example of an encoding method capable of encoding decision results regardless of decision errors caused in deciders of an optical receiver according to embodiment 16 of the present invention, and FIG. 47 is an explanatory drawing showing encoded patterns based on priority information.

In accordance with this embodiment 16, an encoder of the optical receiver counts the number of decision results: 0s and 1s obtained by the seven deciders and encodes the decision results obtained by the seven deciders into a 3-bit code based on the numbers of 0s and 1s. FIG. 47 shows encoded patterns obtained by using this method. When the decision results obtained by the seven deciders are all 1, the encoder defines the hard decision result as 1 and sets the reliability information to 11. When the number of 0s is larger than the number of 1s, the reliability information can be assumed to be the one associated with 0. When the decision results obtained by the seven deciders are all 0, the encoder defines the hard decision result as 0 and sets the reliability information to 11. In accordance with this encoding method of embodiment 16, when no error occurs in any one of the plurality of deciders included in the optical receiver, the encoder generates the reliability information in the same manner that the reliability information is generated by using another encoding method previously mentioned.

As mentioned above, in accordance with this embodiment 16, even if an error occurs in a decision result obtained by a decider, the encoder of the optical receiver encodes the decision results obtained by the plurality of deciders based on the numbers of 0s and 1s decided by all the deciders included in the optical receiver regardless of the decision result pattern obtained by the plurality of deciders, thereby preventing the occurrence of a decision result pattern which the encoder cannot encode.

Embodiment 17

Figure 48:
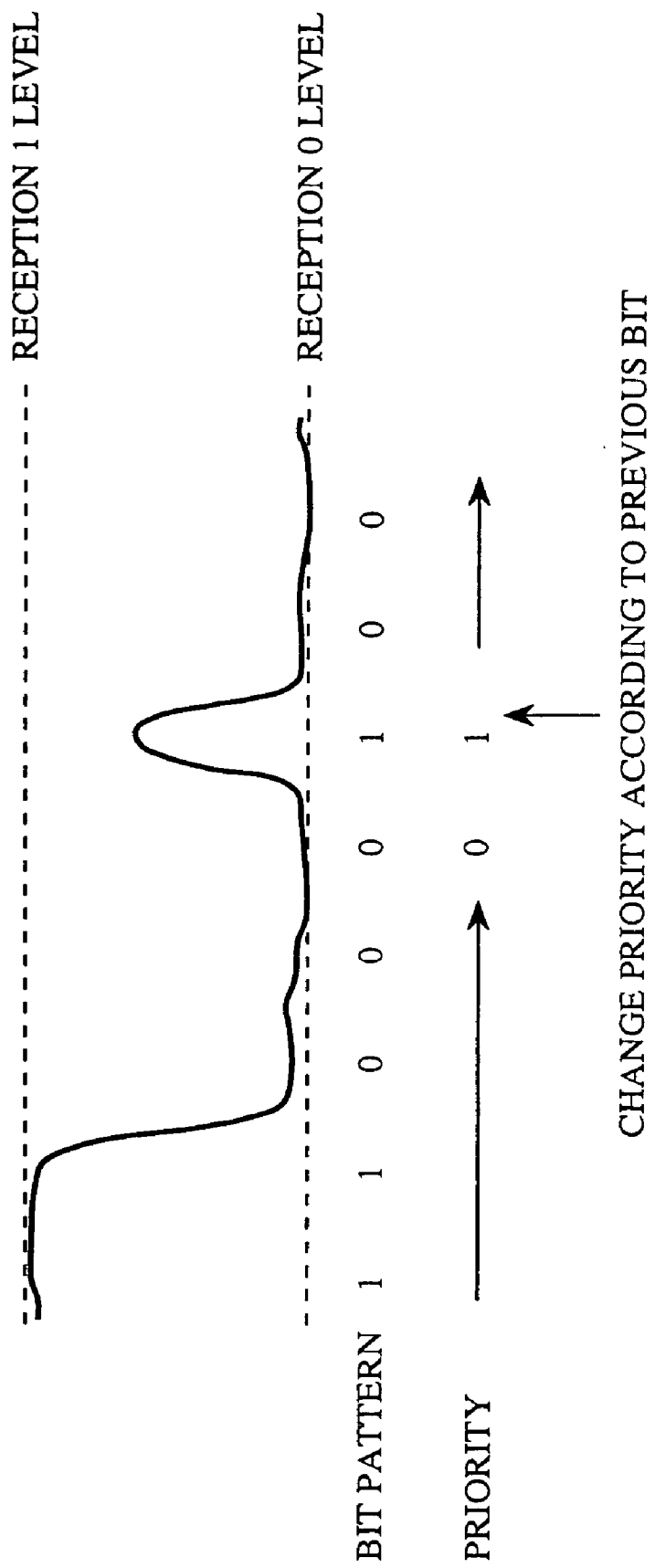
FIG. 48 is an explanatory drawing showing a received waveform with respect to a received bitstream according to embodiment 17 of the present invention.
Figure 49:
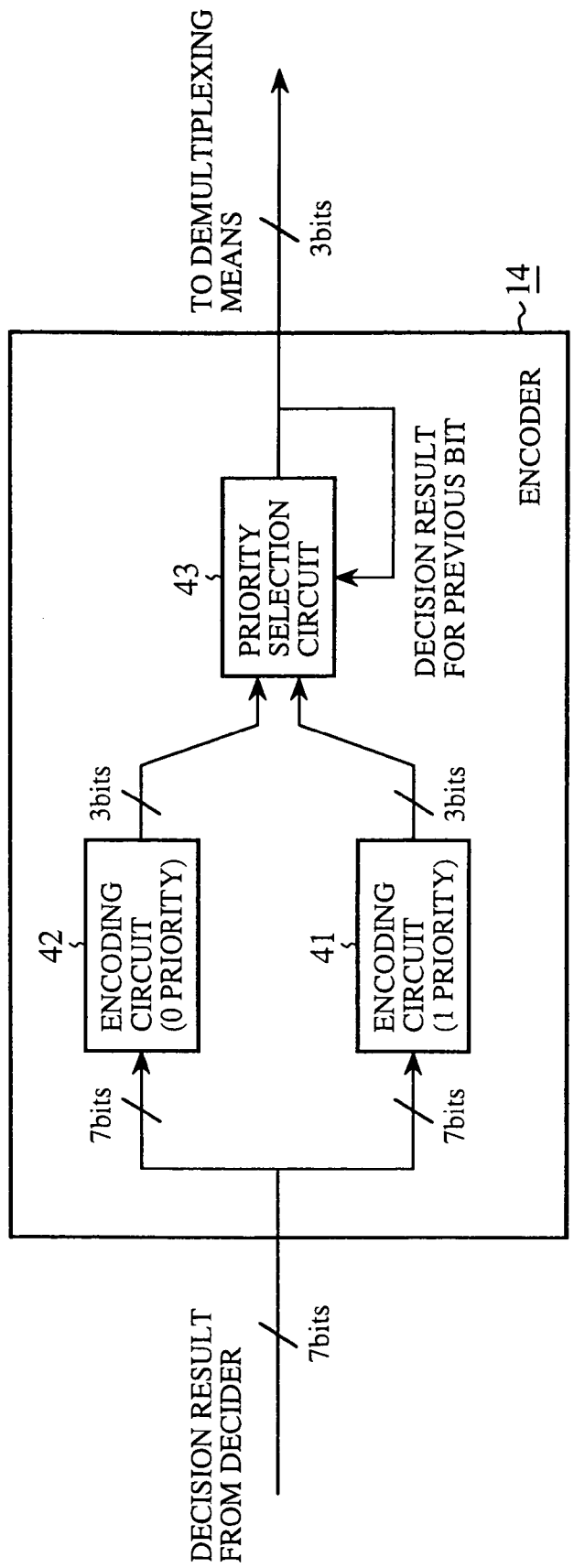
FIG. 49 is a block diagram showing an internal structure of an encoder that can change priorities.

FIG. 48 is an explanatory drawing showing the waveform of a received bitstream, which is to be encoded by an optical receiver according to embodiment 17 of the present invention, and FIG. 49 is a block diagram showing an internal structure of an encoder that can change the setting of priorities. In the figure, reference numeral 41 denotes an encoding circuit (i.e., a significant priority bit encoding circuit) that encodes the decision results obtained by a plurality of deciders while giving a higher priority to a decision result indicating that a corresponding bit of the received bitstream is decided as 1, the encoding circuit 41 corresponding to the encoder according to above-mentioned embodiment 13, reference numeral 42 denotes another encoding circuit (i.e., an insignificant priority bit encoding circuit) that encodes the decision results obtained by the plurality of deciders while giving a higher priority to a decision result indicating that a corresponding bit of the received bitstream is decided as 0, the other encoding circuit 42 corresponding to the encoder according to above-mentioned embodiment 14, and reference numeral 43 denotes a priority selection circuit for selecting and delivering either a parallel code obtained by the encoding circuit 41 or a parallel code obtained by the other encoding circuit 42, and for changing the selection between the parallel codes obtained by the encoding circuits 41 and 42 according to a first previous, second previous, or . . . parallel code delivered thereby.

Next, a description will be made as to an operation of an optical receiver according to embodiment 17 of the present invention.

In accordance with this embodiment 17, there is provided a method of allowing the encoder to change the setting of priorities after a plurality of deciders decide each bit of a bitstream that reaches the optical receiver while the encoder encodes the decision results obtained by the plurality of deciders by using both the encoding circuit according to embodiment 13 that gives a higher priority to a decision result indicating that a corresponding bit of the bitstream is decided as 1 and the other encoding circuit according to embodiment 14 that gives a higher priority to a decision result indicating that a corresponding bit of the bitstream is decided as 0, as explained below. FIG. 48 shows the waveform of a received bitstream. The encoder changes the setting of priorities based on previous bit information indicating the state of a first previous, second previous, or . . . bit of the bitstream. The previous bit information only has to contain a hard-decision result for the corresponding bit, and alternatively contains the hard-decision result and even reliability information. For example, when a bit of 1 reaches after some bits of 0 are successively received while a higher priority is given to a decision result indicating that a corresponding bit is decided as 0 (this case is referred to as 0 priority), the setting of priorities is changed so that a higher priority is given to a decision result indicating that a corresponding bit is decided as 1 (this case is referred to as 1 priority), as shown in FIG. 48. Similarly, the encoder can change the setting of priorities from 1 priority to 0 priority according to the pattern of the bitstream.

FIG. 49 shows an internal structure of the encoder that can change the setting of priorities. The encoder encodes a 7-bit signal from the plurality of deciders into two 3-bit codes by using both the encoding circuit 41 according to embodiment 13 that gives a higher priority to a decision result indicating that a corresponding bit of the bitstream is decided as 1 (i.e., 1 priority) and the other encoding circuit 42 according to embodiment 14 that gives a higher priority to a decision result indicating that a corresponding bit of the bitstream is decided as 0 (i.e., 0 priority). The priority selection circuit 43 selects and delivers either of the two 3-bit codes, i.e., an encoded result obtained according to either 1 priority or 0 priority based on the previous bit information indicating the state of a first previous, second previous, or . . . bit of the bitstream. As an alternative, the encoder can change the setting of priorities based on bit information indicating either the state of the next, second next, or . . . bit of the bitstream or the states of the first previous and next, second previous and second next, or . . . bits of the bitstream.

As mentioned above, in accordance with this embodiment 17, the encoder selects either of two encoded results obtained according to 1 priority and 0 priority based on the bit pattern of an input bitstream. Therefore, when decision errors occur in deciders, the optical receiver can decide the level of each bit of the bitstream while giving a higher priority to a decision result indicating that a corresponding bit of the bitstream is decided as 0 or 1, and can make error correction with a higher degree of accuracy.

Embodiment 18

Figure 50:
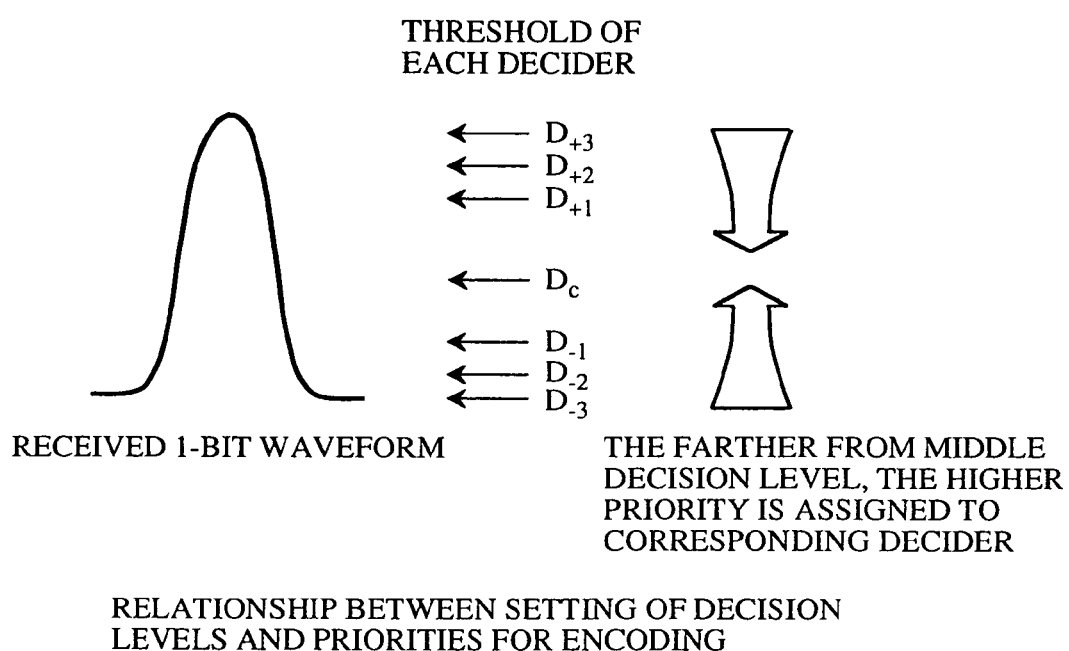
FIG. 50 is an explanatory drawing showing an example of an encoding method capable of encoding decision results regardless of decision errors caused by deciders according to embodiment 18 of the present invention.
Figure 51:
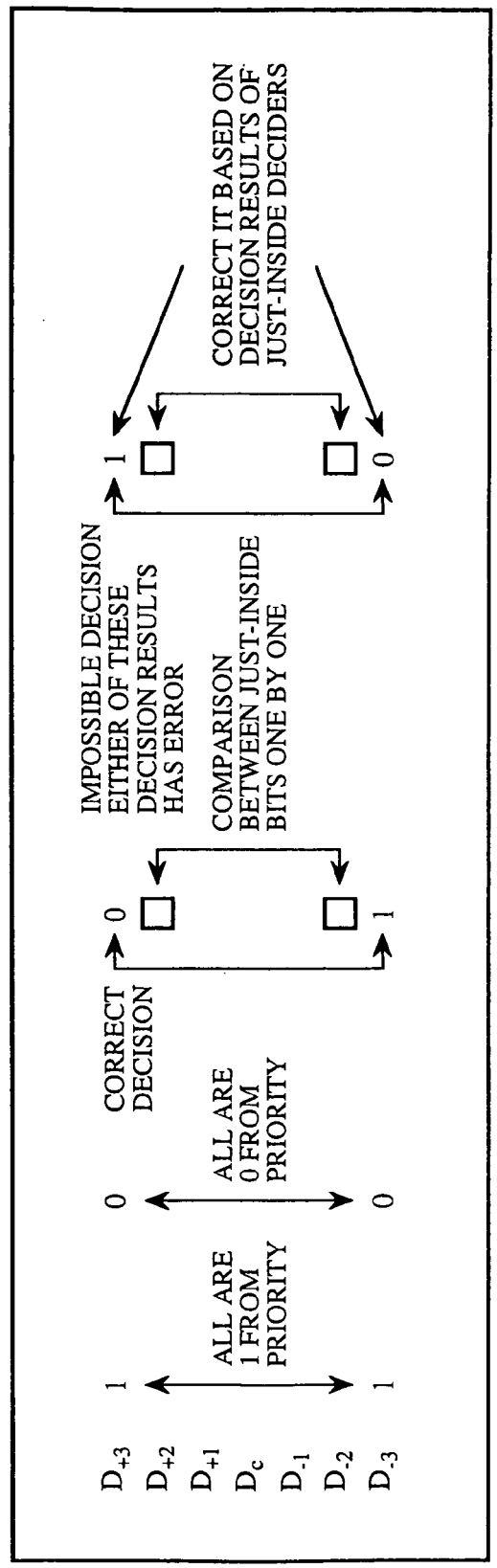
FIG. 51 is an explanatory drawing showing an encoding procedure.
Figure 52:
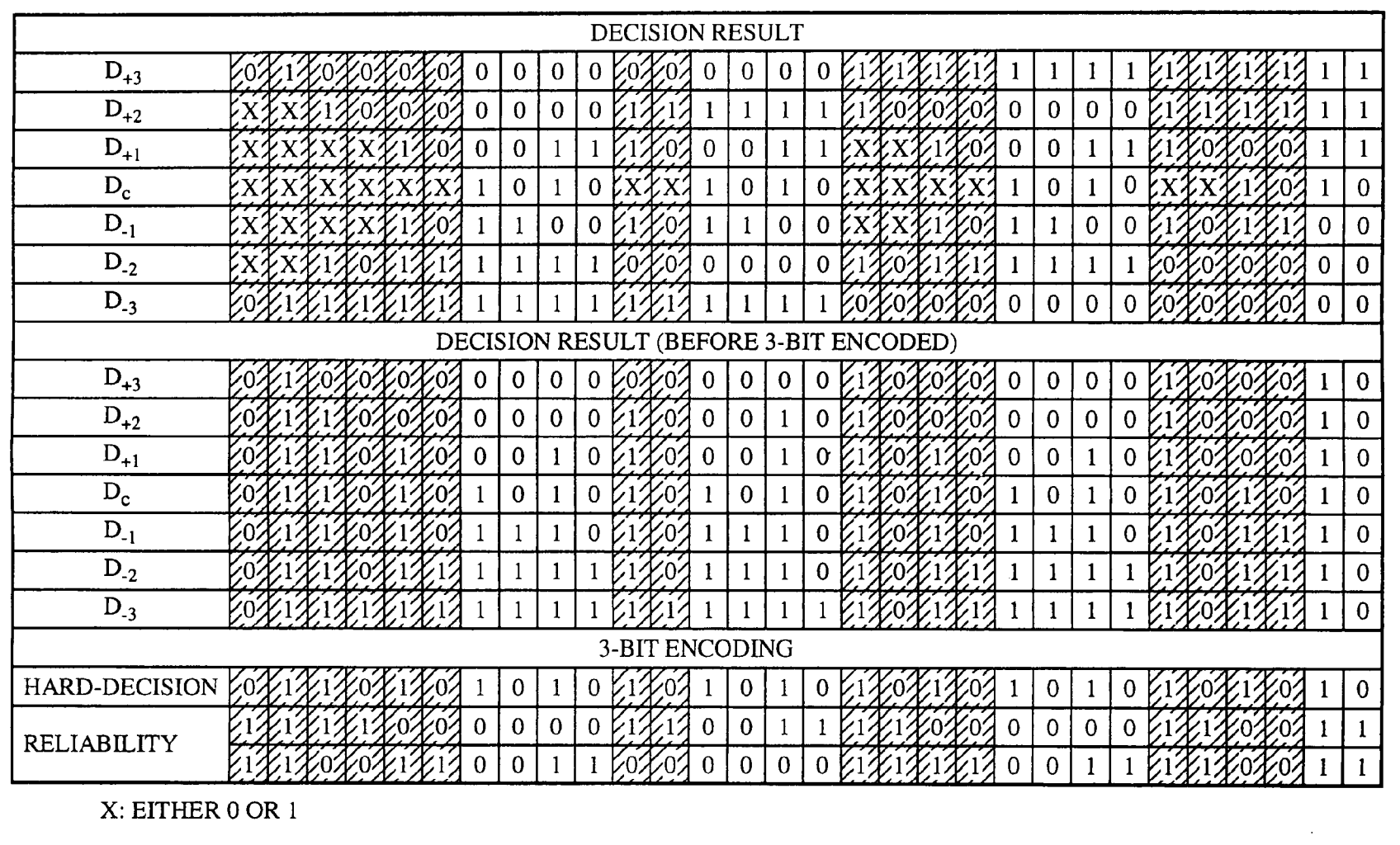

FIG. 50 is an explanatory drawing showing an example of an encoding method capable of encoding decision results regardless of decision errors caused by deciders of an optical receiver according to embodiment 18 of the present invention, FIG. 51 is an explanatory drawing showing an encoding procedure, and FIG. 52 is an explanatory drawing showing encoded patterns.

In accordance with this embodiment 18, the optical receiver encodes the decision results obtained by the plurality of deciders according to priority information indicating that "the farther from a middle decision level the lower probability of occurrence of errors a corresponding decision result has, and, when the decision result obtained by a decider having the highest or lowest decision level is an impossible one, the decision result has to be corrected based on the decision result obtained by another decider having the second, third, or . . . highest or lowest level". FIG. 50 shows an encoding procedure according to this method. A comparison between the decision result obtained by a decider having the highest decision level and the decision result obtained by another decider having the lowest decision level is started according to this encoding procedure. When $(D_{+3}, D_{-3})$ is $(1,1)$, where $(D_{+3}, D_{-3})$ mean the decision result obtained by the decider having the highest decision level $D_{+3}$ and the decision result obtained by the other decider having the lowest decision level $D_{-3}$, the decision results obtained by all other deciders having the second, third, and . . . highest and lowest decision levels can be assumed to be all 1. When $(D_{+3}, D_{-3})$ is $(0,0)$, the decision results obtained by all other deciders having the second, third, and . . . highest and lowest decision levels can be assumed to be all 0. When $(D_{+3}, D_{-3})$ is $(0,1)$, the decision results can be assumed to be correct and a comparison between the decision result obtained by a decider having the second highest decision level and the decision result obtained by another decider having the second lowest decision level is further made. When $(D_{+3}, D_{-3})$ is $(1,0)$, because these decision results are impossible ones, it can be assumed that a decision error occurs in either of the decider having the highest decision level $D_{+3}$ and the other decider having the lowest decision level $D_{-3}$. In this case, the erroneous decision result obtained by either of the decider having the highest decision level $D_{+3}$ and the other decider having the lowest decision level $D_{-3}$ is corrected based on the decision result obtained by another decider having the second highest or lowest decision level. For example, when the decision result obtained by another decider having the second highest decision level and the decision result obtained by another decider having the second lowest decision level: $(D_{+2}, D_{-2})$ is $(0,1)$, it can be assumed that errors occur in both the decision results respectively obtained according to the decision levels $D_{+3}$ and $D_{-3}$ and they are corrected to 0 and 1. When $(D_{+2}, D_{-2})$ is $(1,1)$, the decision result obtained according to the decision level $D_{-3}$ is corrected to 1. In contrast, when $(D_{+2}, D_{-2})$ is $(1,0)$, because it can be assumed that a decision error occurs in either of the other decider having the second highest decision level $D_{+2}$ and the other decider having the second lowest decision level $D_{-2}$, the decision result obtained by another decider having the third highest decision level and the decision result obtained by another decider having the third lowest decision level are further referred. FIG. 52 shows encoded patterns generated according to this procedure. In the figure, encoded patterns corresponding to hatched decision results differ from those generated by using the encoding method according to above-mentioned embodiment 12.

As mentioned above, in accordance with this embodiment 18, even if an error occurs in a decision result obtained by a decider 13, the optical receiver encodes the decision results obtained by the plurality of deciders according to priority information indicating that "the farther from a middle decision level the lower probability of occurrence of errors a corresponding decision result has, and, when the decision result obtained by a decider having the highest or lowest decision level is an impossible one, the decision result has to be corrected based on the decision result obtained by another decider having the second, third, or . . . highest or lowest decision level", thereby preventing the occurrence of a decision result pattern which the optical receiver cannot encode.

Embodiment 19

Figure 53:
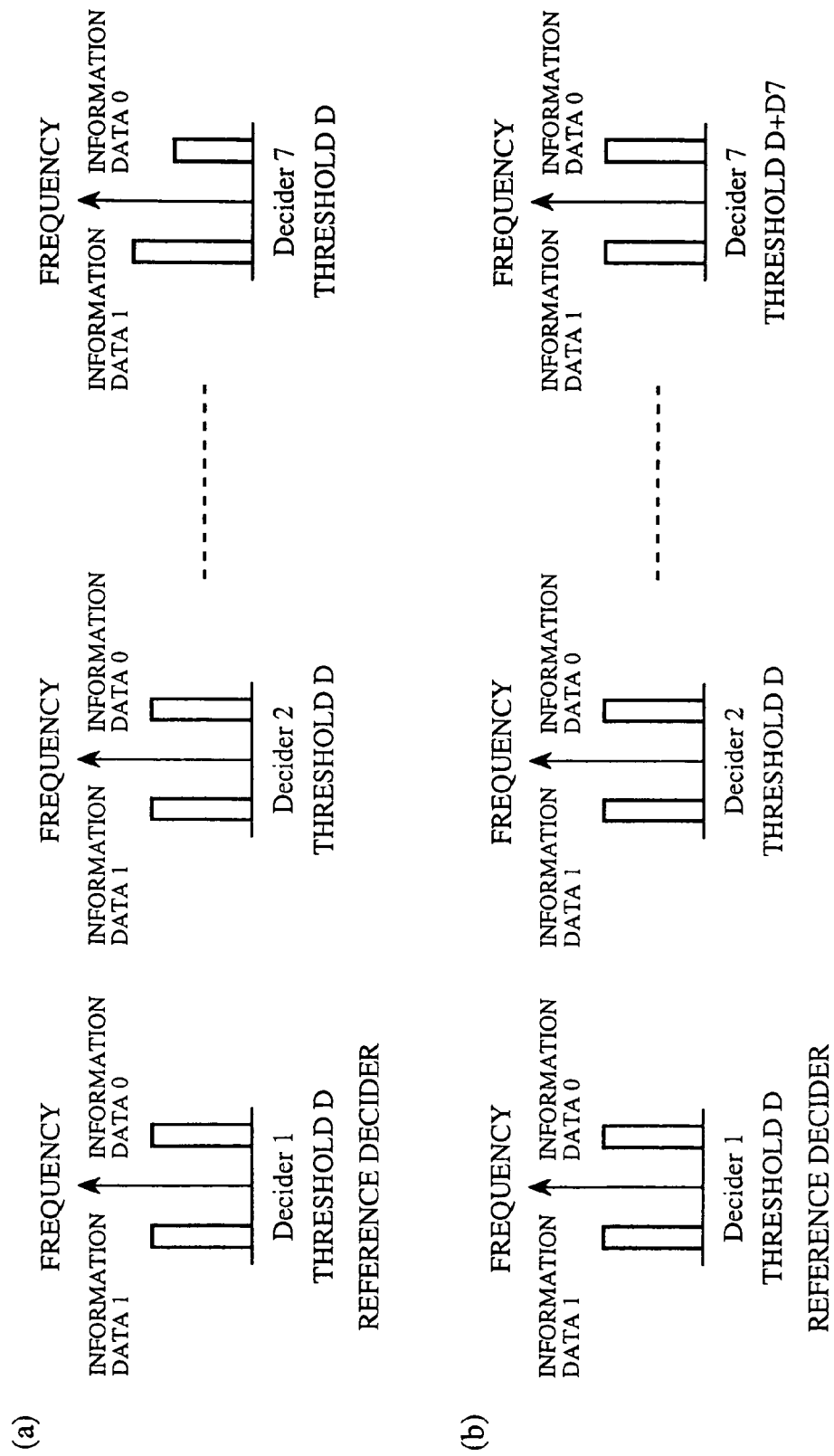
FIG. 53 is an explanatory drawing showing a technique for detecting a difference among a plurality of deciders from the decision frequencies with which electric received signals are decided as mark and space, respectively, by each decider when power is supplied to an optical receiver according to embodiment 19 of the present invention.
Figure 54:
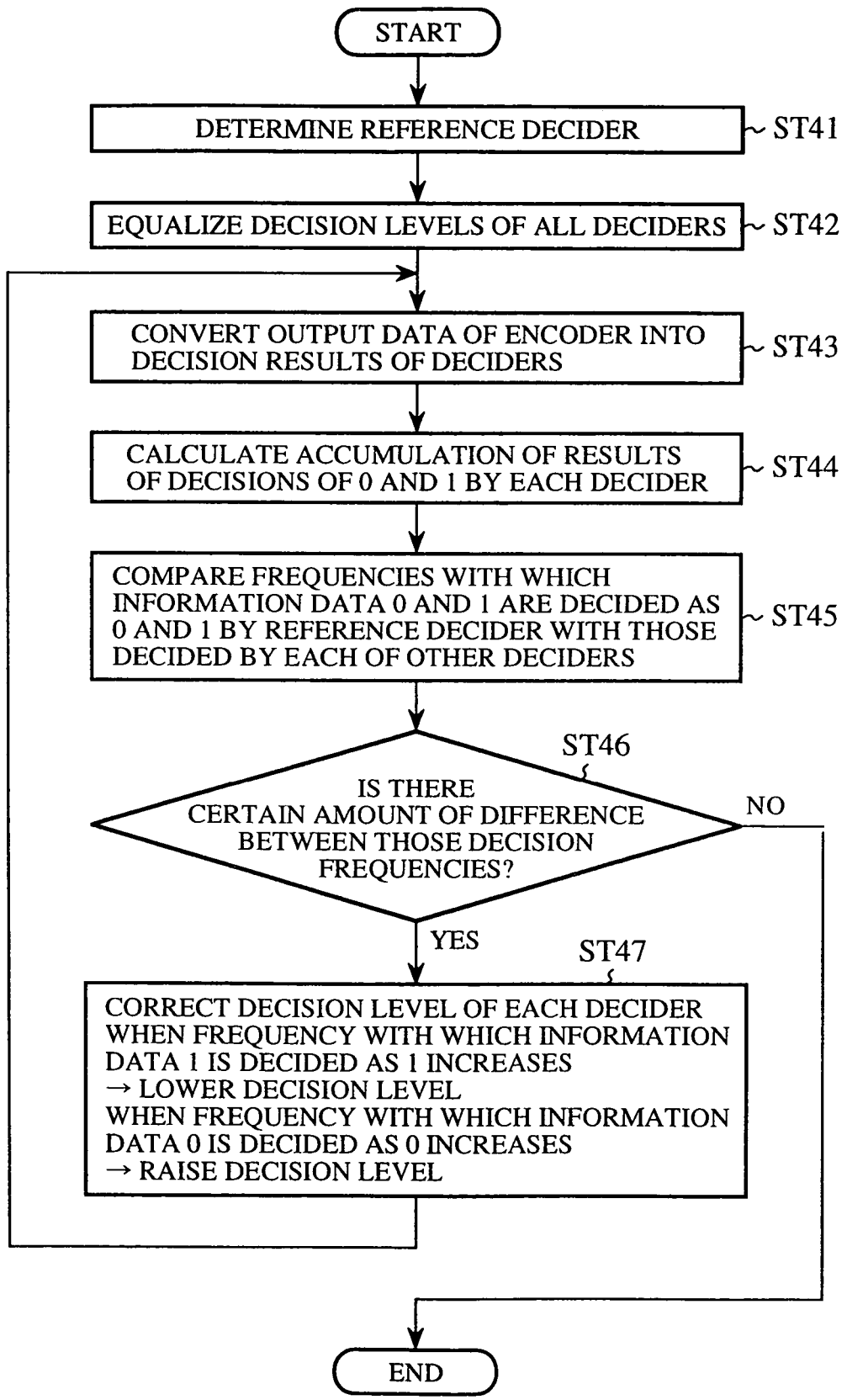
FIG. 54 is a flow chart showing a procedure for detecting a difference among the plurality of deciders.

FIG. 53 is an explanatory drawing showing a technique for detecting a difference among a plurality of deciders from the decision frequencies with which electric received signals are decided as mark and space, respectively, by each decider when power is supplied to an optical receiver according to embodiment 19 of the present invention, and FIG. 54 is a flow chart showing a procedure for detecting a difference among the plurality of deciders.

The optical receiver 1 according to this embodiment can control the decision level of each decider 13 in consideration of the difference among the seven deciders 13 by grasping the difference.

Next, a description will be made as to an operation of the optical receiver according to embodiment 19 of the present invention.

First of all, a reference decider that is used as a reference is determined (in step ST41). Then a decision voltage region is divided into three portions, for example, and the decision voltage of the reference decider is set to a representative value falling within the decision voltage region. The optical receiver also sets the decision level of each of all the deciders 13 to the same level as the reference decider (in step ST42). The optical receiver decides the level of received data by using each of the seven deciders 13, and measures the decision frequencies with which received data are decided as mark and space, respectively, by each of the seven deciders 13 based on data from an encoder 14, which are decision results obtained by the seven deciders 13, by using a probability density distribution estimation circuit 19 (in step ST43). When the probability density distribution estimation circuit 19 acquires an accumulation of the decision frequencies (in step ST44), and provides such results as shown FIG. 53 (a), it can be seen from a comparison between the decision frequencies obtained from the decision results of the reference decider and the decision frequencies obtained from the decision results of each decider 13 (in step ST45) that there is a difference between the decision frequencies with which received data are decided as mark and space, respectively, by decider 7 (in step ST46). By adjusting the decision level of decider 7 so that the decision frequency with which received data are decided as mark decreases, the decision frequency with which received data are decided as space increases, and the difference between them becomes lower a constant value (in step ST47), the decision frequencies with which received data are decided as mark and space, respectively, by all the seven deciders 13 become equal to one another as shown in FIG. 53(b). At this time, the optical receiver determines that decider 7 has an error $D_7$ in the decision level. The optical receiver can similarly grasp an error in the decision level of each of the seven deciders 13 for two other portions of the decision voltage region. The optical receiver performs other operations in the same manner that that of embodiment 1 does.

A means having control over the processing shown in the flow chart of FIG. 54 to control each component shown in FIG. 4 and to detect an error in the decision level of each of the seven deciders 13 corresponds to a decision level error detecting unit not shown in FIG. 4.

Thus a threshold control circuit 20 can control the decision level of each of the seven deciders 16 in a soft-decision deciding unit 12 in consideration of the difference among the seven deciders 13 by correcting the decision level of each of the seven deciders 13 using the error in the decision level of each of the seven deciders 13, which is detected by the decision level error detecting unit.

As mentioned above, in accordance with this embodiment 19, the threshold control circuit 20 only has to send a control signal to each of the seven deciders 13 in order to correct an error in the decision level of each of the seven deciders 13, and therefore can control the decision level of each of the seven deciders 16 with a higher degree of accuracy.

Embodiment 20

Figure 55:
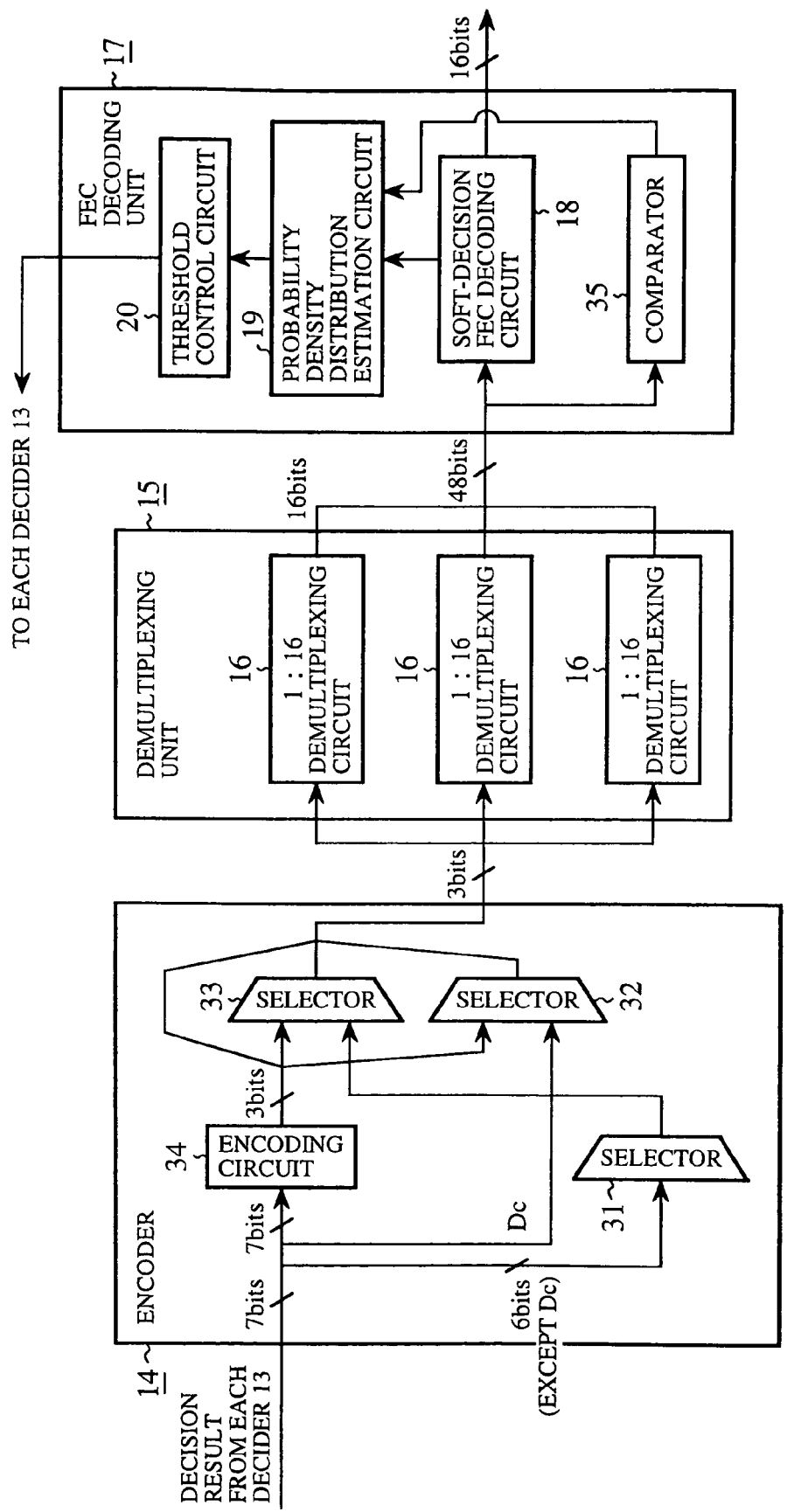
FIG. 55 is a block diagram showing an optical receiver according to embodiment 20 of the present invention in detail.

FIG. 55 is a block diagram showing the structure of an optical receiver according to embodiment 20 of the present invention in detail. An encoder 14 is provided with a selector 31 for selecting the decision result obtained by one of a plurality of deciders 13 that is to be adjusted, a selector 32 for extracting and outputting the decision result obtained by a reference decider when adjusting the decision level of the decider to be adjusted, a selector 33 for extracting and outputting the decision result obtained by the decider to be adjusted, and an encoding circuit 34 for encoding the decision results obtained by the plurality of deciders 13. An FEC decoding unit 17 further includes a comparator 35 for delivering a comparison result to a probability density distribution estimation circuit 19.

Figure 56:
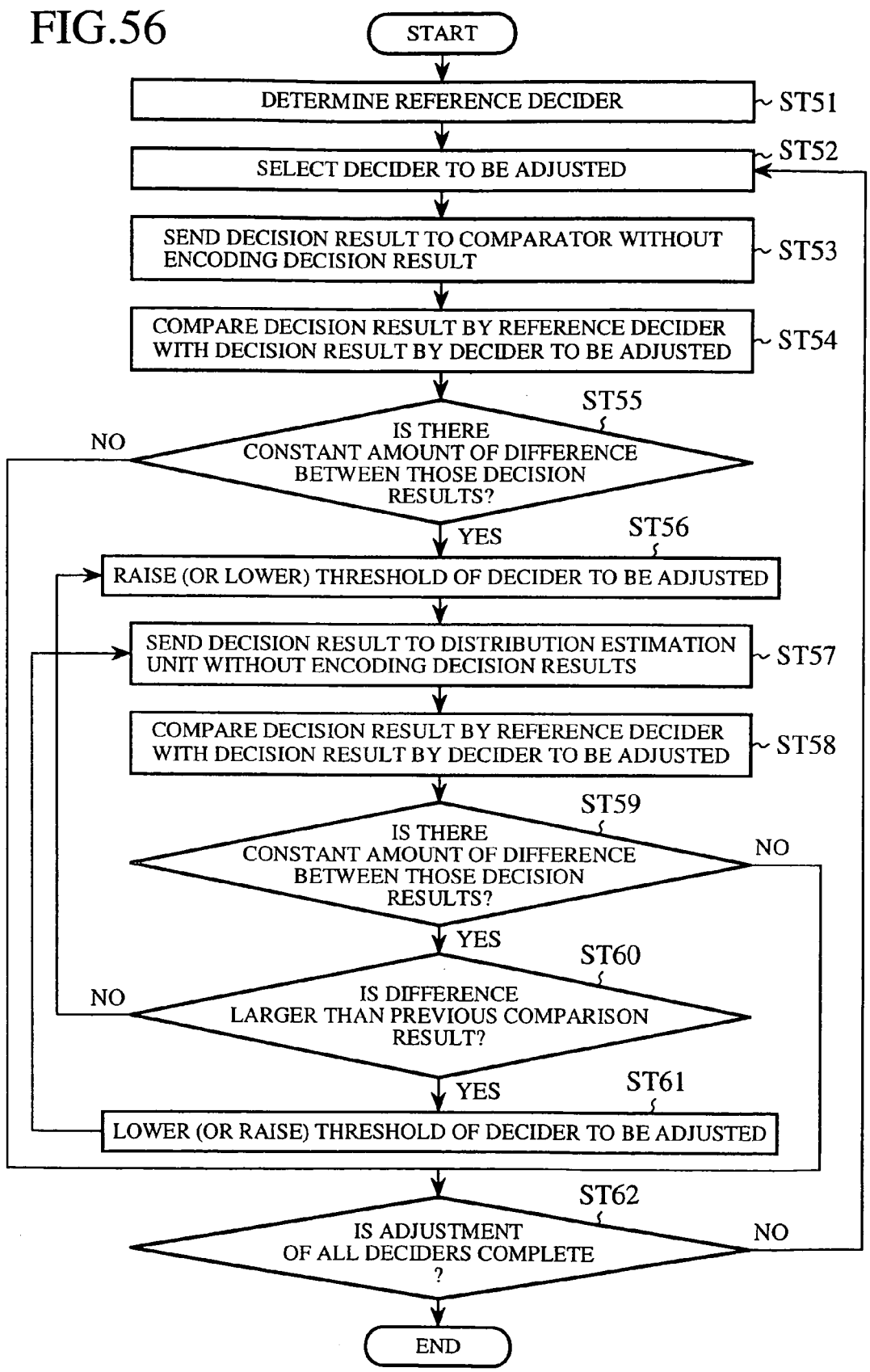
FIG. 56 is a flow chart showing a procedure for adjusting a difference among a plurality of deciders of the optical receiver.

FIG. 56 is a flow chart showing a technique for adjusting a difference among the plurality of deciders. According to this technique, the decision levels of the plurality of deciders are adjusted one by one with respect to the reference decider.

Next, a description will be made as to an operation of the optical receiver according to embodiment 20 of the present invention.

First of all, as in the case of embodiment 19, a decision voltage region is divided into three portions, for example, and the decision voltage of each of the plurality of deciders is set to a representative value falling within the decision voltage region. The selector 32 determines a reference decider that is used as a standard (in step ST51), and the other selectors 31 and 32 select a decider 13 to be adjusted (in step ST52). The decision results obtained by the plurality of deciders are passed through the encoding circuit 34 without being encoded into a 3-bit code onto which reliability information is piggybacked (in step ST53). After a demultiplexing unit 15 expands those decision results into a parallel signal, the comparator 35 compares the decision result obtained by the decider 13 to be adjusted with the decision result obtained by the reference decider (in step ST54). The comparator 35 sends the comparison result to the probability density distribution estimation circuit 19. The probability density distribution estimation circuit 19 grasps the difference between the decision result obtained by the reference decider and the decision result obtained by the decider to be adjusted from comparison results on a constant amount of bits (in step ST55). If there is no difference between the decision result obtained by the reference decider and the decision result obtained by the decider to be adjusted, the optical receiver can determine that there is no difference between the decision level of the reference decider and the decision level of the decider to be adjusted. In contrast, when there is a difference between the decision result obtained by the reference decider and the decision result obtained by the decider to be adjusted, the optical receiver raises (or lowers) the decision level of the decider 13 to be adjusted (in step ST56) and the comparator 35 then compares the decision result obtained by the decider 13 to be adjusted with the decision result obtained by the reference decider again (in steps ST55 to ST58). Then, when there is no difference between the decision result obtained by the reference decider and the decision result obtained by the decider to be adjusted, the optical receiver can determine that the decider 13 to be adjusted has an error in the decision level corresponding to the difference between the current decision level and previous decision level of the decider 13 to be adjusted. If there is a difference between the decision result obtained by the reference decider and the decision result obtained by the decider to be adjusted (in step ST59) and the difference is larger than the previous comparison result (in step ST60), the optical receiver lowers (or raises) the decision level of the decider 13 to be adjusted (in step ST61), and the comparator 35 then compares the decision result obtained by the decider 13 to be adjusted with the decision result obtained by the reference decider again (in step ST58). In contrast, when although there is a difference between the decision result obtained by the reference decider and the decision result obtained by the decider to be adjusted (in step ST59), the difference is smaller than the previous comparison result, the optical receiver further raises (or lowers) the decision level of the decider 13 to be adjusted until the difference between the current comparison result and the previous comparison result becomes lower a constant value (in steps ST60 and ST56 to ST59). The optical receiver thus grasps the difference between the decision level of the reference decider and each of the decision levels of the other deciders 13 by repeating the above-mentioned procedure. The optical receiver can similarly grasp an error in the decision level of each of the plurality of deciders 13 for two other portions of the decision voltage region.

A means having control over the processing shown in the flow chart of FIG. 56 to control each component shown in FIG. 55 and to detect an error in the decision level of each of the plurality of deciders 13 corresponds to a decision level error detecting unit not shown in FIG. 55.

Thus a threshold control circuit 20 can control the decision level of each of the seven deciders 16 in a soft-decision deciding unit 12 in consideration of the difference among the seven deciders 13 by correcting the decision level of each of the seven deciders 13 using the error in the decision level of each of the seven deciders 13, which is detected by the decision level error detecting unit.

When not adjusting the difference among the plurality of deciders, the selectors 32 and 33 only have to select the encoded data from the encoding circuit 34. The optical receiver performs other operations in the same manner that that of embodiment 1 does.

As mentioned above, in accordance with this embodiment 20, the threshold control circuit 20 only has to send a control signal to each of the seven deciders 13 in order to correct an error in the decision level of each of the seven deciders 13, and therefore can control the decision level of each of the seven deciders 16 with a higher degree of accuracy.

Embodiment 21

Figure 57:
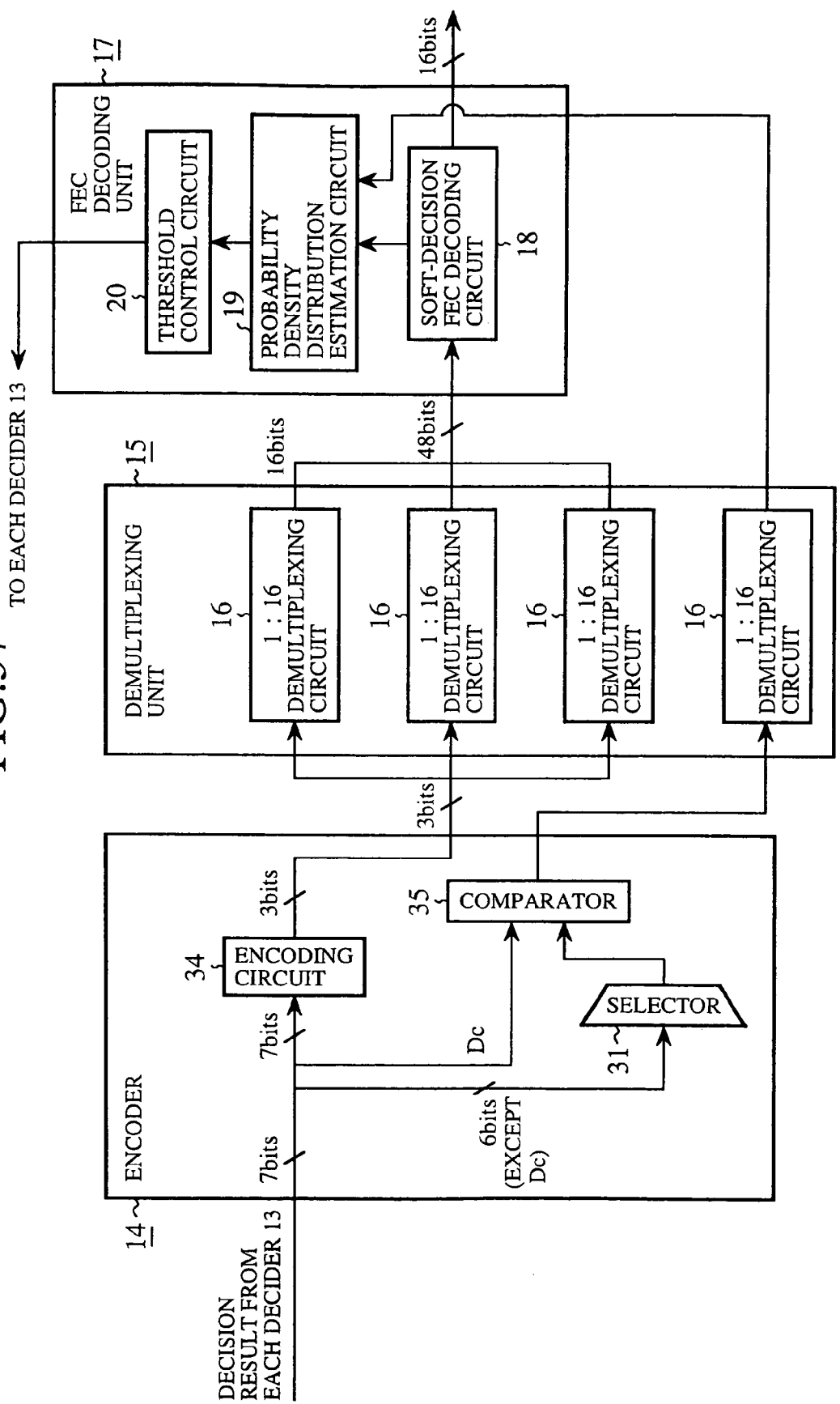
FIG. 57 is a block diagram showing an optical receiver according to embodiment 21 of the present invention in detail.

FIG. 57 is a block diagram showing the structure of an optical receiver according to embodiment 21 of the present invention in detail. In above-mentioned embodiment 20, the comparator 35 is disposed in the FEC decoding unit 17. As shown in FIG. 57, in accordance with this embodiment, a comparator 35 is disposed in an encoder 14, and a 1:16 demultiplexing circuit 16 for expanding the comparison result from the comparator into a parallel signal is disposed in a demultiplexing unit 15. In this case, before the decision results obtained by a plurality of deciders 13 are input to an encoding circuit 34, the encoder 14 extracts the decision result obtained by a reference decider and the decision result obtained by a decider 13 to be adjusted from the decision results obtained by the plurality of deciders 13, and the comparator 35 compares the decision result obtained by the reference decider with the decision result obtained by the decider 13 to be adjusted.

The other structure, other operations, and advantages of the optical receiver of this embodiment are the same as those of above-mentioned embodiment 20.

Embodiment 22

Figure 58:
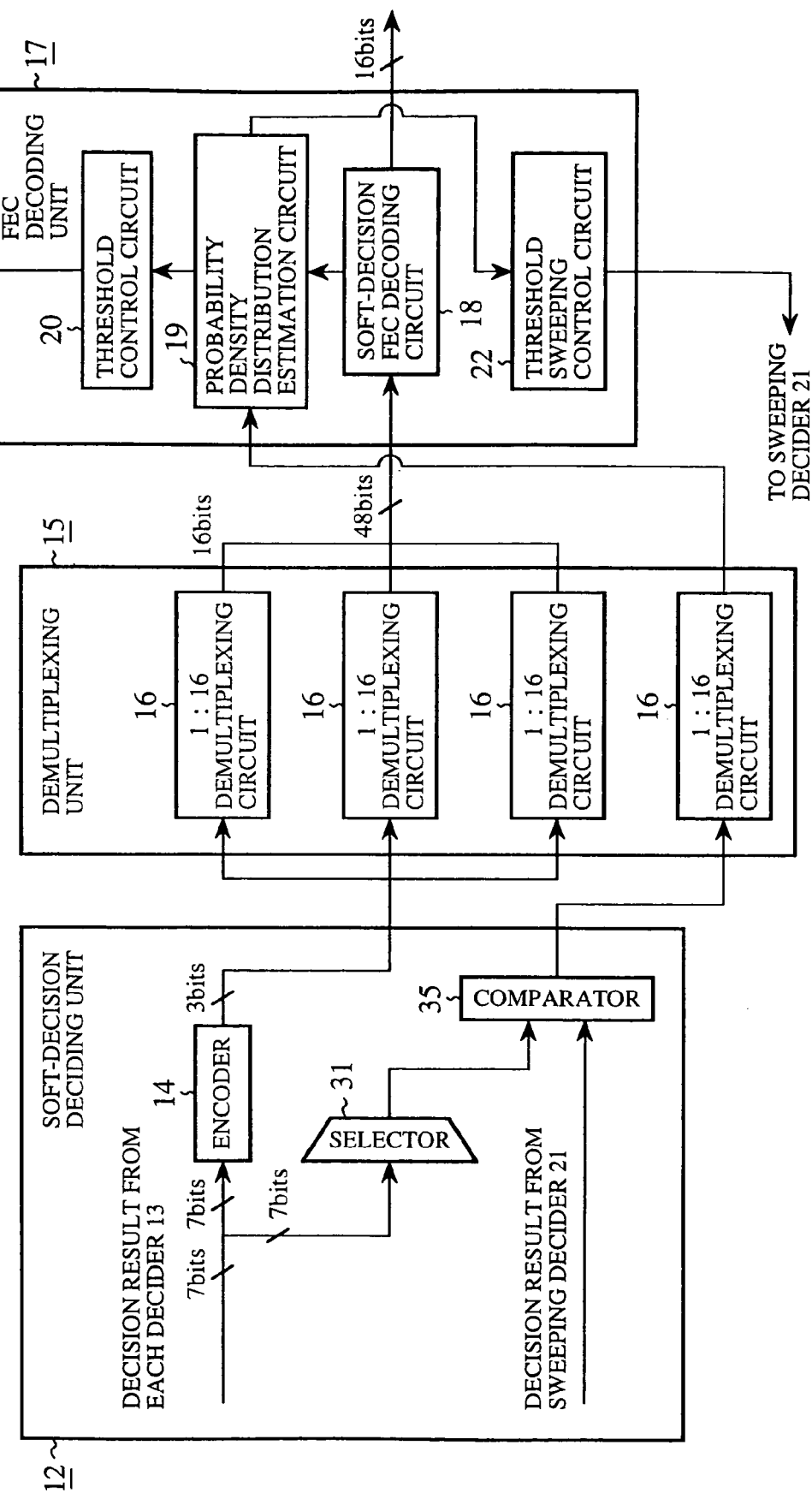
FIG. 58 is a block diagram showing an optical receiver according to embodiment 22 of the present invention in detail.

FIG. 58 is a block diagram showing the structure of an optical receiver according to embodiment 22 of the present invention in detail. The optical receiver includes a sweeping decider 21 that can sweep its decision level as shown in Embodiment 2, and is so constructed as to adjust the difference among a plurality of deciders 13.

A soft decision deciding unit 12 further includes a selector 31 for selecting the decision result obtained by one of the plurality of deciders 13 that is to be adjusted and a comparator 35 for comparing the selected decision result obtained by the decider 13 to be adjusted with the decision result obtained by the sweeping decider 21. The comparator 35 then delivers the comparison result to a demultiplexing unit 15. The demultiplexing unit 15 is further provided with a 1:16 demultiplexing circuit 16 for expanding the output of the comparator into a parallel signal and for delivering the parallel signal to a probability density distribution estimation circuit 19.

As mentioned above, in accordance with this embodiment 22, the optical receiver uses the sweeping decider 21 as a reference decider and corrects the difference among the plurality of deciders 13, and performs a procedure of adjusting the decision level of each of the plurality of deciders 13, like that of either of embodiments 13 and 14. Because the optical receiver can acquire an error in the decision level of each of the plurality of deciders 13 based on the decision level of the sweeping decider 21, the optical receiver can simply adjust the decision level of each of the plurality of deciders 13 when estimating probability density distributions by using only the sweeping decider 21.

Embodiment 23

Figure 59:
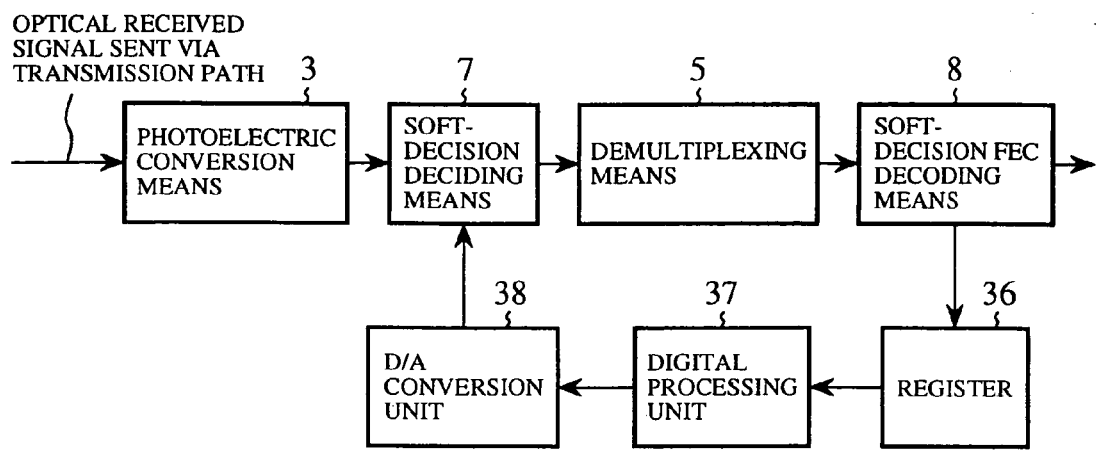
FIG. 59 is a block diagram showing an optical receiver according to embodiment 23 of the present invention.

FIG. 59 is a block diagram showing the structure of an optical receiver according to embodiment 23 of the present invention in detail. In the figure, reference numeral 36 denotes a register, reference numeral 37 denotes a digital processing unit, and reference numeral 38 denotes a digital-to-analog conversion unit. Those components correspond to the probability density distribution estimation means 9 and the decision level control means 10 as shown in FIG. 3.

Figure 60:
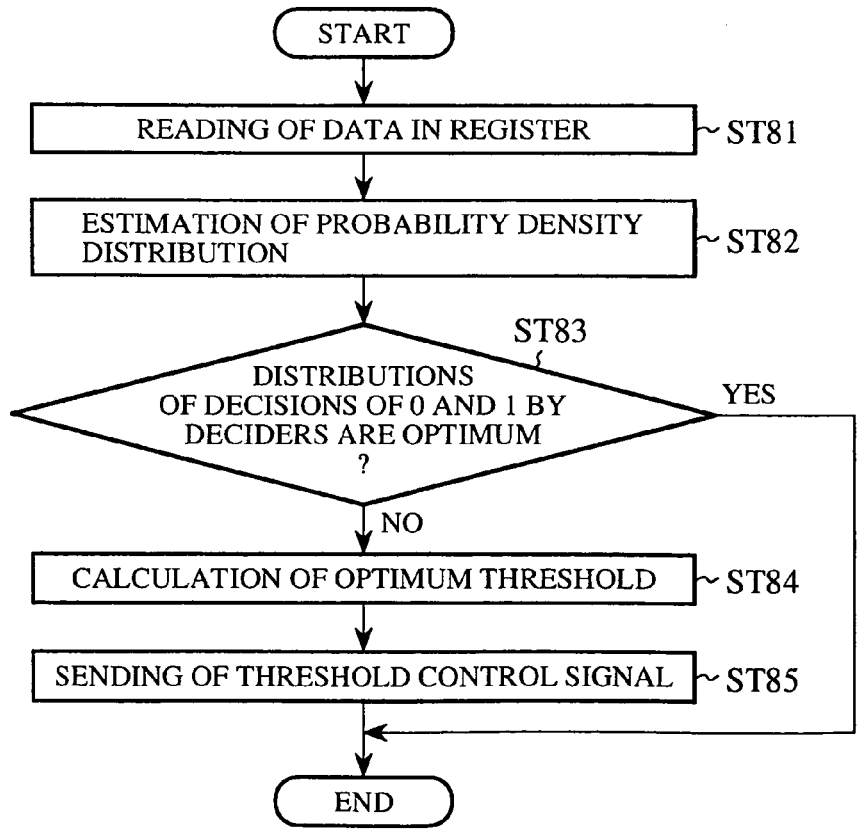
FIG. 60 is a flow chart showing a procedure of a digital processing unit of the optical receiver.

FIG. 60 is a flow chart showing a procedure carried by the digital processing unit.

A soft-decision FEC decoding means 8 obtains and delivers the decision result obtained by each of a plurality of deciders 13 from a multivalued parallel signal to the register 36. The register 36 holds the decision frequencies with which electric received signals of n frames are decided as mark and space, respectively, by each of the plurality of deciders 13. The digital processing unit 37 reads the decision frequencies with which electric received signals of n frames are decided as mark and space, respectively, by each of the plurality of deciders 13 from the register 36 (in step ST81), and estimates probability density distributions from the read decision frequencies (in step ST82). When the distributions of the decision frequencies with which electric received signals of n frames are decided as mark and space, respectively, according to a plurality of decision levels are not optimum (in step ST83), the digital processing unit 37 calculates an optimum decision level of each of the plurality of deciders 13 based on the estimated probability density distributions (in step ST84), and then delivers the calculation results to the digital-to-analog conversion unit 38 as a digital signal (in step ST85). The digital-to-analog conversion unit 38 converts the digital signal indicating the calculated decision levels into analog control voltages and delivers them to a soft-decision deciding means 7. The optical receiver performs other operations in the same manner that that of embodiment 1 does.

As mentioned above, in accordance with this embodiment 23, the optical receiver further includes the register 36 for holding the decision frequency results on the plurality of deciders 13 and the digital processing unit 37. Therefore, the optical receiver can control the decision level of each of the plurality of deciders 13 from a larger amount of data and can estimate probability density distributions having a high degree of accuracy.

Embodiment 24

Figure 61:
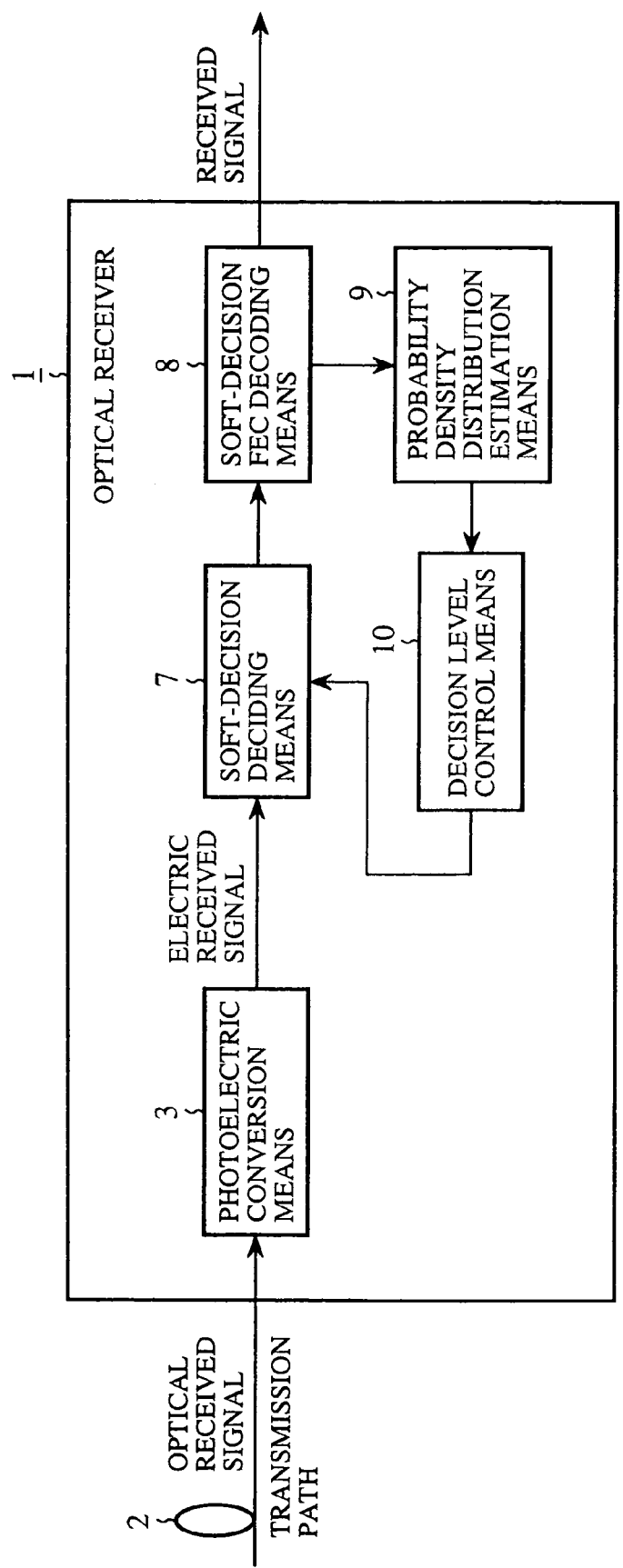
FIG. 61 is a block diagram showing an optical receiver according to embodiment 24 of the present invention in detail.

FIG. 61 is a block diagram showing the structure of an optical receiver according to embodiment 24 of the present invention. In accordance with any one of above-mentioned embodiments, the optical receiver is so constructed as to convert a decision result into a parallel signal and deliver it to the soft decision FEC decoding means 8 by using the demultiplexing means 5 or demultiplexing unit 15. In contrast, in accordance with this embodiment, the optical receiver includes neither a demultiplexing means 5 nor a demultiplexing unit 15, and delivers an output of a soft-decision deciding means 7 directly to a soft-decision FEC decoding means 8, as shown in FIG. 61.

INDUSTRIAL APPLICABILITY

As mentioned above, the optical receiver according to the present invention is suitable for improving the quality of high-speed and large-capacity transmission without raising the transmission rate.

The invention claimed is:

1. An optical receiver, comprising:
photoelectric conversion means for converting an optical received signal into an electric received signal;
soft-decision deciding means for deciding the electric received signal obtained by said photoelectric conversion means according to a plurality of decision levels so as to output a multivalued decision signal;
demultiplexing means for serial-to-parallel converting the multivalued decision signal delivered from said soft-decision deciding means so as to output a multivalued parallel signal;
soft-decision error correction decoding means for making an error correction to the multivalued parallel signal delivered from said demultiplexing means based on reliability information so as to output an error-corrected parallel received signal and decision results indicating the decision of the electric received signal according to the plurality of decision levels;
probability density distribution estimation means for estimating probability density distributions based on distributions of the decision results indicating the decision of the electric received signal according to the plurality of decision levels, which are delivered from said soft-decision error correction decoding means; and
decision level control means for controlling the plurality of decision levels in said soft-decision deciding means based on the probability density distributions estimated by said probability density distribution estimation means.

2. The optical receiver according to claim 1, wherein
said photoelectric conversion means includes a photodiode for converting the optical received signal into the electric received signal,
said soft-decision deciding means includes
a soft-decision decider for deciding the electric received signal obtained by said photodiode by using $2^n-1$ (n=a natural number) deciders having different decision levels so as to output $2^n-1$ decision results, and
an encoder for encoding the $2^n-1$ decision results obtained by said soft-decision decider into an n-bit parallel code having reliability information as the multivalued decision signal,
said demultiplexing means includes n demultiplexing circuits for demultiplexing the n-bit parallel code obtained by said encoder into the multivalued parallel signal on a bit-by-bit basis,
said soft-decision error correction decoding means includes a soft-decision FEC decoding circuit for making the error correction to the multivalued parallel signal delivered from said n demultiplexing circuits based on the reliability information so as to output the error-corrected parallel received signal and the decision results indicating the decision of the electric received signal according to the plurality of decision levels,
said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and
said decision level control means includes a threshold control circuit for controlling the plurality of decision levels of said $2^n-1$ deciders in said soft-decision decider based on the probability density distributions estimated by said probability density distribution estimation circuit.

3. The optical receiver according to claim 1, wherein
said photoelectric conversion means includes a photodiode for converting the optical received signal into the electric received signal,
said soft-decision deciding means includes
a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level so as to output one or more other decision results and
an encoder for encoding the $2^n-1$ decision results obtained by said soft-decision decider into an n-bit parallel code having reliability information as the multivalued decision signal,
said demultiplexing means includes (n+1) or more demultiplexing circuits for demultiplexing the n-bit parallel code obtained by said encoder and the one or more other decision results obtained by said one or more other deciders each of which sweeps its decision level in said soft-decision decider into the multivalued parallel signal on a bit-by-bit basis,
said soft-decision error correction decoding means includes a soft-decision FEC decoding circuit for making the error correction to the multivalued parallel signal, which are obtained from the n-bit parallel code by said demultiplexing circuits, based on the reliability information so as to output the error-corrected parallel received signal and the decision results indicating the decision of the electric received signal according to the plurality of decision levels,
said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the multivalued parallel signal into which the one or more other decision results obtained by said one or more other deciders each of which sweeps its decision level are demultiplexed by said demultiplexing circuits, and said decision level control means includes a threshold control circuit for controlling the plurality of decision levels of said $2^n-1$ deciders in said soft-decision decider based on the probability density distributions estimated by said probability density distribution estimation circuit and a threshold sweeping control circuit for controlling the decision levels of said one or more other deciders each of which sweeps its decision level in said soft-decision decider based on the probability density distributions estimated by said probability density distribution estimation circuit.

4. The optical receiver according to claim 1, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and one or more other deciders each of which sweeps its decision phase so as to output one or more other decision results, and an encoder for encoding the $2^n-1$ decision results obtained by said soft-decision decider into an n-bit parallel code having reliability information as the multivalued decision signal, said demultiplexing means includes (n+2) or more demultiplexing circuits for demultiplexing the n-bit parallel code obtained by said encoder and the one or more other decision results obtained by said one or more other deciders each of which sweeps its decision level and said one or more other deciders each of which sweeps its decision phase in said soft-decision decider into the multivalued parallel signal on a bit-by-bit basis, said soft-decision error correction decoding means includes a soft-decision FEC decoding circuit for making the error correction to the multivalued parallel signal, which is obtained from the n-bit parallel code by said demultiplexing circuits, based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the multivalued parallel signal into which the one or more other decision results obtained by said one or more other deciders each of which sweeps its decision level and said one or more other deciders each of which sweeps its decision phase are demultiplexed by said demultiplexing circuits, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level in said soft-decision decider based on the probability density distributions estimated by said probability density distribution estimation circuit, a clock phase control circuit for controlling decision phases of said $2^n-1$ deciders and said one or more other deciders each of which sweeps its decision level in said soft-decision decider based on the probability density distributions estimated by said probability density distribution estimation circuit, and a sweeping decider clock phase control circuit for controlling the decision phases of said one or more other deciders each of which sweeps its decision phase in said soft-decision decider based on the probability density distributions estimated by said probability density distribution estimation circuit.

5. The optical receiver according to claim 1, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and one or more other deciders each of which sweeps its decision phase so as to output one or more other decision results, a selector for selecting either the one or more other decision results obtained by said one or more other deciders each of which sweeps its decision level or one or more other decision results obtained by said one or more other deciders each of which sweeps its decision phase, and an encoder for encoding the $2^n-1$ decision results obtained by said soft-decision decider into an n-bit parallel code having reliability information as the multivalued parallel signal, said demultiplexing means includes (n+1) or more demultiplexing circuits for demultiplexing the n-bit parallel code obtained by said encoder and either the one or more decision results obtained by said one or more other deciders each of which sweeps its decision level or the one or more decision results obtained by said one or more other deciders each of which sweeps its decision phase in said soft-decision decider into the multivalued parallel signal on a bit-by-bit basis, said soft-decision error correction decoding means includes a soft-decision FEC decoding circuit for making an error correction to the multivalued parallel signal, which are obtained from the n-bit parallel code by said demultiplexing circuits, based on the reliability information so as to output the error-corrected parallel received signal and the decision results indicating the decision of the electric received signal according to the plurality of decision levels, said probability density distribution estimation means includes a probability density distribution estimation circuit for estimating probability density distributions based on the distributions of the decision results indicating the decision of the electric received signal according to the plurality of decision levels, which are delivered from said soft-decision FEC decoding circuit, and the multivalued parallel signal into which the one or more other decision results obtained by either said one or more other deciders each of which sweeps its decision level or said one or more other deciders each of which sweeps its decision phase are demultiplexed by said demultiplexing circuits, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level in said soft-decision decider based on the probability density distributions estimated by said probability density distribution estimation circuit, a clock phase control circuit for controlling decision phases of said $2^n-1$ deciders and said one or more other deciders each of which sweeps its decision level in said soft-decision decider based on the probability density distributions estimated by said probability density distribution estimation circuit, and a sweeping decider clock phase control circuit for controlling the decision phases of said one or more other deciders each of which sweeps its decision phase in said soft-decision decider based on the probability density distributions estimated by said probability density distribution estimation circuit.

6. The optical receiver according to claim 1, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and its decision phase so as to output one or more other decision results, and an encoder for encoding the $2^n-1$ decision results obtained by said soft-decision decider into an n-bit parallel code having reliability information as the multivalued parallel signal, said demultiplexing means includes (n+1) or more demultiplexing circuits for demultiplexing the n-bit parallel code obtained by said encoder and the one or more other decision results obtained by said one or more other deciders each of which sweeps its decision level and its decision phase in said soft-decision decider into the multivalued parallel signal on a bit-by-bit basis, said soft-decision error correction decoding means includes a soft-decision FEC decoding circuit for making the error correction to the multivalued parallel signal, which is obtained from the n-bit parallel code by said demultiplexing circuits, based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the multivalued parallel signal into which the one or more other decision results obtained by said one or more other deciders each of which sweeps its decision level and its decision phase are demultiplexed by said demultiplexing circuits, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level and its decision phase in said soft-decision decider based on the probability density distributions estimated by said probability density distribution estimation circuit, a clock phase control circuit for controlling decision phases of said $2^n-1$ deciders in said soft-decision decider based on the probability density distributions estimated by said probability density distribution estimation circuit, and a sweeping decider clock phase control circuit for controlling the decision phases of said one or more other deciders each of which sweeps its decision level and its decision phase in said soft-decision decider based on the probability density distributions estimated by said probability density distribution estimation circuit.

7. The optical receiver according to claim 1, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level so as to one or more other output decision results, and an encoder for encoding the $2^n-1$ decision results obtained by said soft-decision decider into an n-bit parallel code having reliability information as the multivalued parallel signal, said demultiplexing means includes (n+1) or more demultiplexing circuits for demultiplexing the n-bit parallel code obtained by said encoder and the one or more other decision results obtained by said one or more other deciders each of which sweeps its decision level in said soft-decision decider into the multivalued parallel signal on a bit-by-bit basis, said soft-decision error correction decoding means includes a soft-decision FEC decoding circuit for making the error correction to the multivalued parallel signal, which is obtained from the n-bit parallel code by said demultiplexing circuits, based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the multivalued parallel signal into which the one or more other decision results obtained by said one or more other deciders each of which sweeps its decision level are demultiplexed by said demultiplexing circuits, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level in said soft-decision decider based on the probability density distributions estimated by said probability density distribution estimation circuit, and a clock phase control circuit for controlling decision phases of said $2^n-1$ deciders and said one or more other deciders each of which sweeps its decision level in said soft-decision decider based on a number of counted errors included in the error-corrected parallel received signal from said soft-decision FEC decoding circuit.

8. The optical receiver according to claim 2, wherein said threshold control circuit controls the plurality of decision levels of said $2^n-1$ deciders in said soft-decision decider so that the probability density distributions estimated by said probability density distribution estimation circuit are optimized.

9. The optical receiver according to claim 3, wherein said probability density distribution estimation circuit estimates the probability density distribution based on at least one of the $2^n-1$ decision results obtained by said $2^n-1$ deciders and the one or more decision results obtained by said one or more other deciders each of which sweeps its decision level, and said threshold control circuit controls the plurality of decision levels of said $2^n-1$ deciders in said soft-decision decider so that the probability density distributions estimated by said probability density distribution estimation circuit are optimized.

10. The optical receiver according to claim 3, wherein said probability density distribution estimation circuit estimates probability density distributions based on the one or more decision results obtained by said one or more other deciders each of which sweeps its decision level, and said threshold control circuit controls the plurality of decision levels of said $2^n-1$ deciders in said soft-decision decider based on the probability density distribution, which is estimated from the one or more decision results by said probability density distribution estimation circuit, so that the probability density distributions obtained from the $2^n-1$ decision results obtained by said $2^n-1$ deciders are optimized.

11. An optical receiver, comprising:

a photodiode for converting an optical received signal into an electric received signal;

a soft-decision decider for deciding the electric received signal obtained by said photodiode by using $2^n$ (n=a natural number) or more deciders so as to output $2^n$ or more decision results;

a selector for selecting $2^n-1$ decision results from among the $2^n$ or more decision results obtained by said soft-decision decider;

an encoder for encoding the $2^n-1$ decision results selected by said selector into an n-bit parallel code having reliability information;

n demultiplexing circuits for demultiplexing the n-bit parallel code obtained by said encoder into respective multivalued signals on a bit-by-bit basis;

a soft-decision FEC decoding circuit for making an error correction to the multivalued signals delivered from said n demultiplexing circuits based on the reliability information so as to output an error-corrected parallel received signal and the decision results indicating the decision of the electric received signal according to a plurality of decision levels;

a probability density distribution estimation circuit for estimating probability density distributions based on distributions of the decision results indicating the decision of the electric received signal according to the plurality of decision levels, which are delivered from said soft-decision FEC decoding circuit; and a decider selection control circuit for outputting a selection signal for making said selector select the $2^n-1$ decision results from among the $2^n$ or more decision results based on the probability density distributions estimated by said probability density distribution estimation circuit.

12. The optical receiver according to claim 11, wherein said decider selection control circuit delivers the selection signal for making said selector select the $2^n-1$ decision results from among the $2^n$ or more decision results so that the probability density distributions estimated by said probability density distribution estimation circuit are optimized.

13. An optical receiver, comprising:

photoelectric conversion means for converting an optical received signal into an electric received signal;

soft-decision deciding means for deciding the electric received signal obtained by said photoelectric conversion means according to a plurality of decision levels so as to output a multivalued decision signal;

soft-decision error correction decoding means for making an error correction to the multivalued decision signal delivered from said soft-decision deciding means based on reliability information so as to output an error-corrected received signal and decision results indicating the decision of the electric received signal according to the plurality of decision levels;

probability density distribution estimation means for estimating probability density distributions based on distributions of the decision results indicating the decision of the electric received signal according to the plurality of decision levels, which are delivered from said soft-decision error correction decoding means; and decision level control means for controlling the plurality of decision levels in said soft-decision deciding means based on the probability density distributions estimated by said probability density distribution estimation means.

14. The optical receiver according to claim 13, wherein said photoelectric conversion means includes a photodiode for converting the optical received signal into the electric received signal, said soft-decision deciding means includes
a soft-decision decider for deciding the electric received signal obtained by said photodiode by using $2^n-1$ (n=a natural number) deciders having different decision levels so as to output $2^n-1$ decision results, and
an encoder for encoding the $2^n-1$ decision results obtained by said soft-decision decider into an n-bit parallel code having reliability information,
said soft-decision error correction decoding means includes a soft-decision FEC decoding circuit for making the error correction to the n-bit parallel code obtained by said encoder based on the reliability information so as to output the error-corrected received signal and the decision results indicating the decision of the electric received signal according to the plurality of decision levels,
said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and
said decision level control means includes a threshold control circuit for controlling the plurality of decision levels of said $2^n-1$ deciders in said soft-decision decider based on the probability density distributions estimated by said probability density distribution estimation circuit.

15. The optical receiver according to claim 13, wherein
said photoelectric conversion means includes a photodiode for converting the optical received signal into the electric received signal,
said soft-decision deciding means includes
a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level so as to output one or more other decision results, and
an encoder for encoding the $2^n-1$ decision results obtained by said soft-decision decider into an n-bit parallel code having reliability information,
said soft-decision error correction decoding means includes a soft-decision FEC decoding circuit for making an error correction to the n-bit parallel code obtained by said encoder based on the reliability information so as to output the error-corrected received signal and the decision results indicating the decision of the electric received signal according to the plurality of decision levels,
said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the one or more other decision results obtained by said one or more other deciders each of which sweeps its decision level in said soft-decision decider, and
said decision level control means includes
a threshold control circuit for controlling the plurality of decision levels of said $2^n-1$ deciders in said soft-decision decider based on the probability density distributions estimated by said probability density distribution estimation circuit, and
a threshold sweeping control circuit for controlling the decision levels of said one or more other deciders each of which sweeps its decision level in said soft-decision decider based on the probability density distributions estimated by said probability density distribution estimation circuit.

16. The optical receiver according to claim 13, wherein
said photoelectric conversion means includes a photodiode for converting the optical received signal into the electric received signal,
said soft-decision deciding means includes
a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and one or more other deciders each of which sweeps its decision phase so as to output one or more other decision results, and
an encoder for encoding the $2^n-1$ decision results obtained by said soft-decision decider into an n-bit parallel code having reliability information,
said soft-decision error correction decoding means includes a soft-decision FEC decoding circuit for making an error correction to the n-bit parallel code obtained by said encoder based on the reliability information so as to output the error-corrected received signal and the decision results indicating the decision of the electric received signal according to the plurality of decision levels,
said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the one or more other decision results obtained by said one or more other deciders each of which sweeps its decision level and said one or more other deciders each of which sweeps its decision phase in said soft-decision decider, and
said decision level control means includes
a threshold control circuit for controlling the plurality of decision levels of said $2^n-1$ deciders in said soft-decision decider based on the probability density distributions estimated by said probability density distribution estimation circuit,
a threshold sweeping control circuit for controlling the decision levels of said one or more other deciders each of which sweeps its decision level in said soft-decision decider based on the probability density distributions estimated by said probability density distribution estimation circuit,
a clock phase control circuit for controlling decision phases of said $2^n-1$ deciders and said one or more other deciders each of which sweeps its decision level in said soft-decision decider based on the probability density distributions estimated by said probability density distribution estimation circuit, and
a sweeping decider clock phase control circuit for controlling the decision phases of said one or more other deciders each of which sweeps its decision phase in said soft-decision decider based on the probability density distributions estimated by said probability density distribution estimation circuit.

17. The optical receiver according to claim 13, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and one or more other deciders each of which sweeps its decision phase so as to output one or more other decision results, a selector for selecting either the one or more other decision results obtained by said one or more other deciders each of which sweeps its decision level or one or more other decision results obtained by said one or more other deciders each of which sweeps its decision phase, and an encoder for encoding the $2^n-1$ decision results obtained by said soft-decision decider into an n-bit parallel code having reliability information, said soft-decision error correction decoding means includes a soft-decision FEC decoding circuit for making an error correction to the n-bit parallel code obtained by said encoder based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the one or more other decision results obtained by either said one or more other deciders each of which sweeps its decision level or said one or more other deciders each of which sweeps its decision phase, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level in said soft-decision decider based on the probability density distributions estimated by said probability density distribution estimation circuit, a clock phase control circuit for controlling decision phases of said $2^n-1$ deciders and said one or more other deciders each of which sweeps its decision level in said soft-decision decider based on the probability density distributions estimated by said probability density distribution estimation circuit, and a sweeping decider clock phase control circuit for controlling the decision phases of said one or more other deciders each of which sweeps its decision phase in said soft-decision decider based on the probability density distributions estimated by said probability density distribution estimation circuit.

18. The optical receiver according to claim 13, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level and its decision phase so as to output one or more other decision results, and an encoder for encoding the $2^n-1$ decision results obtained by said soft-decision decider into an n-bit parallel code having reliability information, said soft-decision error correction decoding means includes a soft-decision FEC decoding circuit for making an error correction to the n-bit parallel code obtained by said encoder based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the one or more other decision results obtained by said one or more other deciders each of which sweeps its decision level and its decision phase, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level and its decision phase in said soft-decision decider based on the probability density distributions estimated by said probability density distribution estimation circuit, a clock phase control circuit for controlling decision phases of said $2^n-1$ deciders in said soft-decision decider based on the probability density distributions estimated by said probability density distribution estimation circuit, and a sweeping decider clock phase control circuit for controlling the decision phases of said one or more other deciders each of which sweeps its decision level and its decision phase in said soft-decision decider based on the probability density distributions estimated by said probability density distribution estimation circuit.

19. The optical receiver according to claim 13, wherein said photoelectric conversion means includes a photodiode for converting the optical received signal into the electric received signal, said soft-decision deciding means includes a soft-decision decider for deciding the electric received signal obtained by said photodiode by using $2^n-1$ (n=a natural number) deciders having different decision levels so as to output $2^n-1$ decision results, and for also deciding the electric received signal by using one or more other deciders each of which sweeps its decision level so as to output one or more other decision results, and an encoder for encoding the $2^n-1$ decision results obtained by said soft-decision decider into an n-bit parallel code having reliability information, said soft-decision error correction decoding means includes a soft-decision FEC decoding circuit for making an error correction to the n-bit parallel code obtained by said encoder based on the reliability information so as to output the error-corrected parallel received signal and the decision results indicating the decision of the electric received signal according to the plurality of decision levels, said probability density distribution estimation means includes a probability density distribution estimation circuit for estimating the probability density distributions based on the distributions of the decision results indicating the decision of the electric received signal according to the plurality of decision levels, which are delivered from said soft-decision FEC decoding circuit, and the one or more other decision results obtained by said one or more other deciders each of which sweeps its decision level, and said decision level control means includes a threshold control circuit for controlling the plurality of decision levels of said $2^n-1$ deciders in said soft-decision decider based on the probability density distributions estimated by said probability density distribution estimation circuit, a threshold sweeping control circuit for controlling the decision levels of said one or more other deciders each of which sweeps its decision level in said soft-decision decider based on the probability density distributions estimated by said probability density distribution estimation circuit, and a clock phase control circuit for controlling decision phases of said $2^n-1$ deciders and said one or more other deciders each of which sweeps its decision level in said soft-decision decider based on a number of counted errors included in the error-corrected parallel received signal from said soft-decision FEC decoding circuit.

20. An optical receiver, comprising:

a photodiode for converting an optical received signal into an electric received signal;

a soft-decision decider for deciding the electric received signal obtained by said photodiode by using $2^n$ (n=a natural number) or more deciders so as to output $2^n$ or more decision results;

a selector for selecting $2^n-1$ decision results from among the $2^n$ or more decision results obtained by said soft-decision decider;

an encoder for encoding the $2^n-1$ decision results selected by said selector into an n-bit parallel code having reliability information;

a soft-decision FEC decoding circuit for making an error correction to the n-bit parallel code obtained by said encoder based on the reliability information so as to output an error-corrected received signal and the decision results indicating the decision of the electric received signal according to a plurality of decision levels;

a probability density distribution estimation circuit for estimating probability density distributions based on distributions of the decision results indicating the decision of the electric received signal according to the plurality of decision levels, which are delivered from said soft-decision FEC decoding circuit; and a decider selection control circuit for outputting a selection signal for making said selector select the $2^n-1$ decision results from among the $2^n$ or more decision results based on the probability density distributions estimated by said probability density distribution estimation circuit.

* * * * *

UNITED STATES PATENT AND TRADEMARK OFFICE
CERTIFICATE OF CORRECTION

PATENT NO. : 7,239,673 B2  Page 1 of 1
APPLICATION NO. : 10/416550
DATED : July 3, 2007
INVENTOR(S) : Kazushige Sawada et al.

It is certified that error appears in the above-identified patent and that said Letters Patent is hereby corrected as shown below:

On the title page, item [73]:
Please change "MITSUBISHI DENKI KABASHIKI KAISHA" to --MITSUBISHI DENKI KABUSHIKI KAISHA--.

Claim 18, column 56, line 23, please delete the word "parallel".

Claim 19, column 57, line 13, please delete the word "parallel".

Signed and Sealed this

Thirteenth Day of November, 2007

JON W. DUDAS
*Director of the United States Patent and Trademark Office*